United States Patent [19]
Furutani

[11] Patent Number: 5,844,849
[45] Date of Patent: Dec. 1, 1998

[54] DYNAMIC SEMICONDUCTOR MEMORY DEVICE HAVING FAST OPERATION MODE AND OPERATING WITH LOW CURRENT CONSUMPTION

[75] Inventor: Kiyohiro Furutani, Hyogo, Japan

[73] Assignee: Mitsubishi Denki Kabushiki Kaisha, Tokyo, Japan

[21] Appl. No.: 878,076

[22] Filed: Jun. 18, 1997

Related U.S. Application Data

[63] Continuation of Ser. No. 651,025, May 21, 1996, Pat. No. 5,668,774.

[30] Foreign Application Priority Data

May 22, 1995 [JP] Japan .................................. 7-122439

[51] Int. Cl.$^6$ ............................................. G11C 7/00
[52] U.S. Cl. ........................................ 365/194; 365/230.08
[58] Field of Search ............................... 365/194, 230.08, 365/236, 203

[56] References Cited

U.S. PATENT DOCUMENTS

| | | | |
|---|---|---|---|
| 4,636,986 | 1/1987 | Pinkham | 365/230.08 |
| 5,319,607 | 6/1994 | Fuji et al. | 365/253.5 |
| 5,566,371 | 10/1996 | Ogawa | 365/230.03 |

FOREIGN PATENT DOCUMENTS 59-110094 6/1984 Japan .

OTHER PUBLICATIONS

Eaton et al., "A 100ns 64K Dynamic RAM Using Redundancy Techniques," *1981 IEEE International Solid–State Circuits Conference,* pp. 84–85.

Kurata, "Pentium Specific Burst EDO Appears in 1996," *NIKKEI BYTE,* Apr. 1995, pp. 141–143.

Kantz et al., "A 256 DRAM with Descrambled Redundancy Test Capability," *1984 IEEE International Solid–State Circuits Conference,* pp. 272–273.

*Primary Examiner*—David C. Nelms
*Assistant Examiner*—Michael T. Tran
*Attorney, Agent, or Firm*—McDermott, Will & Emery

[57] ABSTRACT

A semiconductor memory device includes a delay stage for delaying a row address strobe signal ZRAS by a predetermined time, a first signal generating circuit for generating a signal instructing activation/precharge of an array in accordance with the row address strobe signal ZRAS, and a second signal generating circuit for generating a signal setting the output stage to an output high impedance state in accordance with a delayed row address strobe signal ZRAS from the delay stage and a column address strobe signal ZCAS. Even if both the column address strobe signal and row address strobe signal may be simultaneously set to the high and low levels, respectively, the column address strobe signal and the delayed row address strobe signal are not simultaneously set to the high level, so that the output stage is prevented from attaining the high impedance state, and data output is allowed. Therefore, the semiconductor memory device can operate fast with a low current consumption.

14 Claims, 42 Drawing Sheets

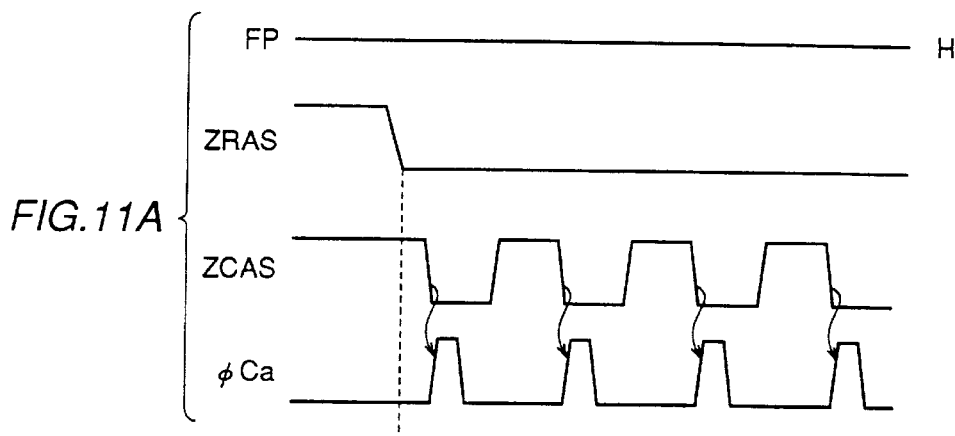
FIG.11A
FIG.11B
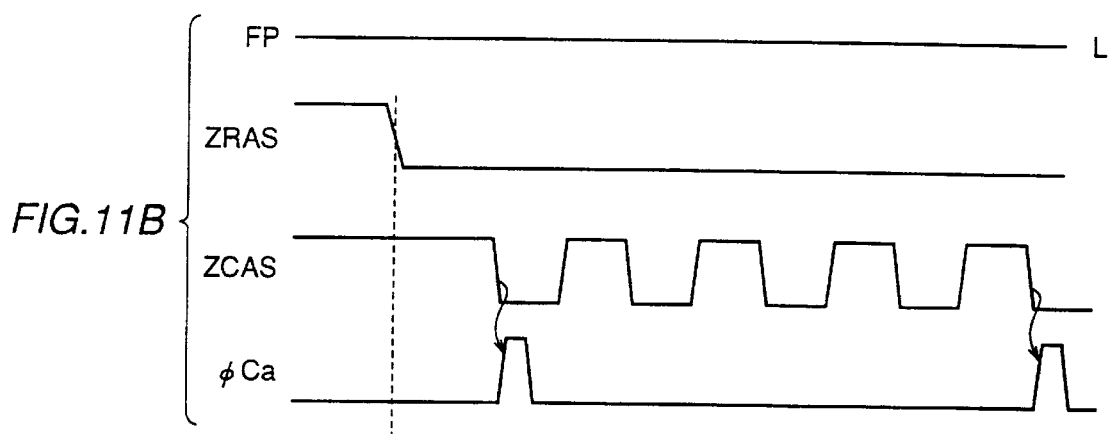
FIG.12

FIG.16
| A ⟨1:0⟩ | 00 | 01 | 10 | 11 |
|---|---|---|---|---|
| C1i | 01 | 00 | 11 | 10 |
| C2i | 10 | 11 | 00 | 01 |
| C3i | 11 | 10 | 01 | 00 |
FIG.17
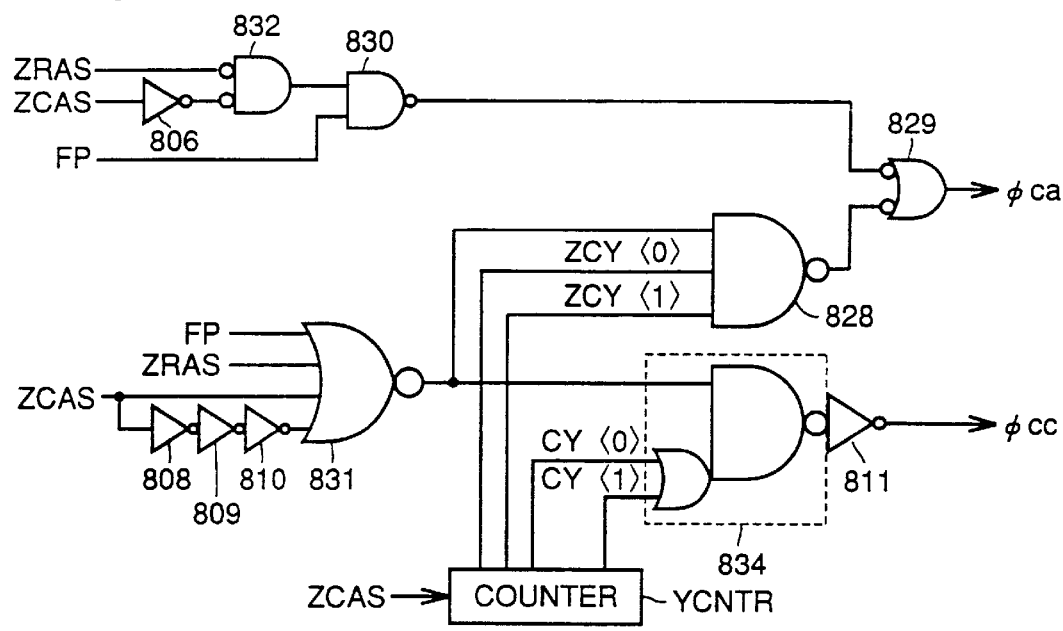
FIG.18
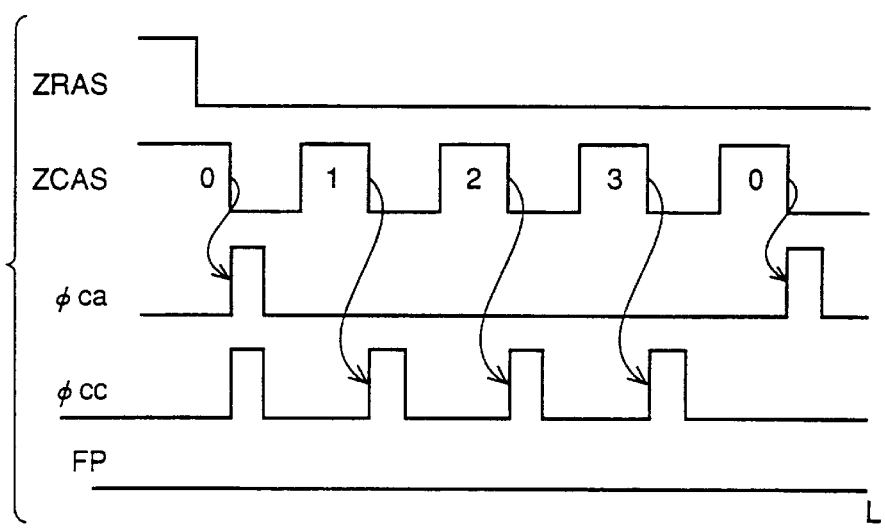

FIG.23A
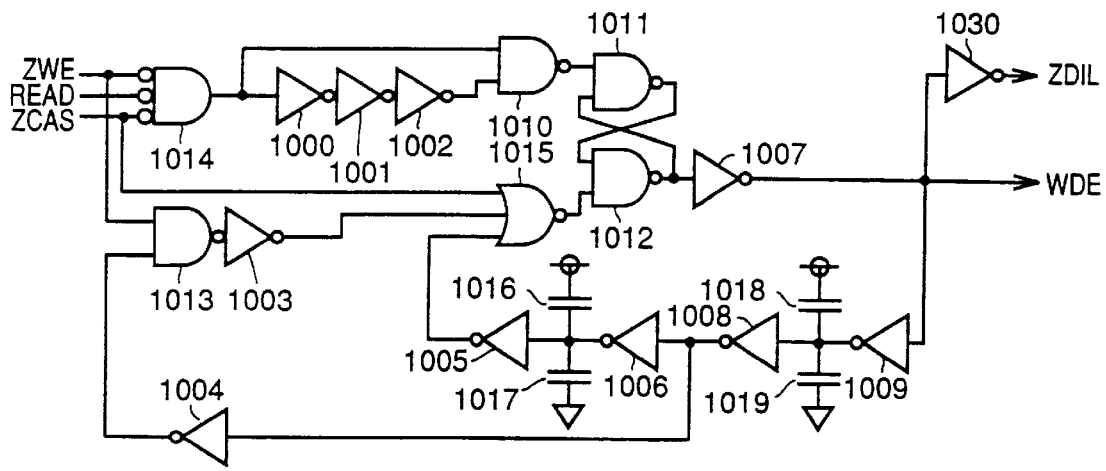
FIG.23B
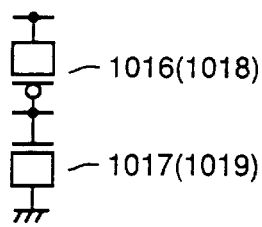
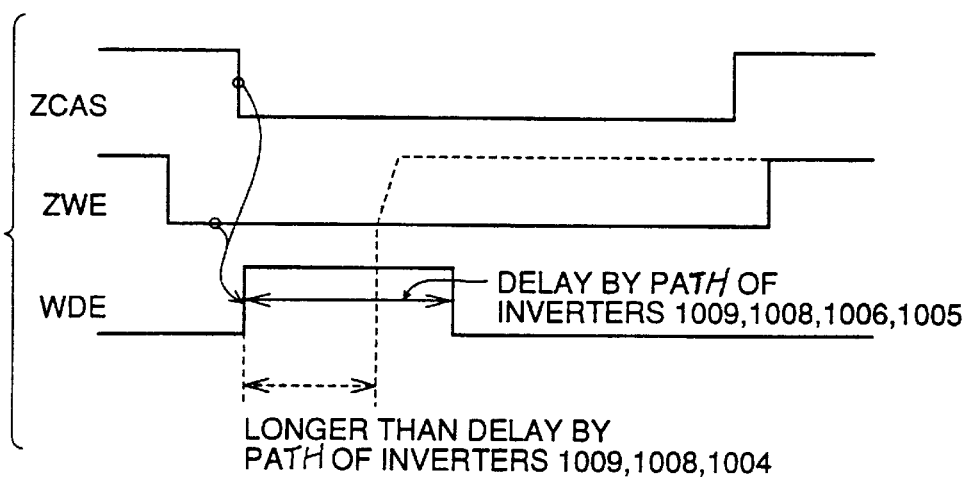
FIG.24

FIG.31
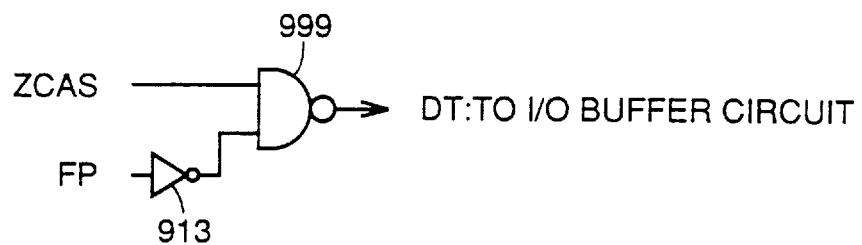
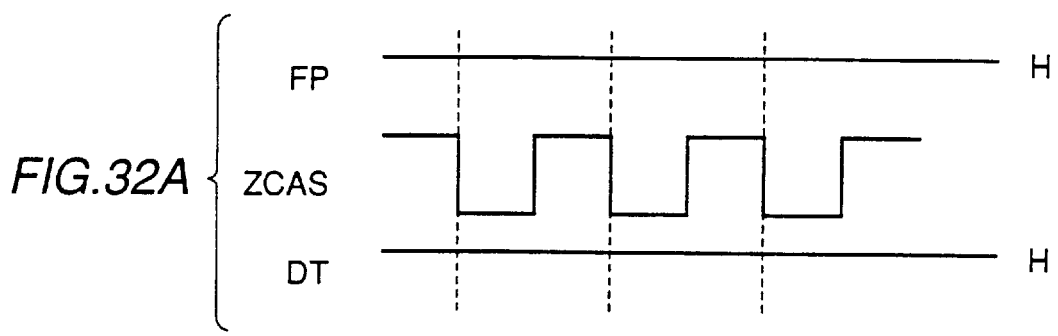
FIG.32A
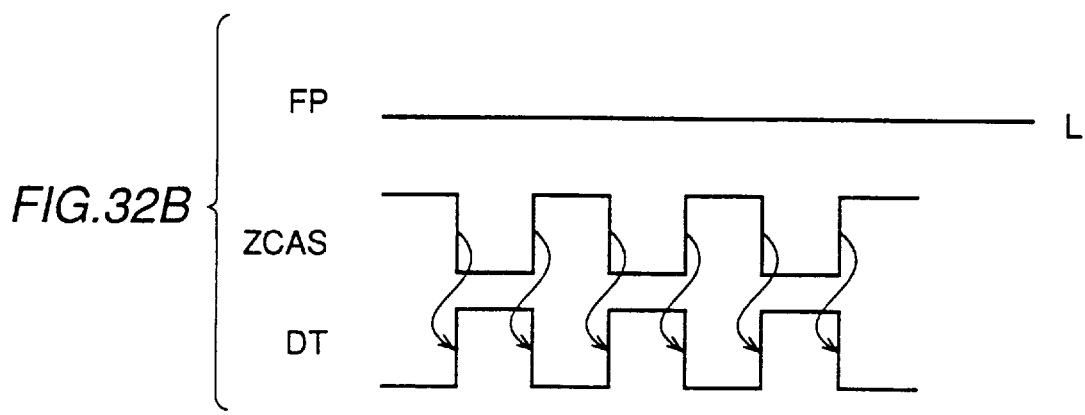
FIG.32B

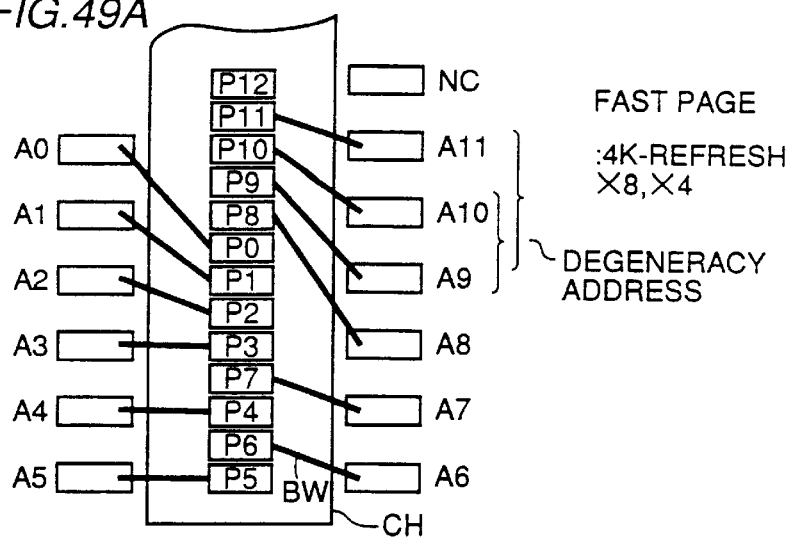
FIG.49A FAST PAGE
:4K-REFRESH
×8,×4
DEGENERACY ADDRESS
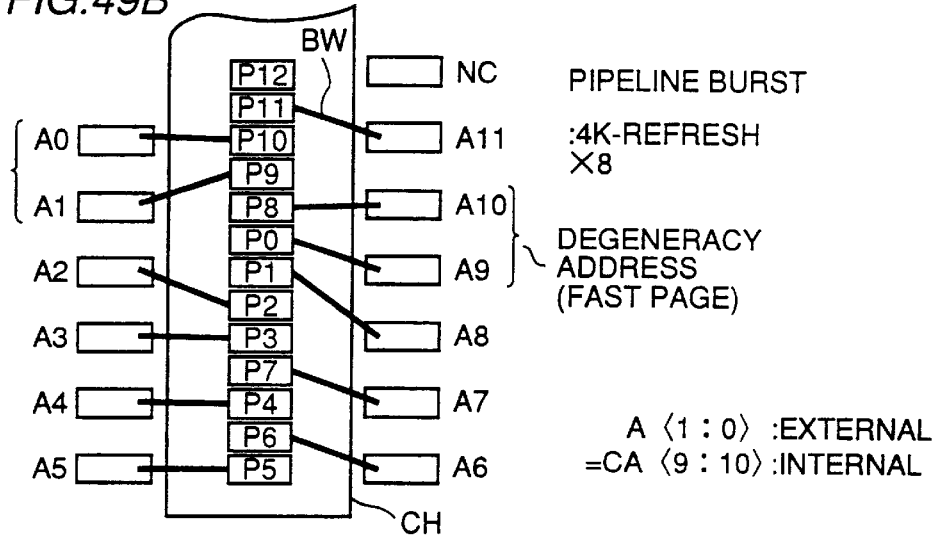
FIG.49B PIPELINE BURST
:4K-REFRESH
×8
DEGENERACY ADDRESS
(FAST PAGE)
A ⟨1 : 0⟩ :EXTERNAL
=CA ⟨9 : 10⟩ :INTERNAL
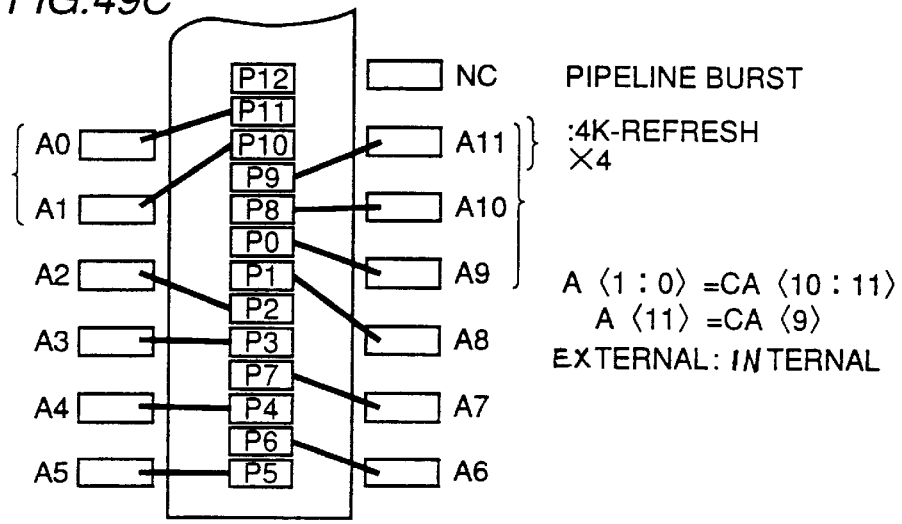
FIG.49C PIPELINE BURST
:4K-REFRESH
×4
A ⟨1 : 0⟩ =CA ⟨10 : 11⟩
A ⟨11⟩ =CA ⟨9⟩
EXTERNAL: INTERNAL FIG.54 PRIOR ART
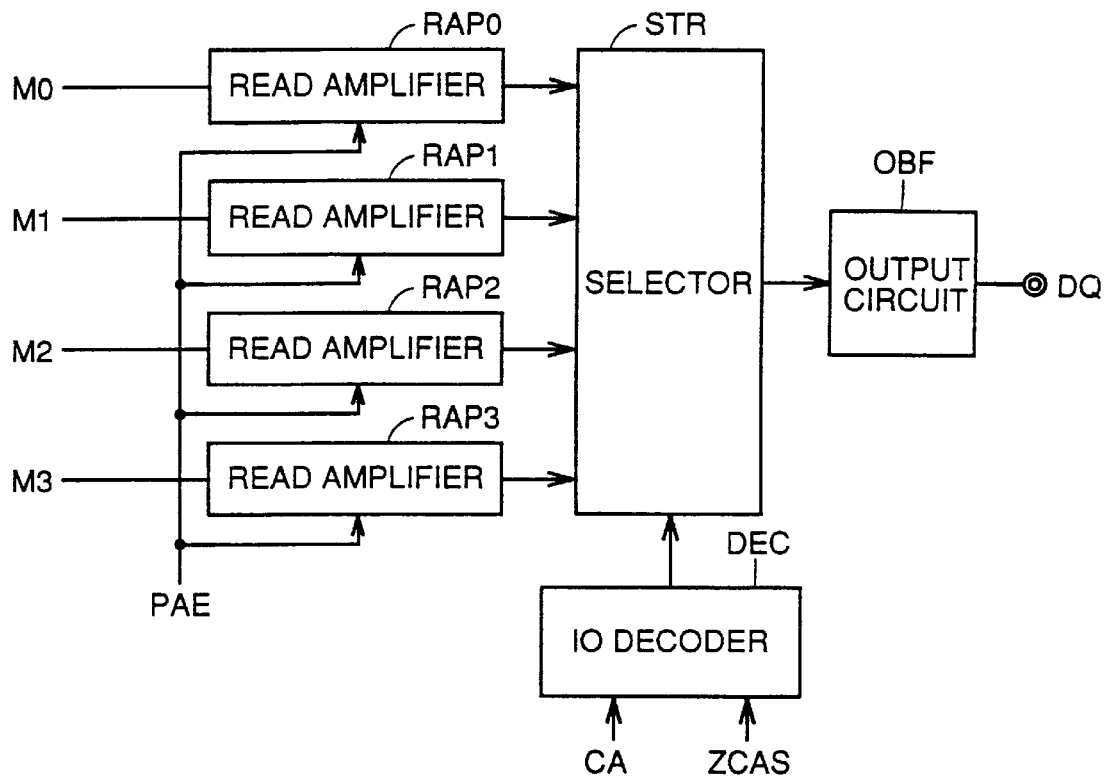
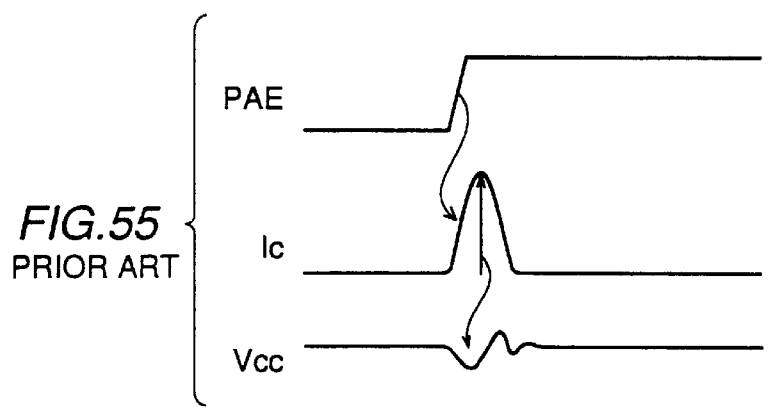
FIG.55 PRIOR ART FIG.61 PRIOR ART
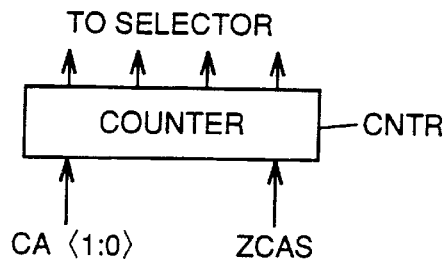
FIG.62 PRIOR ART
| WORD STRUCTURE \ REFRESH CYCLE | 8K-REFRESH | 4K-REFRESH |
|---|---|---|
| ×4 | CA10,CA9,CA8 | CA11,CA10,CA9 |
| ×8 | CA9,CA8 | CA10,CA9 |
FIG.63 PRIOR ART
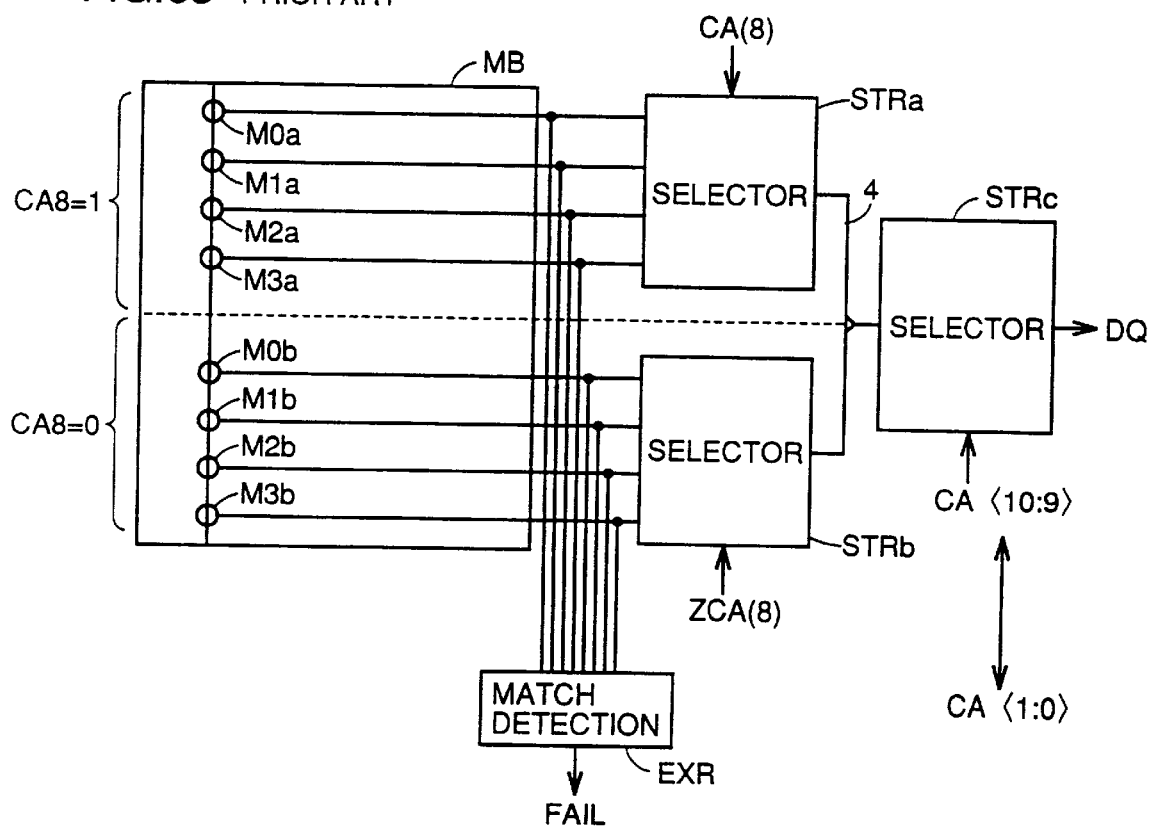

DYNAMIC SEMICONDUCTOR MEMORY DEVICE HAVING FAST OPERATION MODE AND OPERATING WITH LOW CURRENT CONSUMPTION

This application is a continuation of application Ser. No. 08/651,025 filed May 21, 1996, now U.S. Pat. No. 5,668,774.

BACKGROUND OF THE INVENTION

1. Field of the Invention

The present invention relates to a semiconductor memory device, and particularly to a dynamic semiconductor memory device which operates fast with a low current consumption. More particularly, the present invention relates to a semiconductor memory device which has internal circuitry compatible with semiconductor memory devices in former generations and can operate fast with a low current consumption.

2. Description of the Background Art

As one of semiconductor memory devices capable of performing fast operation, there has been known a semiconductor memory device having a nibble mode, as disclosed, e.g., in "1981 IEEE International Solid-State Circuits Conference Proceeding", pp. 84–85.

FIG. 50 is a timing chart representing an operation in a nibble mode of a semiconductor memory device. More specifically, FIG. 50 is a timing chart representing an operation in data reading in the nibble mode. Operation in the nibble mode will be described below with reference to FIG. 50.

At time t1, a row address strobe signal ZRAS is set to the low level of the active state. In response to this transition of row address strobe signal ZRAS, an address signal Add currently applied is taken in as an X-address (row address) signal. Memory cells in the row specified by this X-address are selected. For simplicity, it is assumed that memory cells in one row are selected and data are read bit by bit. The character "Z" prefixed to reference characters indicating signals denotes that the signal is active when it is at the low level.

A clock signal CLOCK is a system clock determining operation timings of a processing system including the semiconductor memory device. A memory controller changes the states of the control signals for the semiconductor memory device according to clock signal CLOCK.

In the state that row address strobe signal ZRAS is maintained at the active state of the low level, a column address strobe signal ZCAS is activated to attain the low level at time t2. Thereby, address signal Add currently applied is taken in as a Y-address signal (column address signal), and memory cells in four columns (4 bits) among the memory cells in the selected one row are simultaneously selected. Among the selected memory cells of 4 bits, data D1 of the memory cell specified by the Y-address is read in this clock cycle. Thereafter, column address strobe signal ZCAS is changed from the high level to the low level at times t4, t6 and t8, whereby remaining data D2, D3 and D4 are successively read from a data output terminal DQ.

In this nibble mode, data which are read in parallel from memory cells of 4 bits in accordance with the address are externally read out after parallel/serial conversion in accordance with column address strobe signals ZCAS. It is therefore not necessary to toggle row address strobe signal ZRAS for reading data from memory cells, so that a cycle time tPC in the data read operation can be reduced. In the nibble mode, it is necessary for reading data D2–D4 to set column address strobe signal ZCAS to the H-level (high level) and then set the same to the L-level (low level). However, even in the case where the output enable signal ZOE is already set to the active state of the low level designating data reading, data output terminal DQ is set to the high impedance state (Hi-Z) when column address strobe signal ZCAS is raised to the H-level. In order to increase a period for outputting valid data, therefore, it is necessary to increase a time period for which column address strobe signal ZCAS is at the low level, which increases cycle time tPC and thus prevents fast reading of data.

In view of the above, a semiconductor memory device having a nibble mode in which a data valid period for outputting valid data is increased is proposed, for example, in Japanese Patent Laying-Open No. 59-1100945 (1984). This operation mode is called an EDO (Extended Data Output) mode or a hyperpage mode.

FIG. 51 is a timing chart representing a hyperpage mode operation. The hyperpage mode operation will be described below with reference to FIG. 51. FIG. 51 represents the data read operation in which output enable signal ZOE is set to the low level of the active state.

In this hyperpage mode, similarly to the nibble mode, row address strobe signal ZRAS and column address strobe signal ZCAS are set to the low level at times t1 and t2 for taking the X-address and Y-address signals, respectively, and memory cells of 4 bits are simultaneously selected. Data of the simultaneously selected memory cells of 4 bits are successively read in accordance with toggling of column address strobe signal ZCAS. In this hyperpage mode, however, data output terminal DQ does not attain the high impedance state even when column address strobe signal ZCAS is deactivated to attain the high level, so that data which are read in the current cycle are continuously output. Data output terminal DQ is set to the high impedance state when both signals ZRAS and ZCAS are deactivated to attain the high level.

Therefore, this hyperpage mode can implements such an advantage that the data valid time can be increased even if cycle time tPC is reduced. Accordingly, if the data valid time in this hyperpage mode is to be equal to that in the nibble mode, cycle time tPC can be reduced, and thus data can be read out more rapidly.

As a semiconductor memory device having the cycle time in the data output operation reduced, there has been disclosed a semiconductor memory device with a pipeline burst mode (burst EDO mode) shown, e.g., in "NIKKEI BYTE", April 1995, p. 142.

FIG. 52 is a timing chart representing an operation during data reading of a semiconductor memory device with the pipeline burst mode. More specifically, FIG. 52 is a timing chart representing data reading operation. Referring to FIG. 52, the data read operation in the pipeline burst mode will now be described below.

At time t1, row address strobe signal ZRAS is set to the low level to take in an X-address signal X1, and then column address strobe signal ZCAS is set to the low level to take in a Y-address signal Y1 at time t2. Thereby, memory cells of 4 bits are selected per data output terminal DQ. In subsequent ZCAS cycles, i.e., at and after time t3, data of memory cells of 4 bits are successively output one at each time column address strobe signal ZCAS is set to the low level. More specifically, data D1, D2, D3 and D4 are output to data output terminal DQ upon lowering of column address strobe signal ZCAS at times t3, t4, t5 and t6, respectively.

In this pipeline burst mode, data of the memory cell, which is selected by the column address input at time t2, can be output in the subsequent ZCAS cycle, i.e., in the cycle during which column address strobe signal ZCAS attains the low level at time t3. Therefore, cycle time tPC in the data read operation can be shorter than a time tA after specifying of a column address to reading of data. Accordingly, data can be output during the cycle period of clock signal CLOCK, and thus data can be read fast. In this pipeline burst mode, when another column address is input while data is being output, memory cell data at four addresses are selected in accordance with this column address. Thus, data can be continuously read by successively inputting column addresses for memory cells at the same row address. Therefore, a large quantity of data can be transferred fast to a CPU (Central Processing Unit) which is an external processing unit. Also in this pipeline burst mode, data output terminal DQ is set to the high impedance state when data reading is completed in response to setting of both signals ZRAS and ZCAS to the high level.

The semiconductor memory device provided with the fast operation mode described above is generally used as a main storage unit of a microprocessor. This semiconductor memory device is generally controlled by a controller (DRAM controller) which produces the row address signal, column address signal, row address strobe signal ZRAS, column address strobe signal ZCAS, output enable signal ZOE and write enable signal ZWE in accordance with instructions issued from the microprocessor. The microprocessor and the controller operate in synchronization with clock signal CLOCK. Therefore, the controller generates the row address signal, column address signal and signals ZRAS, ZCAS, ZOE and ZWE in synchronization with clock signal CLOCK.

In order to select memory cells at a row other than that specified by row address Xl after data are read from four memory cells designated by the row address (X-address) supplied at time t1 and the column address (Y-address) Y1 supplied at time t2, it is necessary to maintain row address strobe signal ZRAS at the high level for a predetermined period (tRP: RAS precharge time) for initializing internal circuits such as an internal read circuit in the semiconductor memory device. In order to select another row, it is necessary to inactivate the selected word line and select another word line. For this purpose, an internal node of the semiconductor memory device must be temporarily precharged to a predetermined potential, so that an RAS precharge time tRP is required for surely performing this precharging (this semiconductor memory device is a dynamic semiconductor memory device which operates in accordance with row address strobe signal ZRAS and column address strobe signal ZCAS).

In FIG. 52, RAS precharge time tRP has a time period (between times t7 and t8) equal to double the cycle period of clock signal CLOCK. In this case, therefore, time tRC required for reading data of four memory cells specified by a different row address is equal to a time period from time t8 to time t1 and hence equal to 9 cycles of clock signal CLOCK.

It is assumed that, in order to reduce this time tRC (RAS cycle time), row address strobe signal ZRAS is set to the high level simultaneously with falling of column address strobe signal ZCAS at time t6 as shown in FIG. 53. The semiconductor memory device is supplied with signals ZRAS and ZCAS from an external controller. In the controller, circuitry issuing row address strobe signal ZRAS is different from that issuing column address strobe signal ZCAS, and a slight time difference occurs between timings of change of these signals. Delay in signal propagation between the controller and the semiconductor memory device is caused. In a structure where the semiconductor memory device is mounted on a printed circuit board, the signal propagation delay between the controller and the semiconductor memory device is fixedly determined depending on characteristics of signal lines on the printed circuit board. In the semiconductor memory device, if a delay, tdr, of row address strobe signal ZRAS with respect to clock signal CLOCK is smaller than a delay, tdc, of column address strobe signal ZCAS with respect to clock signal CLOCK, both signals ZRAS and ZCAS are at the high level for a certain period. In this case, read circuitry of the semiconductor memory device is initialized, and the data output terminal is set to the high impedance state, so that fourth data D4 cannot be output.

In order to read all data of the four memory cells, the controller sets column address strobe signal ZCAS to the low level at time t6, and will set row address strobe signal ZRAS to the high level after a predetermined time equal to a margin for transition of column address strobe signal ZCAS elapses. Since the controller is synchronized with clock signal CLOCK, row address strobe signal ZRAS attains the high level at time t7 as shown in FIG. 52. This causes a problem that the pipeline burst mode cannot reduce time tRC.

FIG. 54 schematically shows a structure of a data read portion related to a data output terminal of 1 bit. In FIG. 54, the read portion includes read amplifiers RAP0–RAP3 which amplify data M0–M3 of 4 bits of simultaneously selected memory cells in response to preamplifier enable signal PAE, respectively, an I/O decoder DEC which generates a control signal for sequentially selecting the memory cell data of 4 bits in accordance with Y-address signal CA and column address strobe signal ZCAS, a selector STR which selects the data amplified by read amplifiers RAP0–RAP3 in accordance with the select signal sent from I/O decoder DEC, and an output circuit OBF which buffers the data selected by selector STR and transmitting the same to data output terminal DQ.

In the structure for performing the operation in the pipeline burst mode, read amplifiers RAP0–RAP3 contains registers for storing the amplified data. Read amplifiers RAP0–RAP3 are provided corresponding to memory cell data M0–M3 of 4 bits, and are simultaneously activated to amplify memory cell data M0–M3 upon activation of preamplifier enable signal PAE, respectively. Since four read amplifiers RAP0–RAP3 simultaneously operate, a large amount of current Ic flows when read amplifiers RAP0–RAP3 are operating, as shown in FIG. 55, so that a voltage on a power supply line Vcc lowers due to a peak value of the large consumed current Ic, resulting in power supply noises and malfunction of circuits (high/low of data signal is erroneously determined due to lowered level of the power supply voltage.) Also, output circuit OBF shown as a block in FIG. 54 suffers from such a disadvantage that a trade-off relationship exists between fast reading and average power consumption as will be discussed below in detail.

FIG. 56 shows specific structures of the read amplifier and output circuit shown in FIG. 54. The selector is not shown in FIG. 56. Read amplifier RAP includes differential amplifiers 1900 and 1901 which differentially amplify data appearing on internal data lines I/O and ZI/O complementary with each other in response to preamplifier enable signal PAE. Data transmission lines I/O and ZI/O transmit complementary memory cell data (M). Complementary output signals sent from differential amplifiers 1900 and 1901 are transmitted to output circuit OBR via read data bus lines RBUS and ZRBUS, respectively. Parasitic capacitances 1902 and 1903 exist in read data bus lines RBUS and ZRBUS, respectively.

Output buffer circuit OBF includes a 2-input NAND gate 1904 receiving output buffer activating signal OEM and a signal on read data line RBUS, an inverter 1906 inverting the output signal of NAND gate 1904, an n-channel MOS transistor (insulating gate type field effect transistor) 1908 which is turned on to supply a current from a power supply node Vc to data output terminal DQ when the output signal of inverter 1906 is at the high level, an NAND gate 1905 receiving the signal on read data bus line ZRBUS and output buffer activating signal OEM, an inverter 1907 inverting the output signal of NAND gate 1905, and an n-channel MOS transistor 1909 which is turned on to discharge data output terminal DQ to ground potential Vss level when the output signal of inverter 1907 is at the high level. The operation of the read amplifier and output circuit shown in FIG. 56 will be described below with reference to a waveform diagram of FIG. 57.

When preamplifier enable signal PAE is at the low level and thus inactive, differential amplifiers 1900 and 1901 are also inactive, and both read data bus lines RBUS and ZRBUS are at the low level. In this state, both the output signals of NAND gates 1904 and 1905 are at the high level, and both MOS transistors 1908 and 1909 are turned off by inverters 1906 and 1907. Thus, data output terminal DQ is in the high impedance state.

Upon reading data signals, preamplifier enable signal PAE is maintained at the active state of the high level for a predetermined period. Differential amplifiers 1900 and 1901 are activated, and signal potentials on internal data transmission lines I/O and ZI/O are amplified, so that potentials on read data bus lines RBUS and ZRBUS change. Differential amplifiers 1900 and 1901 perform amplification complementarily (a positive input of differential amplifier 1900 is connected to internal data line I/O and a positive input of differential amplifier 1901 is connected to internal data line ZI/O). Therefore, complementary data signals are transmitted onto read data bus lines RBUS and ZRBUS. In the state that the potential on read data bus line RBUS is at the high level, when output buffer activating signal OEM attains the high level, MOS transistor 1908 is made on via NAND gates 1904 and 1906. In this state, the output signal of NAND gate 1905 is at the high level, and MOS transistor 1909 maintains the off state. Thereby, data output terminal DQ is charged via MOS transistor 1908, and thus data signal at the high level is output.

In the state that preamplifier enable signal PAE is active, when a data signal at the high level is transmitted onto read data bus line ZRBUS, MOS transistor 1909 is turned on, and MOS transistor 1908 is turned off. In this case, data output terminal DQ is discharged via MOS transistor 1909, so that data at the low level is output.

In the structure of the output circuit shown in FIG. 56, both read data bus lines RBUS and ZRBUS maintain the low level until the data signal is transmitted onto them. Therefore, even if output buffer activating signal OEM is activated before activation of preamplifier enable signal PAE as indicated by broken line in FIG. 57, the output terminal DQ maintains the high impedance state until the data signal is transmitted onto read data bus lines RBUS and ZRBUS. When the data signal is transmitted onto read data bus lines RBUS and ZRBUS, data is output to data output terminal DQ via output circuit OBF.

In the structure shown in FIG. 56, therefore, output buffer activating signal OEM can be activated at an earlier timing, so that dat a ca n be read out fast. In the structure shown in FIG. 56, however, parasitic capacitance 1902 of read data bus line RBUS must be charged when data at the high level is to be output, and parasitic capacitance 1903 of read data bus line ZRBUS must be charged when data at the low level is to be output. Thus, either of parasitic capacitances 1902 and 1903 is charged each time when data is to be read out, which results in an increase of an average power consumption (charge/discharge current of parasitic capacitance per cycle time).

FIG. 58 shows a structure of another data read portion. In FIG. 58, read amplifier RAP is formed of one differential amplifier 2100. Differential amplifier 2100 is responsive to preamplifier enable signal PAE to amplify differentially signals on internal data transmission lines I/O and ZI/O.

Output circuit OBF produces read data in accordance with the data signal on one read data line RBUS transmitted from differential amplifier 2100. Output circuit OBF includes an inverter 2102 which inverts a signal potential on read data bus line RBUS, an NAND gate 2105 receiving the signal on read data bus line RBUS and output buffer activating signal OEM, an inverter 2103 receiving the output signal of NAND gate 2105, an n-channel MOS transistor 2107 for outputting a signal at the high level to data output terminal DQ in accordance with the output signal of inverter 2103, an NAND gate 2106 which receives the output signal of inverter 2102 and output buffer activating signal OEM, an inverter 2104 which receives the output signal of NAND gate 2106, and an n-channel MOS transistor 2108 for discharging data output terminal DQ to transmit the signal at the low level to data output terminal DQ in accordance with the output signal of inverter 2104.

MOS transistors 2107 and 2108 are turned on when the output signals of inverters 2103 and 2104 are at the high level, respectively. A parasitic capacitance 2102 exists in read data bus line RBUS. Now, operation of the read portion shown in FIG. 58 will be described below with reference to an operation waveform diagram of FIG. 59. For the sake of illustration, the following description will be given on the operation of successively reading memory cell data bit by bit.

A memory cell is selected in response to activation of column address strobe signal ZCAS, and the selected memory cell data is transmitted onto internal data transmission lines I/O and ZI/O. When preamplifier enable signal PAE is at the inactive state of the low level, read data line RBUS is at the low level. When output buffer activating signal OEM is at the low level, both NAND gates 2105 and 2106 output the signals at the high level, so that both MOS transistors 2107 and 2108 are off, and data output terminal DQ is in the high impedance state.

When preamplifier enable signal PAE attains the high level, differential amplifier 2100 is activated. It is now assumed that the output signal of differential amplifier 2100 is at the low level. When the potential on read data line RBUS is at the low level, the output signal of NAND gate 2106 attains the low level in response to activation of output buffer activating signal OEM to the high level. Thereby, MOS transistor 2108 is turned on to discharge data output terminal DQ to the ground potential level, and data at the low level is read to data output terminal DQ. In this case, as can be seen from waveforms indicated at I and II in FIG. 59, read data is transmitted to data output terminal DQ in accordance with activation of output buffer activating signal OEM.

When differential amplifier 2100 outputs data at the high level onto read data bus line RBUS in response to activation of preamplifier activating signal PAE, the following two states selectively occur depending on a relationship between the change of the potential on read data bus line RBUS and the activation timing of output buffer activating signal OEM. When output buffer activating signal OEM is activated after rising of the potential on read data bus line RBUS shown at I in FIG. 59, read data at the high level is transmitted to data output terminal DQ in accordance with activation of output buffer activating signal OEM. On the other hand, when output buffer activating signal OEM is activated to attain the high level before change of the potential on read data bus line RBUS as shown at II in FIG. 59, MOS transistor 2108 is turned on in accordance with activation of output buffer activating signal OEM, so that data at the low level is once output, because the potential on read data bus line RBUS is at the low level at the time of activation of output buffer activating signal OEM. When the potential on read data bus line RBUS subsequently changes to the potential corresponding to the selected memory cell data, MOS transistor 2108 is turned off and MOS transistor 2107 is turned on, so that data at the high level is output to data output terminal DQ.

In the structure shown in FIG. 58, charging of parasitic capacitance 2101 is required only when data at the high level is to be read, so that the average current consumption can be made small. However, false data is once output when data at the high level is read as shown at II in FIG. 59, so that output buffer activating signal OEM cannot be activated at an earlier timing, and thus fast reading is impossible.

However, the structure of output circuit shown in FIG. 58 can offer the following advantage. In such a case that transition to the high level (transition to the inactive state) of column address strobe signal ZCAS does not cause the output high impedance state, data read in the last cycle is continuously output when row address strobe signal ZRAS maintains the low level, so that data can be read correctly regardless of the timing relationship between output buffer activating signal OEM and the potential on read data bus line RBUS as shown at III in FIG. 59.

Generally in semiconductor memory device of a large storage capacity, memory cells of a plurality of bits are simultaneously tested for rapidly determining existence of a defective memory cell. In this test operation, data of the same logic are written into a plurality of memory cells which are simultaneously selected, and then the data are read from the simultaneously selected memory cells to determine coincidence/non-coincidence of the read data, and to determine whether the memory cells of a plurality of bits are acceptable or not.

FIG. 60 shows a testing structure for one data I/O terminal of a 16-Mbit DRAM. In the test, one memory block MB is selected, and memory cells M0–M3 of 4 bits are selected in the selected memory block MB. In the test, data of the same logic are written into memory cells M0–M3 of 4 bits. When the data are read, a coincidence detector EXR which is activated in response to a test instruction signal TE determines coincidence/non-coincidence of logics of the data read from memory cells M0–M3 of 4 bits. When data of memory cells M0–M3 of 4 bits coincide with each other, it is determined that memory cells M0–M3 of 4 bits are acceptable. Since the memory cells of 4 bits are simultaneously tested for one data I/O terminal, the test can be executed fast.

Selector STR uses 2-bit address CA<1:0> of a column address for selecting a memory cell of 1 bit from memory cells M0–M3 of 4 bits. A DRAM operable in a pipeline burst mode can be easily accomplished by employing a structure which can sequentially select the memory cells to be selected simultaneously in the above test mode. In a 16-Mbit DRAM with the pipeline burst mode, therefore, a counter CNTR receives column address bits CA<1:0> and column address strobe signal ZCAS, and generates a select signal to selector STR, as shown in FIG. 61.

However, in currently available 64-Mbit DRAMs, a parallel test mode generally employs 32-bit compression (simultaneous testing of memory cells of 32 bits). For example, in a 64-Mbit DRAM having a 4-bit word structure, test is simultaneously effected on memory cells of 8 bits per data I/O pin terminal. In this case, the degenerated address is standardized as shown in FIG. 62. In FIG. 62, if the refresh cycle is 8K-refresh (i.e., if logical word lines are 8K in number), the degenerated addresses are column address bits CA10, CA9 and CA8 in the case of the 4-bit word structure, and the degenerated addresses are column address bits CA9 and CA8 in the case of the 8-bit word structure. If the refresh cycle is 4K-refresh (i.e., if logical word lines are 4K in number), the degenerated addresses are column address bits CA11, CA10 and CA9 in the case of the 4-bit word structure, and the degenerated addresses are column address bits CA10 and CA9 in the case of the 8-bit word structure.

Here, the "logical word lines" are word lines to be simultaneously selected, and correspond to rows specified by row address signals.

The degenerated addresses of the 64-Mbit DRAM are address bits to be simultaneously selected during the test mode of operation.

FIG. 63 schematically shows a structure of a portion corresponding to data output terminal DQ of one bit in x4-bit structure. Memory block MB is divided into two, i.e., upper and lower regions depending on column address bit CA8. In the upper and lower regions of memory block MB, memory cells M0a–M3a of 4 bits and memory cells M0b–M3b of 4 bits are selected during the test mode of operation. In the normal operation, memory cells of 4 bits in only one of these regions are selected in accordance with column address bit CA8. Selectors STRa and STRb, which select corresponding memory cells of 4 bits to pass the selected cell data in accordance with column address bits CA<8> and ZCA<8> are provided corresponding to the upper and lower regions of memory block MB. Data of memory cells of 4 bits transmitted from one of selectors STRa and STRb is sent to a selector STRC. Selector STRc selects a memory cell of 1 bit to transmit the data toward data output terminal DQ in accordance with 2 bits CA<10:9> of column address.

In the test operation, data of memory cells M0a–M3a and M0b–M3b are sent to coincidence detecting circuit EXR, which detects coincidence/non-coincidence of their logics. In this case, therefore, column address bits CA<10:8> are used for selecting the memory cell of 1 bit from simultaneously selected memory cells M0a–M3a and M0b–M3b, and 8-bit data is compressed into 1-bit data, so that the degenerated address is column address bits CA10, CA9 and CA8 in the test operation.

When the pipeline burst mode is to be implemented in the semiconductor memory device having the above structure, the counter is constructed such that a signal for selecting a memory cell of 1 bit is applied to selector STRc in accordance with column address bits CA<10:9>. According to this structure, a semiconductor memory device potentially operable in the fast page mode and pipeline burst mode is formed on the same semiconductor chip, and the structure operating in only one of these modes can be easily completed by a mode selection circuit.

In this case, the counter address applied from the counter to selector STRc is column address bits CA<10:9>. Meanwhile, in the case of 16-Mbit DRAM, the counter address is CA<1:0> as shown in FIG. 61. Therefore, the counter address for the 64-Mbit DRAM is different from that for 16-Mbit DRAM, so that there is no pin compatibility therebetween, and thus 64-Mbit DRAM cannot be used instead of 16-Mbit DRAM.

SUMMARY OF THE INVENTION

An object of the invention is to provide a semiconductor memory device which has address pins compatible with semiconductor memory device in another generation and can perform fast operation with a low current consumption.

Another object of the invention is provide a semiconductor memory device which can perform fast operation with a low current consumption and can efficiently achieve operation modes of different data output nodes based on the column address strobe signal.

A semiconductor memory device according to one aspect of the invention includes a first signal generating circuit responsive to deactivation of a row address strobe signal instructing a start of row selection for generating a signal resetting an operation related to selection of a row in a memory cell array; a delay circuit for delaying the deactivation of the row address strobe signal by a predetermined time; and a second signal generating circuit responsive to deactivation of the delayed row address strobe signal sent from the delay circuit and deactivation of a column address strobe signal instructing a start of selection of a column in the memory cell array for generating a signal setting an output buffer outputting data of the selected memory cell to a data output terminal to an output high impedance state.

A semiconductor memory device according to a second aspect includes a column selecting circuit for simultaneously selecting a plurality of columns in a memory cell array in accordance with a column address signal; a plurality of read amplifier circuits provided corresponding to the plurality of selected columns for amplifying and transmitting data of the memory cells in the corresponding columns to an output buffer; a control circuit responsive to deactivation of the column address signal and a column address strobe signal for activating the read amplifier circuits sequentially in accordance with activation of the column address strobe signal; and a circuit for externally outputting data amplified by the read amplifier circuit in synchronization with activation of the column address strobe signal.

A semiconductor memory device according to a third aspect includes a pair of first and second read data lines for transmitting complementary data of a selected memory cell; an output buffer coupled to the first and second read data lines for buffering received data signals for external outputting; an operation mode designating signal generating circuit for generating a signal designating one of a first operation mode for setting the output buffer to an output high impedance state in response to deactivation of a column address strobe signal and a second operation mode for activating the output buffer regardless of an inactive state of the column address strobe signal; a read amplifier circuit for amplifying the data of the selected memory cell into complementary data and transmitting the same onto the first and second read data lines; and an inhibiting circuit for inhibiting transmission of the data onto the second read data line from the read amplifier circuit when the second operation mode is designated. The output circuit includes a circuit for producing read data in accordance with the data signals on the first and second data lines when the first operation mode is designated, producing the read data in accordance with only the data signal on the first data line when the second operation mode is designated, and for transmitting the produced data to a data output terminal in each operation mode.

A semiconductor memory device according to a fourth aspect includes a plurality of address pins receiving in parallel an address bit of a first group, an address bit of a second group and the rest of address bits; a mode designating circuit including a specific node to be set to one of first and second potentials, for generating a signal designating one of the first and second operation modes in accordance with the set potential on the specific node; and address input pads including a predetermined number of pads to be connected to the address bit input pin of the first group when the specific node is set to the first potential and to be connected to the address bit input pin of the second group when the specific node is set to the second potential, for being connected to the plurality of address input pins for internally transmitting the received address bits.

In the semiconductor memory device of the first aspect, the second signal generating circuit sets the output buffer to the output high impedance state in accordance with deactivation of the delayed row address strobe signal and deactivation of the column address strobe signal. Therefore, the semiconductor memory device operates to output the data signal from the output buffer in accordance with the previously activated column address strobe signal, even if an external controller activates the column address strobe signal and simultaneously deactivates the row address strobe signal. Therefore, the row address strobe signal can be deactivated at an earlier timing, and thus a cycle period of the row address strobe signal can be made short, so that fast reading is allowed.

According to the semiconductor memory device of the second aspect, the read amplifier circuits are controlled to be activated in accordance with an order of successive reading of the data by the control circuit, so that these read amplifier circuits are not simultaneously activated, and the consumed current can be distributed. Correspondingly, the peak current can be reduced, and the power consumption can be reduced. Owing to reduction of the peak current, generation of power supply noises can be suppressed, and thus stable operation can be ensured.

According to the semiconductor memory device of the third aspect, the read data is produced and output to the data output terminal in accordance with the complementary data signals on the first and second read data lines in the first operation mode, so that fast reading can be performed. However, a cycle time for data reading can be relatively made long. Therefore, the times of charging/discharging of the parasitic capacitance on the read data line can be small, and thus the average current consumption can be reduced. In the second operation mode, the read data is produced and output to the data output terminal in accordance with the data signal on one of the read data lines. Therefore, charging and discharging of only one of the read data lines is performed even if the cycle time is reduced, so that the charge/discharge currents on the read data lines can be reduced, and thus the average current consumption can be reduced. Since different path arrangements of the read data lines are selected in accordance with the operation mode, two kinds of semiconductor memory devices can be simultaneously implemented by manufacturing only one semiconductor memory device on a semiconductor chip. In contrast to the case where two kinds of the devices are individually manufactured, different processes and masks are not required, so that a manufacturing cost can be reduced.

According to the semiconductor memory device of the fourth aspect, different connections between the address input pins and the address pads are selected in accordance with the operation mode, and internal circuits of semiconductor memory device in another generation can receive the same internal address bits for operation, so that change of allocation of external address signals can be easily accommodated without changing arrangement of internal circuits. Therefore, compatibility of the internal circuits and pins can be maintained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 11A and 11B are waveform diagrams representing an operation of the column address buffer shown in FIG. 10;

FIG. 12 shows a structure of the column address buffer of the least significant bit;

FIG. 16 shows output values of the counter shown in FIG. 14 in a list form;

FIG. 17 shows a structure of a portion for generating a column address latch instruction signal shown in FIGS. 10 and 12;

FIG. 18 is a signal waveform diagram representing an operation of the circuit shown in FIG. 17;

FIGS. 23A and 23B show a circuit structure for generating a write driver enable signal used in the invention;

FIG. 24 is a signal waveform diagram representing an operation of a circuit portion shown in FIG. 23;

FIG. 31 shows a circuit structure for generating a data transfer instruction signal;

FIGS. 32A and 32B are signal waveform diagrams representing an operation of a circuit shown in FIG. 31;

FIGS. 49A–49C show connection between address input pin terminals and address input pads in the semiconductor memory device according to the invention;

FIG. 54 schematically shows a structure of a read portion in the conventional semiconductor memory device;

FIG. 55 is a diagram for describing a problem of the conventional semiconductor memory device;

FIG. 61 shows a structure of a counter for successively selecting multiple bits one by one in the conventional semiconductor memory device;

FIG. 62 shows degenerated addresses in the semiconductor memory device in a list form; and FIG. 63 is a diagram for explaining a problem of the degenerated address and counter address in the conventional semiconductor memory device.

DESCRIPTION OF THE PREFERRED EMBODIMENTS

[Array Structure]

Figure 1:
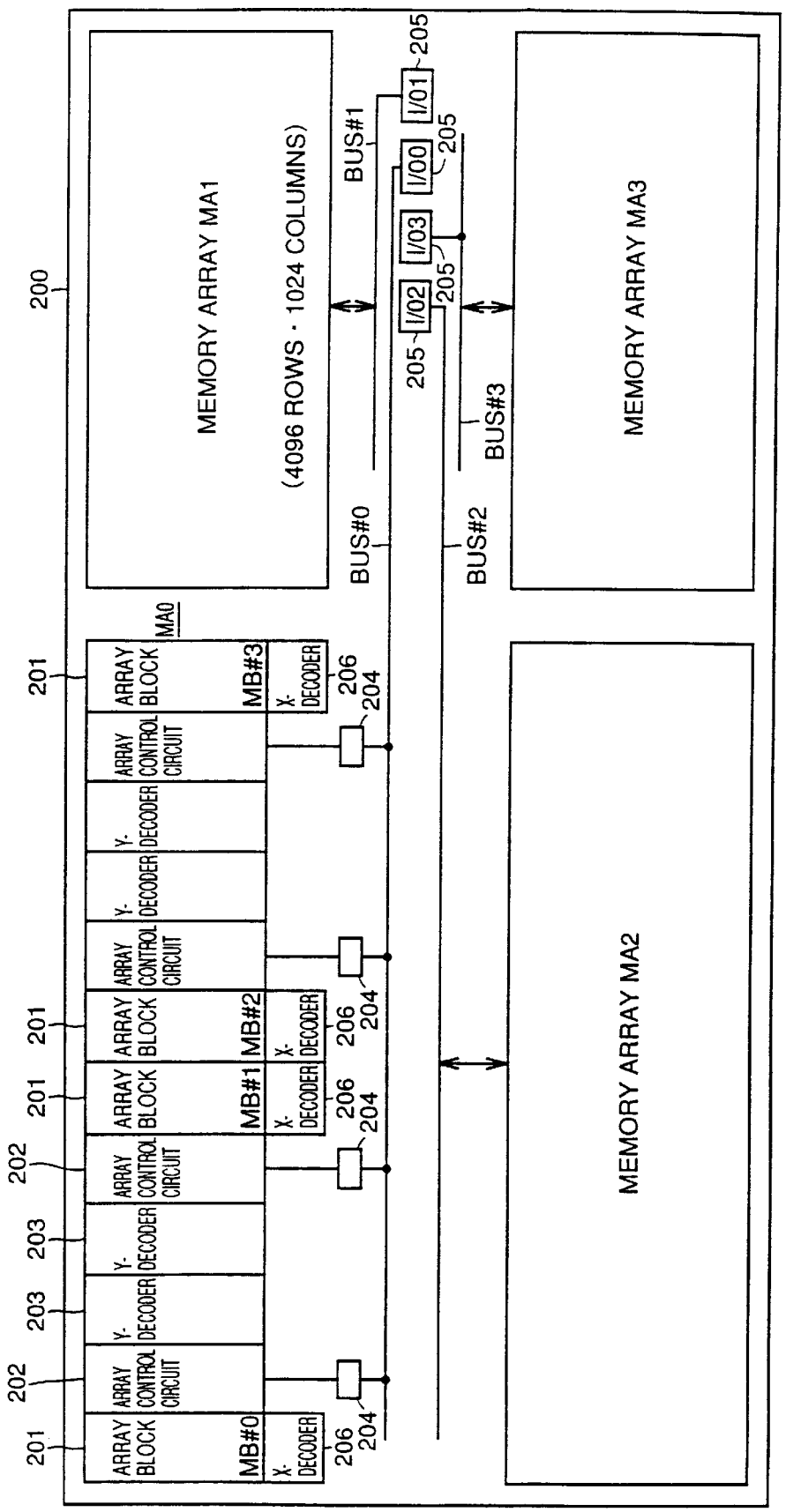
FIG. 1 schematically shows a whole structure of a semiconductor memory device to which the invention is applied.

FIG. 1 schematically shows a whole structure of a semiconductor memory device according to a first embodiment of the invention. FIG. 1 shows only a portion related to input and output of data, and peripheral control circuitry is not shown. The peripheral control circuitry will be described later in detail.

In FIG. 1, a semiconductor memory device 200 is formed on a semiconductor chip, and includes four memory arrays MA0–MA3 each having a storage capacity of 4 Mbits (4096 rows×1024 columns). Since memory arrays MA0–MA3 have the same structure, FIG. 1 specifically shows the structure of only memory array MA0. Upon accessing, a memory cell of 1 bit is selected in each of memory arrays MA0–MA3.

Memory array MA0 includes array blocks MB#0–MB#3 (201) each having a plurality of memory cells arranged in 1024 rows and 1024 columns. Upon accessing, only one of the array blocks is selected.

For each of array blocks 201 (generally indicating blocks MB#0–MB#3), there are provided an X-decoder 206 which decodes a row address signal sent from an address buffer to be specifically described later for selecting a corresponding row, an array control circuit 202 which controls data reading and column selection in array block 201, and a Y-decoder 203 which decodes a column address signal sent from a column address buffer to be specifically described later for selecting a corresponding column in array block 201. Array control circuit 202 includes a sense amplifier which senses and amplifies data of the selected memory cell, a precharge/equalize circuit which precharges each column to a predetermined potential, and a select gate which connects the selected column to an internal data line (I/O line) in accordance with the output signal of the Y-decoder.

As will be described later in more detail, memory cells in 4 columns (i.e., of 4 bits) are simultaneously selected in array block 201. I/O circuit 204 selects the memory cell of 1 bit from the memory cells of 4 bits. The structure of I/O circuit 204 will be described later in detail.

For memory arrays MA0–MA3, there are arranged I/O buffer circuits (I/O0–I/O3) 205, which are placed at one side with respect to a center region in a longer side direction in a center region in a shorter side direction of a semiconductor memory device (chip) 200 and adjacent to pads for input and output of data with an external device, and read/write data buses BUS#0–BUS#3 connected to I/O buffer circuits 205, respectively. Structures of read/write data buses BUS#0–BUS#3 will also be described later in detail. Read/write data buses BUS#0–BUS#3 each transmit memory cell data of 1 bit between corresponding memory arrays MA0–MA3 and corresponding I/O buffer circuits I/O0–I/O3.

Figure 2:
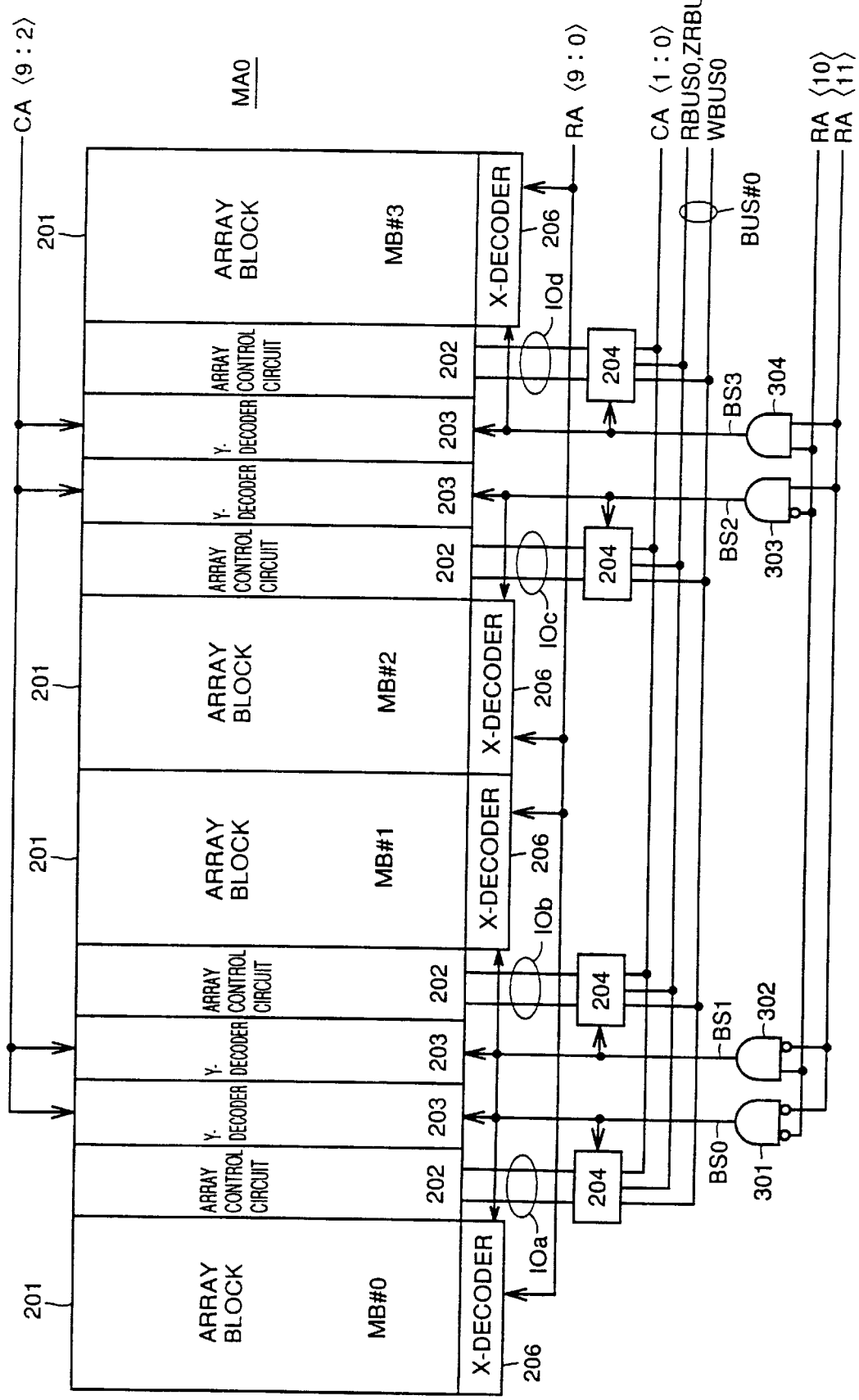
FIG. 2 schematically shows a structure of one of memory arrays in the semiconductor memory device shown in FIG. 1.

FIG. 2 shows a structure of a control portion in memory array MA0 in FIG. 1. In FIG. 2, there are provided block select gates 301, 302, 303 and 304, which correspond to array blocks MB#0–MB#3, respectively, and operate to decode row address bits RA<11:10> and output a select signal for the corresponding array blocks. Block select signals BS0–BS3 sent from block select gates 301–304 are sent to X-decoder 206, Y-decoder 203 and I/O circuit 204 provided in the corresponding array blocks MB#0–MB#3.

Block select gate 301 sets block select signal BS0 to the high level of the active state when both row address bit RA<10> and RA<11> are at the low level. Block select gate 302 sets block select signal BS1 to the high level indicative of the selected state when address bit RA<10> is at the high level and address bit RA<11> is at the low level. Block select gate 303 sets block select signal BS2 to the high level when row address bit RA<10> is at the low level and row address bit RA<11> is at the high level. Block select gate 304 sets block select signal BS3 to the high level when both row address bits RA<11:10> are at the high level. Only one of block select signals BS0–BS3 is set to the high level indicative of the selected state. Thus, Y-decoder 203, X-decoder 206 and I/O circuit 204 operate only in the array block corresponding to the block select signal set to the selected state. Other array blocks maintain the nonselected state (standby state).

I/O circuits 204 are connected to corresponding array blocks MB#0, MB#1, MB#2 and MB#3 via an internal I/O bus IOa, IOb, IOc and IOd each of which transmits memory cell data of 4 bits. Each of internal I/O buses IOa–IOd transmits complementary internal data (the bus structure will be described later in detail). When I/O circuit 204 is activated by the block select signal, it decodes 2-bit column address CA<1:0> and selects one bus line (or one pair of bus lines) among bus lines of 4 bits of corresponding internal I/O bus IO (IOa–IOd) in accordance with the result of decoding.

Read/write data bus BUS#0 arranged between I/O circuit 204 and corresponding I/O buffer circuit I/O0 (205) includes one write data bus line WBUS0 for transmitting write data and a pair of read data bus lines RBUS0 and ZRBUS0 for transmitting read data. The operation will be briefly described below.

For simplicity, it is assumed that block select signal BS0 is set to the high level in accordance with row address (block address) RA<11:10>, so that array block MB#0 is selected. X-decoder 206 decodes 10 bits RA<9:0> of row address and selects one row from 1024 rows in array block MB#0. Y-decoder 203 decodes 8 bits CA<9:2> of column address and simultaneously select four columns from 1024 columns in array block MB#0. The four columns simultaneously selected by Y-decoder 203 are connected to internal I/O bus IOa of 4 bits in parallel. I/O circuit 204 connects one of these four columns to read/write data bus BUS#0 in accordance with 2 bits CA<1:0> of column address. A nibble mode is achieved by changing internal column address CA<1:0> in response to toggle of column address strobe signal ZCAS.

Figure 3:
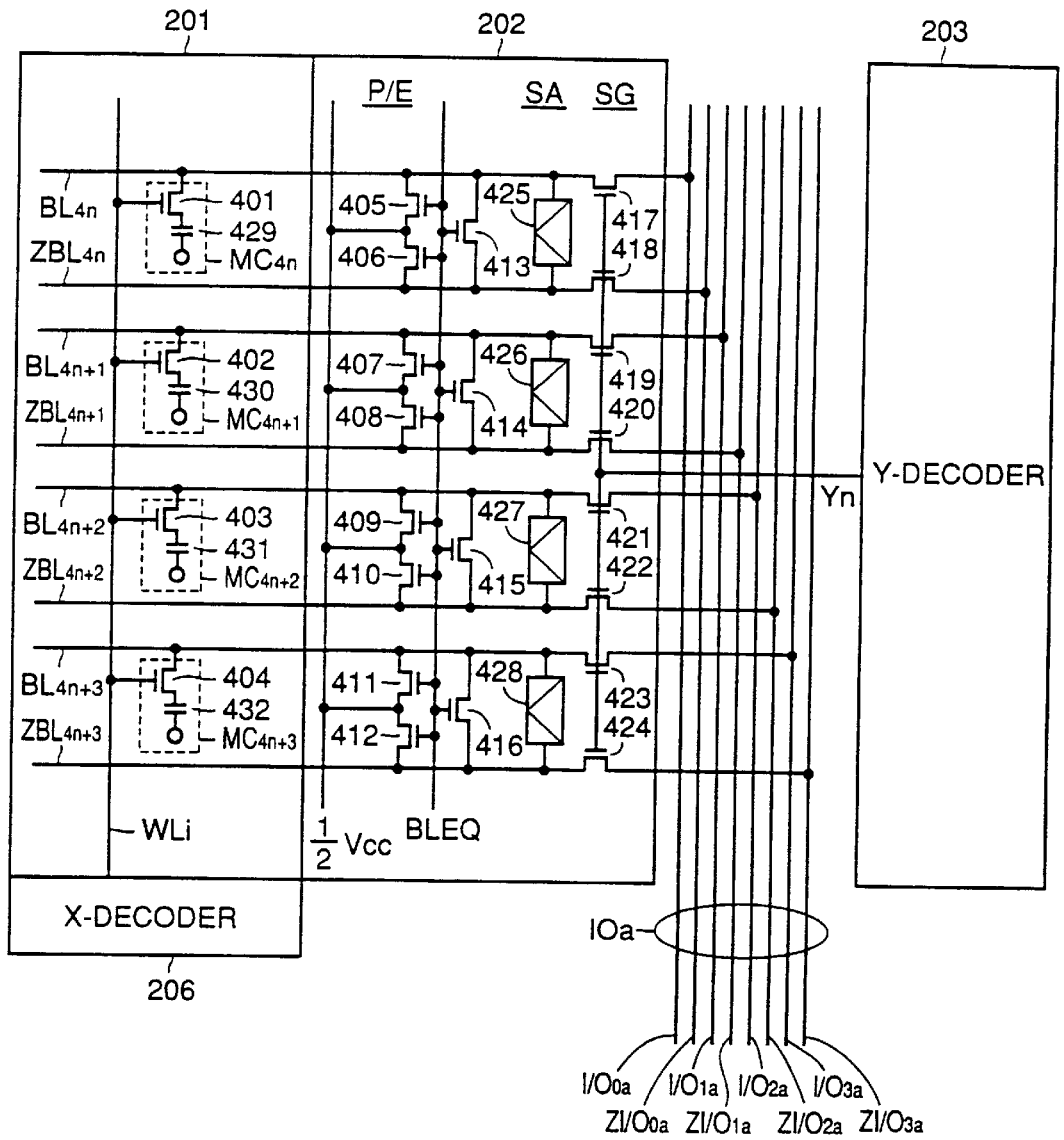
FIG. 3 shows a structure of an array block and an array control portion shown in FIG. 2.

FIG. 3 specifically shows structures of array block MB#0 and corresponding array control circuit 202 shown in FIG. 2. In FIG. 3, array block 201 includes a plurality of memory cells MC arranged in rows and columns. FIG. 3 representatively shows memory cells MC4n–MC4n+3 to be selected simultaneously.

Array block 201 further includes bit line pairs BL and ZBL arranged corresponding to the respective columns of memory cells, and a plurality of word lines WL arranged corresponding to the respective rows of memory cells. In FIG. 3, there are representatively shown four pairs of bit lines BL4n and ZBL4n, . . . BL4n+3 and ZBL4n+3 as well as one word line WLi. Each pair of bit line BL (BL4n–BL4n+3) and bit line ZBL (ZBL4n–ZBL4n+3) transmit complementary data signals. Memory cell MC4n is arranged at a crossing of word line WLi and bit line BL4n. Memory cell MC4n includes a memory cell capacitor 429 storing information, and an access transistor 401 which is formed of an n-channel MOS transistor and is turned on in response to a signal potential on word line WLi to connect capacitor 429 to bit line BL4n. Memory cell MC4n+1 is arranged corresponding to a crossing of word line WLi and bit line BL4n+1. Memory cell MC4n+1 includes a capacitor 430 and an access transistor 402. Memory cell MC4n+2 is arranged corresponding to a crossing of word line WLi and bit line BL4n+2. Memory cell MC4n+2 includes a capacitor 431 and an access transistor 403. Memory cell MC4n+3 is arranged corresponding to a crossing of word line WLi and bit line BL4n+3. Memory cell MC4n+3 includes a capacitor 432 and an access transistor 404.

Array control circuit 202 includes a precharge/equalize circuit P/E which precharges and equalizes bit line pair BL and ZBL to a predetermined potential (Vcc/2: Vcc is an operation power supply potential), a sense amplifier band SA which differentially amplifies signal potentials on each bit line pair BL and ZBL, and a select gate band SG which connects four pairs of bit lines BL4n and ZBL4n–BL4n+3 and ZBL4n+3 to internal I/O bus IOa in accordance with column select signal Yn sent from Y-decoder 203.

The precharge/equalize circuit for bit line pair BL4 and ZBL4 includes n-channel MOS transistors 405 and 406 which are turned on to transmit an intermediate potential Vcc/2 to bit lines BL4n and ZBL4n, respectively, and an n-channel MOS transistor 413 which is turned on to connect electrically bit lines BL4n and ZBL4n. The precharge/equalize circuit provided for bit line pair BL4n+1 and ZBL4n+1 includes n-channel MOS transistors 407 and 408 which are turned on to transmit intermediate potential Vcc/2 to bit lines BL4n+1 and ZBL4n+1, respectively, and an n-channel MOS transistor 414 which is turned on to connect electrically bit lines BL4n+1 and ZBL4n+1. The precharge/equalize circuit provided for bit line pair BL4n+2 and ZBL4n+2 includes n-channel MOS transistors 409 and 410 which are turned on to transmit intermediate potential Vcc/2 to bit lines BL4n+2 and ZBL4n+2, respectively, and an n-channel MOS transistor 415 which is turned on to connect electrically bit lines BL4n+2 and ZBL4n+2. The precharge/equalize circuit provided for bit line pair BL4n+3 and ZBL4n+3 includes n-channel MOS transistors 411 and 412 which are turned on to transmit intermediate potential Vcc/2 to bit lines BL4n+3 and ZBL4n+3, respectively, and an n-channel MOS transistor 416 which is turned on to connect electrically bit lines BL4n+3 and ZBL4n+3. These MOS transistors 405–416 are turned on when a precharge instruction signal BLEQ attains the high level. Bit line precharge instruction signal BLEQ is active at the high level when the semiconductor memory device is in a standby state (or during reset operation while row address strobe signal ZRAS is inactive).

Sense amplifier band SA includes a sense amplifier 425 provided for bit line pair BL4n and ZBL4n, a sense amplifier 426 provided for bit line pair BL4n+1 and ZBL4n+1, a sense amplifier 4277 provided for bit line pair BL4n+2 and ZBL4n+2, and a sense amplifier 428 provided for bit line pair BL4n+3 and ZBL4n+3.

Select gate band SG includes transfer gates 417 and 418 which are turned on to connect bit lines BL4n and ZBL4n to data I/O lines I/Oa and ZI/O0a, respectively, transfer gates 419 and 420 which are turned on to connect bit lines BL4n+1 and ZBL4n+1 to data I/O lines I/O1a and ZI/O1a, respectively, transfer gates 421 and 422 which are turned on to connect bit lines BL4n+2 and ZBL4n+2 to data I/O lines I/O2a and ZI/O2a, respectively, and transfer gates 423 and 424 which are turned on to connect bit lines BL4n+3 and ZBL4n+3 to data I/O lines I/O3a and ZI/O3a, respectively. Operation of the arrangement of FIG. 3 will be briefly described below.

When word line WLi is selected (and has its potential risen) in response to a word line drive signal sent from X-decoder 206, the gate potentials of access transistors 401–404 rise. When a word line is to be selected, precharge/equalize instruction signal BLEQ is already set to the L-level of the inactive state, and all MOS transistors 405–416 of the precharge/equalize circuit are turned off. Therefore, the potentials of bit lines BL4n–BL4n+3 change from the precharged potential (i.e., intermediate potential Vcc/2) in accordance with electric charges stored in capacitors 429–432, respectively. Thereafter, sense amplifiers 425–428 of sense amplifier band SA are activated, and data transmitted onto bit lines BL4n–BL4n+3 are sensed and amplified.

Then, the potential on column select line Yn supplied from Y-decoder 203 is set to the high level indicative of the selected state, and all transfer gates 417–424 are turned on. Thereby, storage data of memory cells MC4n–MC4n+3 of 4 bits (i.e., data amplified by sense amplifiers 425–428) are transmitted onto I/O lines I/O0a and ZI/O0a–I/O3a and ZI/O3a. The I/O circuit, which will be described later, selects one of I/O line pairs I/O0a and ZI/O0a–I/O3a and ZI/O3a, and data is written or read through the selected pair.

[Structure of I/O Circuit]

The semiconductor memory device of the embodiment described above can potentially accomplish two operation modes, i.e., operation mode in which the data output terminal does not attain the high impedance state even when column address strobe signal ZCAS attains the high level of the active state, and an operation mode in which the data output terminal attains the high impedance state when column address strobe signal ZCAS attains the high level. Selection of these operation modes may be accomplished by a mode selection circuit or mask interconnections. As typical examples of the two operations, description will now be given on the pipeline burst mode and the fast page mode.

Figure 4:
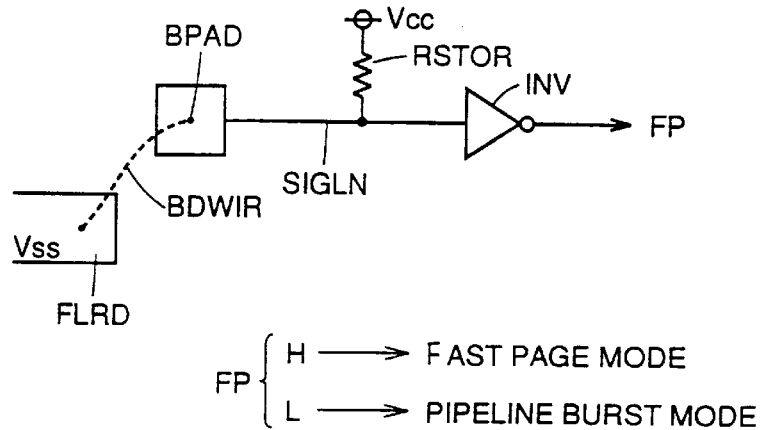
FIG. 4 illustrates an example of a portion for generating a signal designating an operation mode.

FIG. 4 shows a structure of a portion for generating a signal designating the operation mode. In FIG. 4, a signal line SIGLN is connected to a bonding pad BPAD, and is coupled to power supply node Vcc via a resistance element RSTOR of a high resistance. Signal line SIGLN is coupled to an input of an inverter INV, from which an operation mode designating signal FP is output. When operation mode designating signal FP is at the high level, the fast page mode is designated. When the operation mode designating signal FP is at the low level, the pipeline burst mode is achieved. Setting of the potential level of signal FP is made a bonding wire BDWIR between bonding pad BPAD and a frame lead FLRD supplying ground voltage Vss. If bonding wire BPAD and frame lead FLRD are connected via bonding wire BDWIR, signal line SIGLN is fixed at the low level, and inverter INV sets signal FP to the high level, so that the fast page mode is designated. If bonding wire BDWIR does not exist, signal line SIGLN is set to the high level by high resistance resistor element RSTOR. In this case, signal FP attains the low level, and thus designates the pipeline burst mode.

The structure for generating operation mode designating signal FP shown in FIG. 4 is a mere example, and may be replaced with a structure in which operation mode designating signal FP is generated depending on whether the a bonding wire exists between the bonding pad and the frame lead supplying the power supply potential. In this case, resistor RSTOR is connected between ground potential level and signal line SIGLN. Such a structure may alternatively be employed that the potential level of signal FP is set by programming of a fuse element or mask interconnection.

Figure 5:
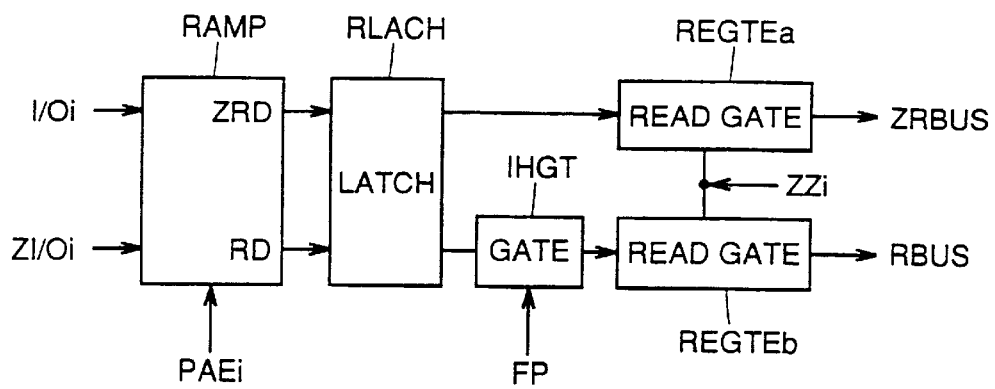
FIG. 5 is a block diagram schematically showing a structure of a data read portion in an embodiment of the invention.

FIG. 5 schematically shows a structure of a data read portion for reading data of 1 bit in I/O circuit 204 shown in FIG. 2. In FIG. 5, the I/O circuit includes a read amplifier RAMP which amplifies potentials on internal data I/O lines I/Oi and ZI/Oi transmitting memory cell data, a latch circuit RLACH latching the output signal of read amplifier RAMP, read gates REGTEa and REGTEb which supply data latched by latch circuit RLACH onto read data bus lines ZRBUS and RBUS, and an inhibiting gate IHGT which is arranged between the latch circuit RLACH and read gate REGTEb and selectively transmits the output signal of latch circuit RLACH to read gate REGTEb in accordance with operation mode designating signal FP.

Inhibiting gate IHGT transmits the data latched by latch circuit RLACH to read gate REGTEb when operation mode designating signal FP is at the high level designating the fast page mode. When the operation mode designating signal FP is at the low level designating the pipeline burst mode, inhibiting gate IHGT inhibits transfer of data from latch circuit RLACH to read gate REGTEb, and fixes the data signal sent from read gate REGTEb to a predetermined potential level.

Read gates REGTEa and REGTEb transmit data signals, which are sent from latch circuit RLACH, to read data bus lines ZRBUS and RBUS, respectively, only when a bit select signal ZZi indicates the selected state.

Read amplifier RAMP is activated in accordance with an activating signal PAEi, which is produced in accordance with preamplifier enable signal PAE and bit select signal ZZi by a structure to be described later. More specifically, read amplifier RAMP is activated only when memory cell data is to be transmitted onto read data bus lines ZRBUS and RBUS. In I/O circuit 204, read amplifiers RAMP are provided for memory cell data of 4 bits, respectively. Therefore, read amplifiers RAMP for amplifying data of simultaneously selected memory cells of 4 bits are activated at different timings (different ZCAS cycles). Accordingly, the current consumption in read amplifiers RAMP is distributed, and a peak value of the consumed current can be reduced.

Figure 59:
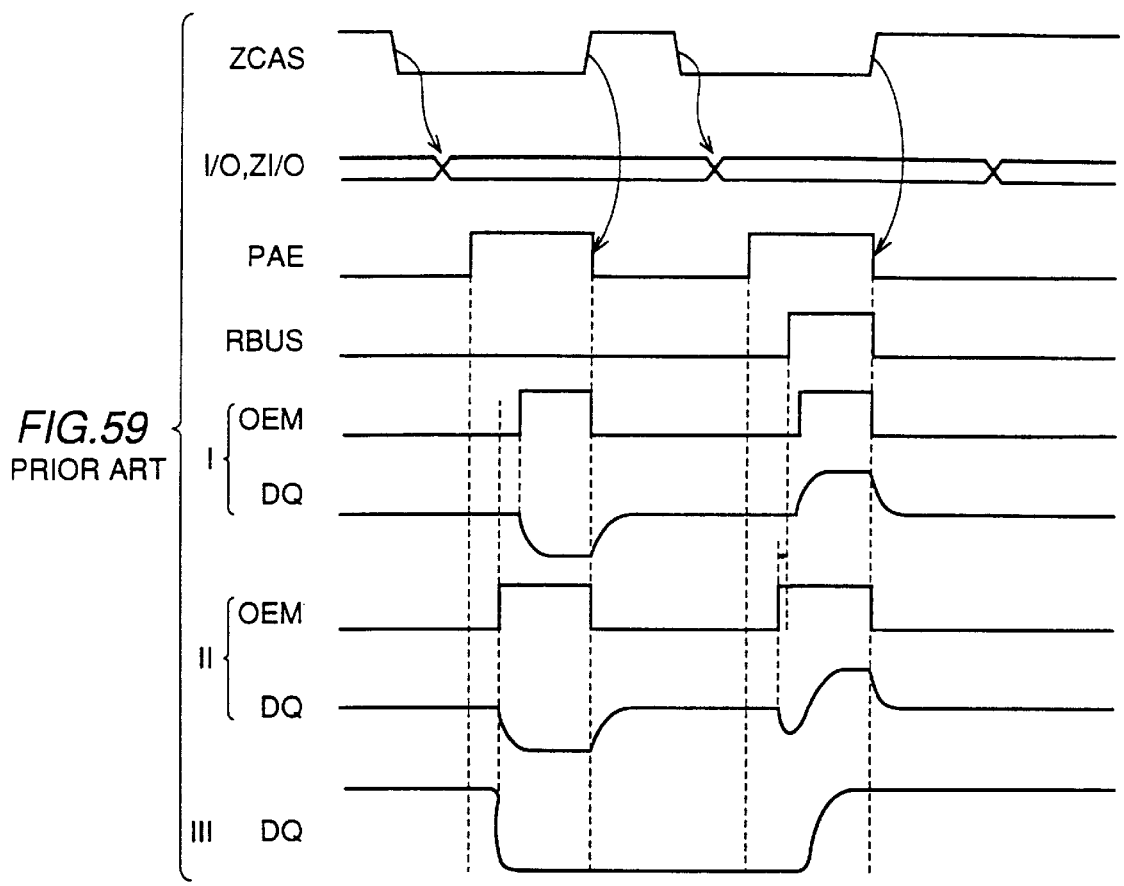
FIG. 59 is a signal waveform diagram representing an operation of an output buffer circuit shown in FIG. 58.
Figure 60:
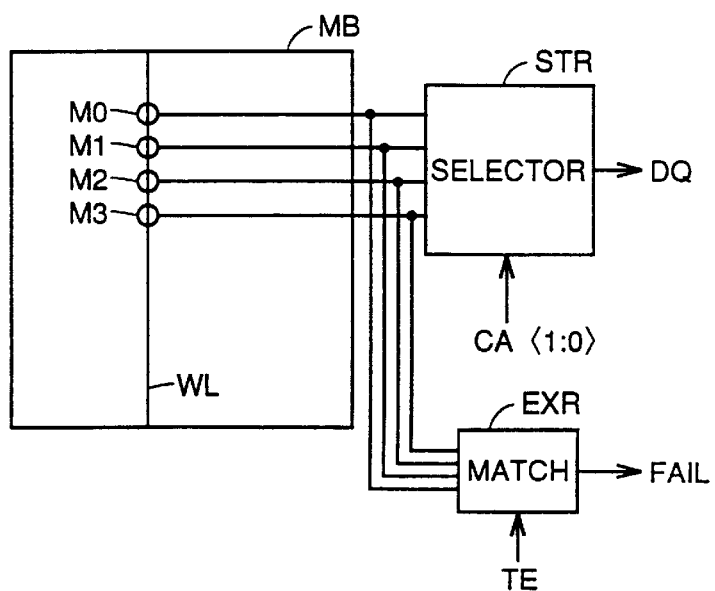
FIG. 60 shows a manner of memory cell selection during multibit test in the conventional semiconductor memory device.

When the fast page mode is designated (i.e., when signal FP is at the high level), data are transferred to the output buffer circuit via read gates REGTEa and REGTEb and two read data bus lines ZRBUS and RBUS. In this fast page mode, when column address strobe signal ZCAS attains the high level, the data output terminal attains the high impedance state. In this case, the cycle time (tPC) of data output cannot be reduced, so that the average current consumption can be made small, because the number of charging/discharging per time is small (owing to long cycle time) even if the two read data bus lines are used for charging/discharging their parasitic capacitances. In the pipeline burst mode, the data output terminal does not attain the high impedance state even when column address strobe signal ZCAS is set to the high level, so that data in the last cycle is continuously output. Therefore, as indicated at III in the waveform diagram of FIG. 59, any erroneous data is not output even if output buffer activating signal OEM is activated before transmission of valid data. Even if the cycle time of data reading is reduced, charging/discharging of only one data bus line are performed, and correspondingly the charge/discharge current can be reduced, so that the average current consumption can be reduced.

By utilizing the structure of the I/O circuit shown in FIG. 5, it is possible to implement a semiconductor memory device which can operate fast with a low current consumption in any of the fast page mode and the pipeline burst mode. By selecting the bus structure in accordance with the operation mode, it is possible to implement a semiconductor memory device which can selectively accomplish two different modes on one semiconductor chip, so that the manufacturing cost can be reduced as compared with the structure where they are implemented on different chips.

[Specific Structure of I/O Circuit]

Figure 6:
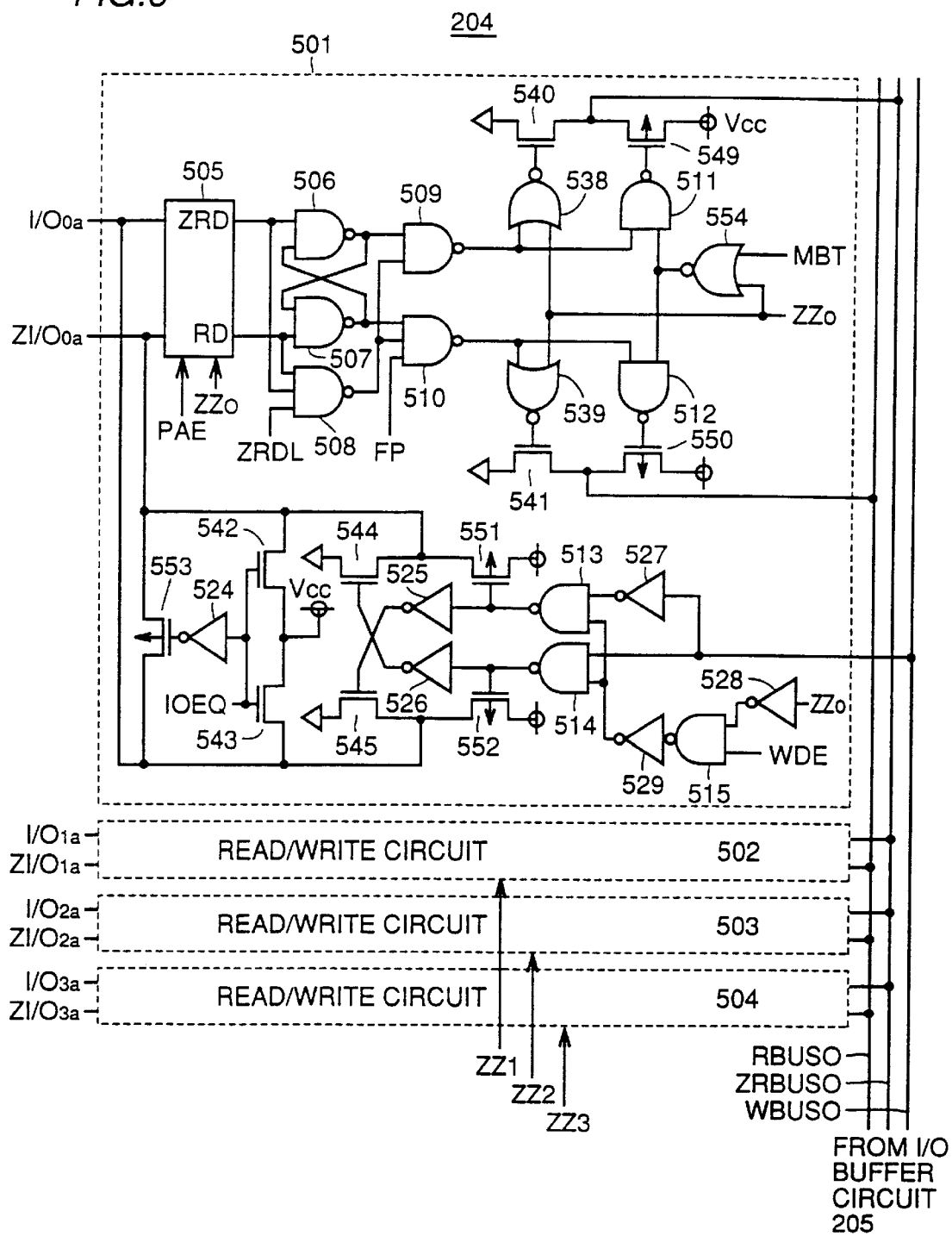
FIG. 6 specifically shows a structure of the data read portion shown in FIG. 5.

FIG. 6 shows a specific structure of the I/O circuit shown in FIG. 5. In FIG. 6, there are provided read/write circuits 501, 502, 503 and 504 corresponding to the memory cells of 4 bits to be selected simultaneously, respectively. Read/write circuit 501 is activated in response to bit select signal ZZ0 and transmits data signals onto or from internal I/O lines I/O0a and ZI/O0a. Read/write circuit 502 is activated in response to bit select signal ZZ1 and transmits data signals onto or from internal I/O lines I/O1a and ZI/O1a. Read/write circuit 503 is activated in response to bit select signal ZZ2 and transmits data signals onto or from internal I/O lines I/O2a and ZI/O2a. Read/write circuit 504 is activated in response to bit select signal ZZ3 and transmits data signals onto or from internal I/O lines I/O3a and ZI/O3a. Read data bus lines RBUS and ZRBUS as well as write data bus line WBS0 are arranged commonly to read/write circuits 501–504. Although read/write circuits 501–504 receive different bit select signals, they have the same structure, and only read/write circuit 501 is specifically shown in FIG. 6.

Read/write circuit 501 includes a read amplifier 505, which is activated in response to preamplifier enable signal PAE and bit select signal ZZ0 to amplify differentially the signal potentials on internal I/O lines I/O0a and ZI/O0a for outputting complementary data signals ZRD and RD, NAND gates 506 and 507 forming a flip-flop latching the output signal of read amplifier 505, an NAND gate 508 receiving read latch instruction signal ZRDL as well as data signals RD and ZRD sent from read amplifier 505, an NAND gate 509 transmitting the output signal of NAND gate 506 in accordance with the output signal of NAND gate 508, an NAND gate 510 which is enabled in accordance with operation mode designating signal FP to pass the output signal of NAND gate 507 in accordance with the output signal of NAND gate 508, an NOR gate 538 receiving the output signal of NAND gate 509 and bit select signal ZZ0, an NOR gate 539 receiving the output signal of NAND gate 510 and bit select signal ZZO, an NOR gate 554 receiving a multibit test mode instruction signal MBT and a bit select signal ZZO, an NAND gate 511 receiving the output signals of NAND gate 509 and NOR gate 554, an NAND gate 512 receiving the output signals of NAND gate 510 and NOR gate 554, a p-channel MOS transistor 549 which is turned on to charge the read data bus line ZRBUS0 to the power supply potential Vcc level when the output signal of NAND gate 511 is at the low level, an n-channel MOS transistor 540 which is turned on to discharge read data bus line ZRBUSO to the ground potential level when the output signal of NOR gate 538 is at the high level, an n-channel MOS transistor 541 which is turned on to discharge read data bus line RBUSO to the ground potential level when the output signal of NOR gate 539 is at the high level, and a p-channel MOS transistor 550 which is turned on to charge read data bus line RBUS0 to the power supply potential Vcc level when the output signal of NAND gate 512 is at the low level.

Multibit test mode instruction signal MBT attains the high level in the (parallel) test mode operation.

Read data latch instruction signal ZRDL, which will be described later in more detail, is fixed at the low level in the pipeline burst mode operation, and is set to and maintained at the high level for a predetermined time period in response to change of the column address signal in the fast page mode operation. Thus, in the pipeline burst mode, the output signal from NAND gate 508 is fixed at the high level, and NAND gate 509 passes the data signal sent from NAND gate 506 forming the latch (in the pipeline burst mode, signal FP is set to the low level). In the fast page mode, read data latch instruction signal ZRDL is set to the high level when reading data. In this case, NAND gate 508 applies a signal for allowing passing of the data signal to NAND gates 509 and 510 when one of data signals RD and ZRD sent from read amplifier 505 attains the low level.

At this time, operation mode designating signal FP is at the high level in the fast page mode, and NAND gate 510 passes the data signal amplified by read amplifier 505. Thus, NAND gate 510 corresponds to inhibiting gate IHGT shown in FIG. 5. Owing to provision of NAND gate 508, latch and transfer of the read data can be performed surely.

Bit select signal ZZ0 is set to the low level when selected. In the normal operation mode, multibit test mode instruction signal MBT is at the low level. When selected, therefore, NOR gate 554 generates the output signal at the high level, and NAND gates 511 and 512 function as inverters. Similarly, NOR gates 538 and 539 function as inverters when bit select signal ZZ0 is at the low level. When operation mode designating signal FP is at the high level indicating the fast page mode, MOS transistors 540, 541, 549 and 550 are turned on or off in accordance with the output signal of NAND gates 509 and 510. In this state, complementary data are read onto read data bus lines RBUS0 and ZRBUS0.

In the pipeline burst mode, signal FP is at the low level, and the output signal of NAND gate 510 is fixed at the high level. The output signal of NOR gate 539 is fixed at the low level. NAND gate 512 functions as an inverter. In this case, MOS transistor 541 maintains the off state, so that only such an operation is performed that read data bus line RBUSO is charged through MOS transistor 550, when the output signal of NAND gate 512 attains the low level in accordance with bit select signal ZZ0, and thus read data bus line RBUSO always maintains the high level. Read data bus line ZRBUS0 is charged or discharged by MOS transistors 540 and 549 in accordance with the read memory cell data. In the pipeline burst mode, therefore, data is transferred to I/O buffer circuit only with one read data bus line ZRBUS.

The read operation will be briefly described below and will be described later in detail together with whole operation with reference to waveform diagrams.

In the following description, it is assumed that data at the high level is transmitted onto internal I/O line I/O0a, and data at the low level is transmitted onto internal data I/O line ZI/O0a. Read amplifier 505 is activated to perform differential amplification when both of preamplifier enable signal PAE and bit select signal ZZ0 are activated. In this case, output signal ZRD of read amplifier 505, of which structure will be described later in detail, is set to the low level, and output signal RD is set to the high level. The output signal of NAND gate 506 attains the high level, and the output signal of NAND gate 507 attains the low level. NAND gates 506 and 507 form a latch circuit, and operates to invert and latch the data signal sent from read amplifier 505.

When the output signals of read amplifier 505 change to the high and low levels, respectively, the output signal of NAND gate 508 rises to the high level, and NAND gates 509 and 510 function as inverters (when signal FP is at the high level). Here, read amplifier 505 charges both output signals RD and ZRD to the high level when it is inactive. NAND gates 506 and 507, therefore, still latches the data signal applied in the last cycle, when the read amplifier 505 is inactive. The output signals of NAND gates 509 and 510 attain the low and high levels, respectively. When bit select signal ZZO is at the low level indicating the selected state, the output signal of NOR gate 538 attains the high level and the output signal of NOR gate 539 attains the low level, so that MOS transistor 540 is turned on, and MOS transistor 541 is turned off. On the other hand, the output signal of NAND gate 511 attains the high level, and the output signal of NAND gate 512 attains the low level, so that MOS transistor 549 is turned off, and MOS transistor 550 is turned on.

Thereby, read data bus line ZRBUS0 is discharged through MOS transistor 540, and read data bus line RBUS0 is charged through MOS transistor 550. Thereby, data of the same logic as the memory cell data appearing on internal data I/O lines I/Oa and ZI/O0a are transmitted onto read data bus lines RBUS0 and ZRBUS0, respectively. In the pipeline burst mode, such an operation is merely performed that the data signal is transmitted onto read data bus line ZRBUS0. The above read operation is executed in accordance with bit select signals ZZ1–ZZ3 in read/write circuits 502–504, respectively.

Read/write circuit 501 further includes a write circuit for writing data into selected memory cells. This write circuit includes an inverter 528 inverting bit select signal ZZ0, an NAND gate 515 receiving write driver enable signal WDE and the output signal of inverter 528, an inverter 527 inverting the signal potential on write data bus line WBUS0, an inverter 529 inverting the output signal of NAND gate 515, a NAND gate 513 receiving the output signals of inverters 527 and 529, and an NAND gate 514 receiving the signal potential on write data bus line WBUS0 and the output signal of inverter 529. Write driver enable signal WDE is a write instruction signal generated at predetermined timings during data writing, as will be described later in detail.

The write circuit further includes an inverter 525 inverting the output signal of NAND gate 513, an inverter 526 inverting the output signal of NAND gate 514, a p-channel MOS transistor 551 which charges internal data I/O line ZI/Oa to the power supply potential Vcc level when the output signal of NAND gate 513 is at the low level, a p-channel MOS transistor 552 which charges internal data I/O line I/Oa to the operation power supply potential Vcc level when the output signal of NAND gate 514 is at the low level, an n-channel MOS transistor 544 which discharges internal data I/O line ZI/O0a to the ground potential level when the output signal of inverter 526 is at the high level, an n-channel MOS transistor 545 which discharges internal data I/O line I/OOa to the ground potential level when the output signal of inverter 525 is at the high level, n-channel MOS transistors 542 and 543 which are turned on to transmit precharge potential Vcc-Vth (Vth: threshold voltage) to internal data I/O lines ZI/O0a and I/O0a when I/O line equalize instruction signal IOEQ is at the high level, and a p-channel MOS transistor 533 which is turned on in response to I/O line equalize instruction signal IOEQ received via inverter 524, to electrically short-circuit internal data I/O lines I/O0a and ZI/O0a. Then, operation of the write circuit will be described below.

When bit select signal ZZ0 is at the high level indicating the nonselected state, or write driver enable signal WDE is at the low level of the inactive state, the output signal of inverter 529 is at the low level, and the output signals of NAND gates 513 and 514 are at the high level. In this state, all MOS transistors 551, 552, 544 and 545 are off, and I/O line precharge signal IOEQ is set to the active state of the high level at a predetermined timing, as will be described later in detail, so that internal data I/O lines I/O0a and ZI/O0a are precharged to the high level of Vcc-Vth. When the bit select signal ZZ0 attains the low level, the output signal of inverter 528 attains the high level, and then write driver enable signal WDE is set to the active state of the high level, whereby the output signal of inverter 529 attains the high level, and NAND gates 513 and 514 function as inverters. The signal potential on write data bus line WBUS0 is inverted by inverter 527 and is applied to NAND gate 513. Therefore, NAND gates 513 and 514 output complementary output signals. When the output signal of NAND gate 513 is at the high level, the output signal of NAND gate 514 is at the low level. Therefore, MOS transistors 544 and 552 are turned on, so that data at the high level is transmitted onto internal data I/O line I/O0a, and data at the low level is transmitted onto data I/O line ZI/O0a. Therefore, data is written into the selected memory cell.

Provision of write data bus line WBUSO independent from read data bus lines RBUSO and ZRBUSO can provide the following advantage. When writing data, full swing of the potential between the power supply potential level and the ground potential level occurs at write data bus line WBUS0. When the operation mode is to be switched from the data write operation to the data read operation, read data bus lines RBUS0 and ZRBUS0 change their potentials from the precharged potential. Read data bus lines RBUS0 and ZRBUS0 are driven by MOS transistors 540, 541, 549 and 550. Therefore, signal amplitudes of read data bus lines RBUS0 and ZRBUS0 are small. When data reading is to be performed subsequently to data writing in the structure using common bus lines, a long time is required for restoring the signal potentials of the bus lines to the initial precharged potentials during transition from the data writing to the data reading, and thus data can not be read fast. Therefore, owing to independent provision of the data write bus lines and data read bus lines, the above problem of a so-called "write recovery" is overcome, and fast access is accomplished.

Figure 7:
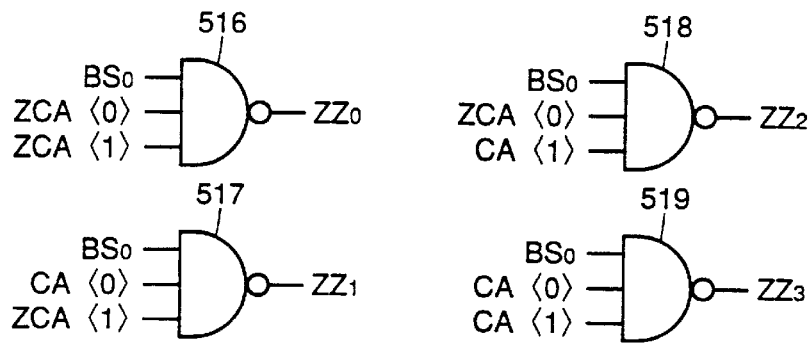
FIG. 7 shows a structure of a circuit portion generating a bit select signal shown in FIG. 6.

FIG. 7 shows a structure for generating bit select signals ZZ0–ZZ3 shown in FIG. 6. Bit select signals ZZ0–ZZ3 are generated in accordance with block select signal BS0 and address signal CA<1:0> of 2 bits. Bit select signal ZZ0 is generated from NAND gate 516 receiving block select signal BS0 as well as column address bits ZCA<0> and ZCA<1>. Bit select signal ZZ1 is generated from NAND gate 517 receiving block select signal BS0 as well as column address bits CA<0> and ZCA<l>. Bit select signal ZZ2 is generated from NAND gate 518 receiving block select signal BS0 as well as column address bits ZCA<0> and CA<1>. Bit select signal ZZ3 is generated from NAND gate 519 receiving block select signal BS0 as well as column address bits CA<0> and CA<1>. When column address bits (CA<O>, CA<l>) are (0, 0), (1, 0), (0, 1) and (1, 1), bit select signals ZZ0, ZZ1, ZZ2 and ZZ3 are set to the selected state, respectively (provided that block select signal BS0 is at the high level (1) indicating the selected state).

Figure 8:
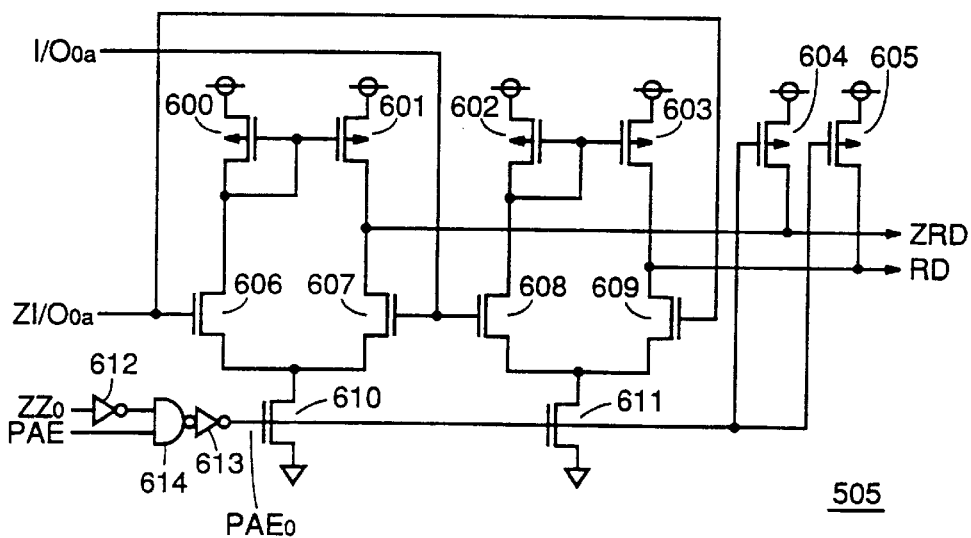
FIG. 8 specifically shows a structure of a read amplifier shown in FIG. 6.

FIG. 8 specifically shows a structure of a read amplifier 505 shown in FIG. 6. In FIG. 8, read amplifier 505 includes p-channel MOS transistors 600 and 601 forming a current supply stage formed of a current mirror circuit, n-channel MOS transistors 606 and 607 forming a comparing stage which is supplied with a current from the current supply stage and compares the potentials on internal data I/O lines ZI/Oa and I/Oa, and an n-channel MOS transistor 610 forming a current path from MOS transistors 606 and 607 to the ground node. P-channel MOS transistor 600 has a gate and a drain connected together, and supplies a current to MOS transistor 606. MOS transistor 601 functions as a slave stage of the current mirror circuit, and supplies a current to MOS transistor 607.

Read amplifier 505 further includes p-channel MOS transistors 602 and 603 forming a current supply stage formed of a current mirror circuit, n-channel MOS transistors 608 and 609 forming a comparing stage which is supplied with a current from this current supply stage and compares the potentials on internal data I/O lines I/Oa and ZI/Oa, and an n-channel MOS transistor 611 forming a current path to the ground node. P-channel MOS transistor 602 has a gate and a drain connected together, and supplies a current to MOS transistor 608. MOS transistor 603 supplies a current to MOS transistor 609. Amplifier 505 further includes p-channel MOS transistors 604 and 605 for precharging output nodes ZRD and RD to power supply potential Vcc level in response to an output signal of inverter 613.

MOS transistors 610 and 611 are turned on when preamplifier enable signal PAE is at the high level. MOS transistors 604 and 605 are turned on when preamplifier enable signal PAE is at the low level.

The preamplifier enable signal PAEO is generated from a control signal generating portion, which includes an inverter 612 receiving bit line select signal ZZO, an NAND gate 614 receiving the output signal of inverter 612 and preamplifier enable signal PAE, and inverter 613 receiving the output signal of NAND gate 614. When bit select signal ZZ0 is at the low level and preamplifier enable signal PAE is at the high level, preamplifier enable signal PAE0 attains the high level, and MOS transistors 610 and 611 are turned on, so that read amplifier 505 is activated.

When the signal potential on I/O line I/O0a is higher than that on I/O line ZI/O0a, the conductance of MOS transistor 607 is larger than that of MOS transistor 606, and node ZRD is discharged via MOS transistor 607 and current source transistor 610 to attain the low level. Meanwhile, output node RD is charged with a current supplied from MOS transistor 603 and its potential rises to the precharged high level, because the conductance of MOS transistor 609 is smaller than that of MOS transistor 608. When preamplifier enable signal PAE0 is at the low level, current paths from MOS transistors 606–609 to the ground node are not formed, so that comparison is not performed. Thus, read amplifier 505 is inactive. In this state, output nodes RD and ZRD are charged to the power supply potential Vcc level by MOS transistors 604 and 605.

As can be seen from the structure of read amplifier shown in FIG. 8, only the read amplifier receiving bit select signal ZZ being active is activated. Therefore, only the read amplifier performing data reading is activated, and simultaneous operation of the four read amplifiers is prevented, so that the consumed current in these read amplifiers can be dispersed, and thus the peak current can be reduced.

[I/O Buffer Circuit]

Figure 9:
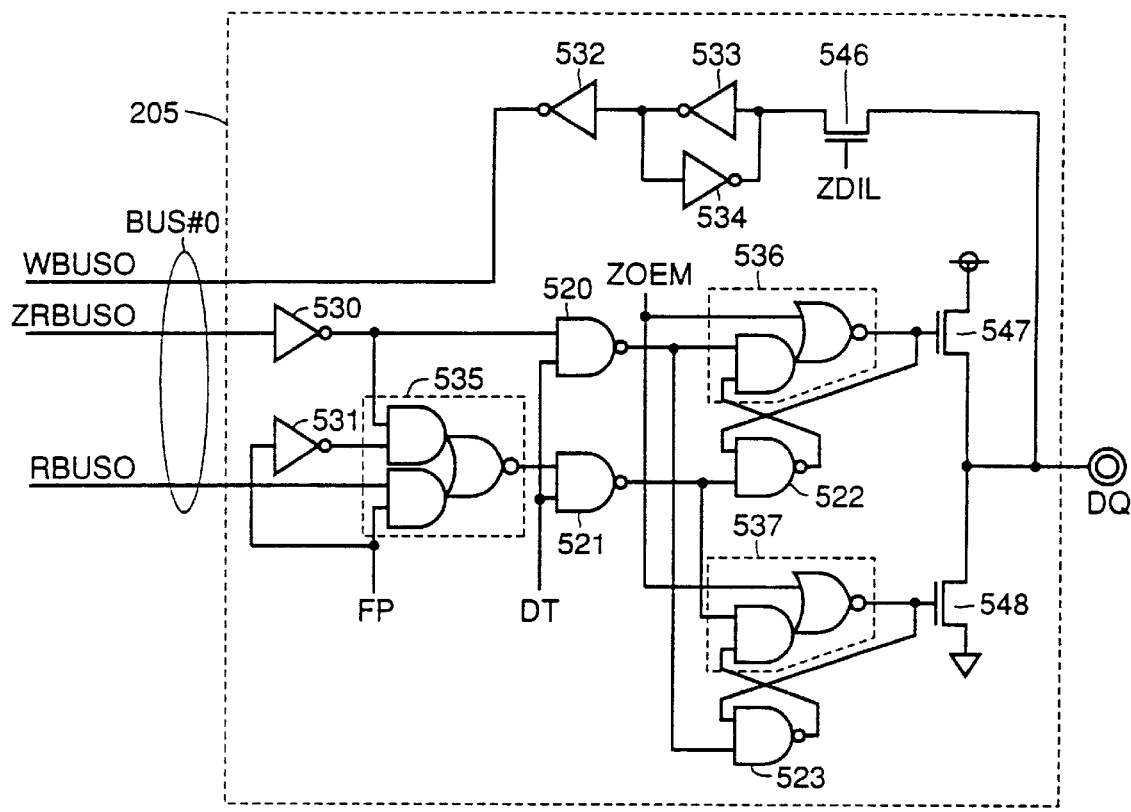
FIG. 9 shows a specific structure of an I/O buffer circuit shown in FIG. 1.

FIG. 9 shows a specific structure of the I/O buffer circuit 205 shown in FIG. 1. In FIG. 9, I/O buffer circuit 205 includes an input buffer circuit for writing data and an output buffer circuit for outputting read data. Input buffer circuit includes an n-channel MOS transistor 546 which passes data applied to data I/O terminal DQ in response to input data latch instruction signal ZDIL, inverters 533 and 534 which latch data sent from MOS transistor 546, and an inverter 532 which inverts the output signal of inverter 533 for transmission to write data bus line WBUS0. The output and input of inverter 533 are connected to the input and output of inverter 534, respectively. A driving capability for inverter 533 is larger than that of inverter 534. Input data latch instruction signal ZDIL is an inverted signal of write driver enable signal WDE.

Before activation of the write circuit shown in FIG. 6, MOS transistor 546 is turned on, and inverters 533 and 532 latch the input data. When the write circuit shown in FIG. 6 is activated in response to write driver enable signal WDE, signal ZDIL is set to the low level of the inactive state. In this state, data latched by inverters 533 and 534 are amplified by the write circuit shown in FIG. 6, and are written into the selected memory cell. Signal ZDIL prevents change of the latch data of the latch circuit formed of inverters 533 and 534 when the write driver is active.

The output buffer circuit includes an inverter 530 inverting the potential of read data bus line ZRBUS0, an inverter 531 inverting operation mode designating signal FP, and a composite logic gate 535 receiving the output signals of inverters 530 and 531, the signal on read data bus line RBUS0 and operation mode designating signal FP. Composite logic gate 535 is equivalent to a structure which includes an AND gate receiving the output signals of inverters 530 and 531, an AND gate receiving the signal on read data bus line WBUS0 and operation mode designating signal FP, and an NOR gate receiving the output signals of these two AND gates.

The output buffer circuit further includes an NAND gate 520 receiving the output signal of inverter 530 and data transmission instruction signal DT, an NAND gate 521 receiving the output signal of composite logic gate 535 and data transfer instruction signal DT, a composite logic gate 536 receiving an output buffer activating signal ZOEM and the output signal of NAND gate 520, and an NAND gate 522 receiving the output signals of NAND gate 521 and composite logic gate 536. Composite logic gate 536 is equivalent to a structure which includes an AND gate receiving the output signals of NAND gates 522 and 520, and a NOR gate receiving the output signal of this AND gate and output buffer activating signal ZOEM.

The output buffer circuit further includes a composite logic gate 537 receiving output buffer activating signal ZOEM as well as the output signals of NAND gates 521 and 523. NAND gate 523 receives the output signal of NAND gate 520 and the output signal of composite logic gate 537. The output signal of composite logic gate 536 is applied to a gate of an n-channel MOS transistor 547 for charging data I/O terminal DQ to the power supply potential level. The output signal of composite logic gate 537 is applied to a gate of an n-channel MOS transistor 548 for discharging data I/O terminal DQ to the ground potential level. When output buffer activating signal ZOEM, which is an inverted signal of output buffer activating signal OEM, is at the high level, the output signals of composite logic gates 536 and 537 are at the low level. On the other hand, when output buffer activating signal ZOEM is at the low level, composite logic gates 536 and 537 each operate as an NAND gate. Now, operation of this output buffer circuit will be described below.

When operation mode designating signal FP is at the low level and thus designates the pipeline burst mode operation, composite logic gate 535 inhibits passage of the signal potential on read data bus line RBUS0, and inverts and passes the output signal of inverter 530, which is an inverted signal of the signal potential on read data bus line ZRBUS0. In this state, therefore, the output buffer circuit produces the read data in accordance with the signal potential on read data bus line ZRBUS0 and transmits the same to data I/O terminal DQ. When operation mode designating signal FP is at the high level and thus designates the fast page mode, the composite logic gate 535 inhibits pass of the signal potential on read data bus line ZRBUS0, and passes the signal potential on read data bus line RBUS0 after inverting the same. In this state, therefore, read data is produced and output in accordance with the signal potentials on two read data bus lines RBUS0 and ZRBUS0.

When data transfer instruction signal DT is at the low level, the output signals of NAND gates 520 and 521 are at the high level, and composite logic gates 536 and 537 maintain the last state. When data transfer instruction signal DT is set to the high level, NAND gates 520 and 521 function as inverters. If output buffer enable signal ZOEM maintains the high level until this point of time, the output signals of composite logic gates 536 and 537 do not change their state. When output buffer activating signal ZOEM is set to the low level, composite logic gates 536 and 537 function as NAND gates. In this state, the output signals of composite logic gates 536 and 537 change their states in accordance with the states of the output signals of NAND gates 520 and 521, respectively. If the output signal of NAND gate 520 is at the low level, and the output signal of NAND gate 521 is at the low level, the output signal of composite logic gate 536 is at the low level and the output signal of composite logic gate 537 is at the high level, so that data I/O terminal DQ is discharged through MOS transistor 548, and data at the low level is output.

Output buffer activating signal ZOEM, which will be described later in detail, is deactivated in response to deactivation of column address strobe signal ZCAS in the fast page mode. In the pipeline burst mode, when output buffer activating signal ZOEM is once activated, it will maintain the active state until both signals ZRAS and ZCAS are deactivated. When output buffer activating signals ZOEM is inactive, both MOS transistors 547 and 548 are turned off, and the output buffer circuit is set to the output high impedance state.

As shown in FIG. 9, there is provided composite logic gate 535 which is responsive to operation mode designating signal FP, and composite logic gate 535 determines allowance and inhibition of transmission of the signal on read data bus line RBUS0 in accordance with the operation mode, whereby the number of read data bus lines to be used can be changed in accordance with th e operation mode, and fast reading and operation with a low current consumption can be accomplished in accordance with the operation modes.

[Column Address Buffer]

Figure 10:
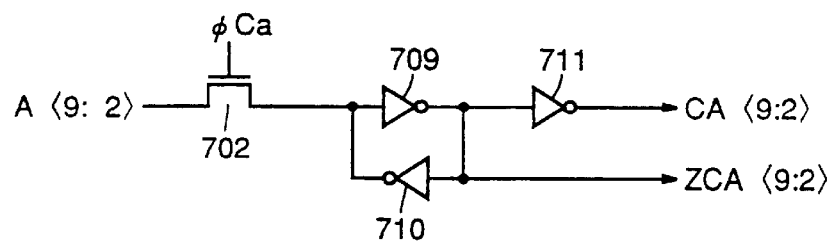
FIG. 10 shows a structure of a column address buffer.

FIG. 10 shows a structure and an operation of a column address buffer for most significant column address bits. Column address buffers of the same structure as that shown in FIG. 10 are provided for respective column address bits CA<9:2>. In the DRAM, the row and column addresses are applied through the same pin terminals time-division multiplexedly. In FIG. 10, an externally applied address signals are represented as A<9:2>. For the row address, address signals A<11:0> are used.

In FIG. 10, the column address buffer includes a transfer gate 702 formed of an n-channel MOS transistor which passes address bits A<9:2> in response to control signal φca, inverters 709 and 710 which latch address bits transmitted from transfer gate 702, and an inverter 711 which inverts the output signal of inverter 709. The input and output of inverter 709 are connected to the output and input of inverter 710, respectively. Inverter 711 outputs internal column address bits CA<9:2>, and inverter 709 outputs internal column address bits ZCA<9:2>. Then, operation will be described below with reference to operation waveform diagrams of FIGS. 11A and 11B.

Control signal φca is generated from a generating circuit, of which structure will be described later in detail, in various forms depending on the modes to be designated. When it is necessary to take in new external column address bits A<9:2>, the signal φca is maintained at the high level of the active state for a predetermined period in accordance with column address strobe signal ZCAS.

More specifically, when operation mode designating signal FP is at the high level designating the fast page mode as shown in FIG. 11A, control signal φca is set to and maintained for a predetermined period at the high level in response to rising of column address strobe signal ZCAS, if row address strobe signal ZRAS is at the low level. Thereby, new column address bits CA<9:2> are taken in for performing selection of a new column upon each rise of column address strobe signal ZCAS.

When operation mode designating signal FP is at the low level designating the pipeline burst mode as shown in FIG. 11B, externally applied column address bits A<9:2> are taken in at every fourth CAS cycle. More specifically, when column address strobe signal ZCAS is first set to the active state of the low level after row address strobe signal ZRAS is set to the low level, control signal φca is activated and will maintain the active state for a predetermined period. In accordance with column address bits CA<9:2> which are first taken in, the memory cells at four addresses are simul- taneously selected. A first memory cell is selected in accordance with the column address signal A<9:2> which is first taken in. Addresses of the other memory cells of 3 bits are automatically and internally generated by a counter. Since this counter uses column address bits CA<1:0>, control signal φca will maintain the low level for a period during which column address strobe signal ZCAS subsequently rises three times, and taking of an external column address signal is inhibited for this period. When reading of data of the four memory cells is completed, control signals φca is set to the high level for a predetermined period in accordance with falling of next column address strobe signal ZCAS, so that a new column address signal is taken in.

FIG. 12 shows a structure of a portion of the address buffer for column address signal CA<1:0> of least significant two bits. In FIG. 12, since the same structure is used for both column address bits CA<0> and CA<l>, these two bits of the column address are represented as CA<1:0>, and only one circuit portion is shown.

In FIG. 12, the column address buffer includes an n-channel MOS transistor 700 which is responsive to control signal φca to pass externally applied column address bits A<1:0>, an n-channel MOS transistor 701 which passes internally generated column address B<1:0> of 2 bits, inverters 706 and 707 which latch column address bits sent through MOS transistors 700 and 701, respectively, an inverter 708 which inverts the column address bits output from inverter 706, a latch circuit LATCH which is responsive to column address strobe signal ZCAS to latch complementary column address bits sent from inverters 706 and 708, and a counter CCNTR which receives column address bits ZAL<1:0> and AL<l:0> sent from inverters 706 and 708, and performs a counting operation in response to column address strobe signal ZCAS for producing column address bits B<1:0>.

As already discussed with reference to FIGS. 11A and 11B, control signal φca is activated to attain the high level in response to falling of column address strobe signal ZCAS in the fast page mode. In the pipeline burst mode, control signal φca is activated at every fourth cycle of column address strobe signal ZCAS. A control signal φcc is activated to attain the high level in response to rising (activation) of column address strobe signal ZCAS during the remaining three cycles in the pipeline burst mode. Control signal φcc is always inactive and at the low level in the fast page mode.

Latch circuit LATCH includes a composite logic gate 740 receiving operation mode designating signal FP, column address strobe signal ZCAS and the output signal of inverter 708, a composite logic gate 741 receiving operation mode designating signal FP, column address strobe signal ZCAS and the output signal of inverter 706, and NAND gates 738 and 739 forming a latch circuit latching the outputs of inverters 740 and 741. NAND gate 738 receives the output signals of composite logic gate 740 and NAND gate 739, and outputs column address bits CA<1:0>. NAND gate 739 receives the output signals of NAND gate 738 and composite logic gate 741, and outputs column address bits ZCA<1:0>.

Composite logic gate 740 is equivalent to a structure including an OR gate receiving operation mode designating signal FP and column address strobe signal ZCAS, and an NAND gate receiving the output signals of this OR gate and inverter 708. Composite logic gate 741 is equivalent to a structure including an OR gate receiving operation mode designating signal FP and column address strobe signal ZCAS, and an NAND gate receiving the output signals of this OR gate and inverter 706.

Counter CCNTR outputs internal column address bits B<1:0> by performing a counting operation in a predetermined sequence in accordance with column address strobe signal ZCAS, it uses column address bits AL<1:0> and ZAL<1:0> applied at the first cycle of column address strobe signal ZCAS as an initial value of the count. Now, operation of the column address buffer shown in FIG. 12 will be described below.

In the fast page mode operation, operation mode designating signal FP is set to the high level. In this state, composite logic gates 740 and 741 invert and transmit the signals sent from inverters 708 and 706, respectively regardless of the state of column address strobe signal ZCAS. The output signals of composite logic gates 740 and 741 are latched by the latch formed of NAND gates 738 and 739. In the fast page mode, therefore, control signal φca is activated in response to falling of column address strobe signal ZCAS, as shown in FIG. 11(A), and the currently applied address bits A<1:0> are taken in and latched for producing internal column address bits CA<1:0> and ZCA<1:0>. Since control signal φcc is always inactive in the fast page mode, internal column address B<1:0> generated from counter CCNTR is ignored. In the fast page mode, therefore, the column is selected in accordance with the externally applied column address.

Figure 13:
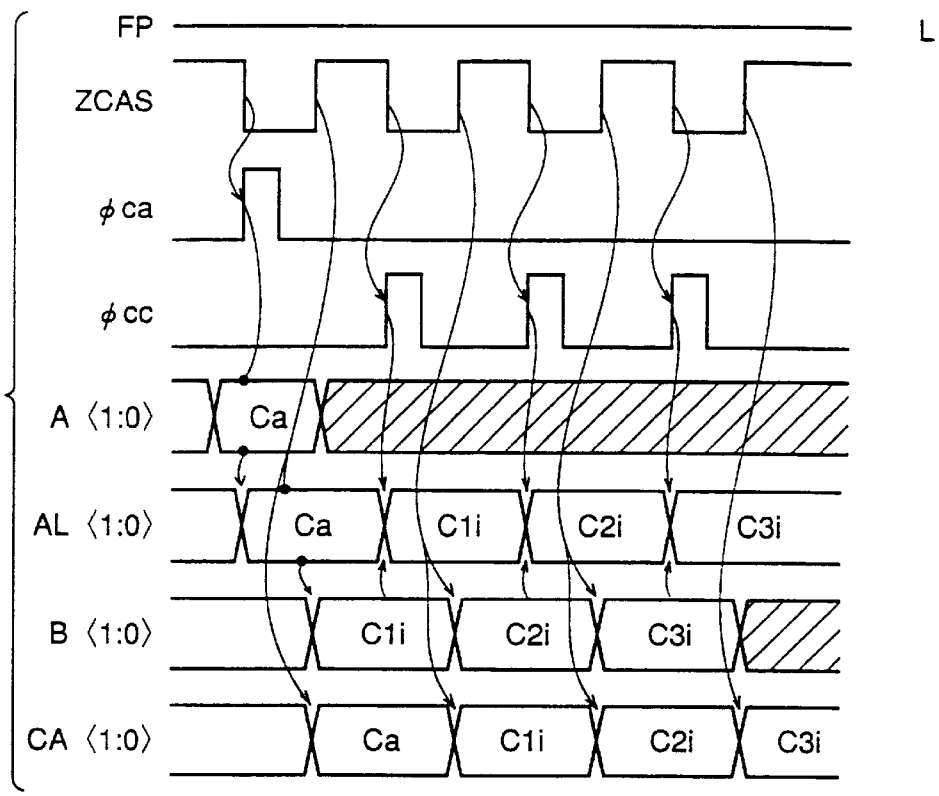
FIG. 13 is a signal waveform diagram representing an operation of the column address buffer shown in FIG. 12.

Referring to a signal waveform diagram of FIG. 13, operation in the pipeline burst mode will be described below. In the pipeline burst mode, operation mode designating signal FP is set to the low level. In this state, composite logic gates 740 and 741 transmit column address bits sent from inverters 708 and 706 to NAND gates 738 and 739, when column address strobe signal ZCAS is at the high level. More specifically, when column address strobe signal ZCAS first falls to the low level, control signal φca attains the high level for a predetermined time period, and externally applied column address bits A<1:0> are latched by the latch formed of inverters 706 and 707. Thereby, initial values of column address bits AL<1:0> and ZAL<1:0> applied to counter CCNTR are decided. When column address strobe signal ZCAS is at the low level, the output signals of composite logic gates 740 and 741 are at the high level, and the output data of latch circuit LATCH does not change.

When column address strobe signal ZCAS rises to the high level, composite logic gates 740 and 741 pass the address bits received from inverters 708 and 706. Thereby, column address bits CA<1:0> and ZCA<1:0> sent from NAND gates 738 and 739 attain the states corresponding to those of externally applied column address bits A<1:0> (shown as column address bit Ca in FIG. 13). Counter CCNTR performs a counting operation in response to rising of column address strobe signal ZCAS, and produces internal column address bits B<1:0> from currently applied column address bits AL<1:0> and ZAl<1:0>.

At the second falling of column address strobe signal ZCAS to the low level, control signal φcc is activated to attain the high level, so that internally generated column address bits B<1:0> are transmitted to the latch formed of inverters 706 and 707 via MOS transistor 701 to be latched therein. This new internal column address bits (C1i) are sent to counter CCNTR again. When column address strobe signal ZCAS rises to the high level, latch circuit LATCH attains a through state, and it outputs and latches the new internal column address bits C1i as internal column address bits CA<1:0>. Upon each subsequent falling of column address strobe signal ZCAS, control signal φcc is activated, and counter CCNTR performs a counting operation and generates internal column address bits C2 and C3.

As a result of a series of operations described above, memory cells of 4 bits (per data I/O terminal) are selected in such a manner that a memory cell is first selected in accordance with column address bits Ca which are externally applied, and remaining memory cells of 3 bits are selected in accordance with internally produced column address bits C1i–C3i. By designating the column address only one time, the memory cells at 4 addresses can be successively selected.

Figure 14:
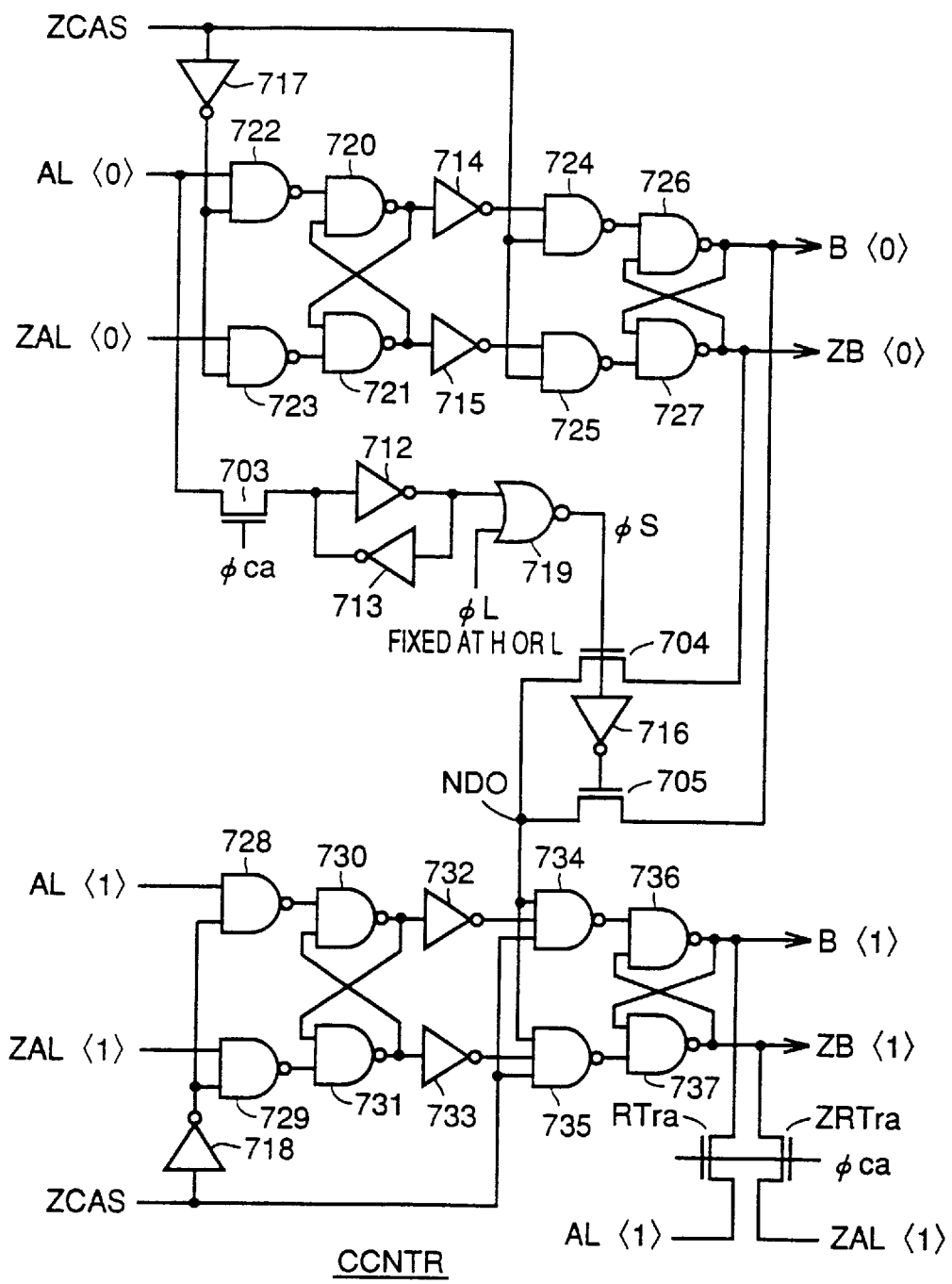
FIG. 14 specifically shows a structure of a counter shown in FIG. 12.

FIG. 14 shows an example of a specific structure of counter CCNTR shown in FIG. 12. In FIG. 14, the portion for generating lower column address bits B<0> and ZB<0> includes an inverter 717 receiving column address strobe signal ZCAS, NAND gate 722 receiving the output signal of inverter 717 and internal column address bit AL<0>, NAND gate 723 receiving the output signal of inverter 717 and internal column address bit ZAL<0>, and NAND gates 720 and 721 receiving the output signals of NAND gates 722 and 723, respectively. NAND gates 720 and 721 have their inputs and outputs cross-coupled to form a flip-flop.

This circuit portion further includes an inverter 714 receiving the output signal of NAND gate 720, an inverter 715 receiving the output signal of NAND gate 721, NAND gates 724 receiving column address strobe signal ZCAS and the output signal of inverter 714, an NAND gate 725 receiving column address strobe signal ZCAS and the output signal of inverter 715, and NAND gates 726 and 727 receiving the output signals of NAND gates 724 and 725, respectively. NAND gates 726 and 727 have their inputs and outputs cross-coupled together to form a flip-flop.

Counter CCNTR further includes an n-channel MOS transistor 703 which is responsive to control signal φca to pass column address bit AL<0>, inverters 712 and 713 forming a latch stage for latching an address bit sent from MOS transistor 703, an NOR gate 719 receiving a counter mode designating signal φL and the output signal of inverter 712, an n-channel MOS transistor 704 which passes address bit ZB<0> in accordance with an output signal φs of NOR gate 719, an inverter 716 receiving the signal φs, and an n-channel MOS transistor 705 which is responsive to the output signal of inverter 716 to pass the address bit B<0>. Control signal φL is fixed at the high level or low level, and determines the counting operation mode. Control signal φL is generated utilizing such a structure that a specific pad is set to a specific potential by making or not making wire bonding to this specific pad, or that a signal line transmitting control signal φL is fixed at the potential of the high level or low level by a mask interconnection.

The circuit portion for higher address bits AL<1> and ZAL<1> includes an inverter 718 receiving column address strobe signal ZCAS, an NAND gate 728 receiving the output signal of inverter 718 and column address bit AL<1>, an NAND gate 729 receiving the output signal of inverter 718 and column address bit ZAL<1>, and NAND gates 730 and 731 receiving the output signals of NAND gates 728 and 729, respectively. NAND gates 730 and 731 have their inputs and output cross-coupled to form a flip-flop.

Counter CCNTR further includes an inverter 732 receiving the output signal of NAND gate 730, an inverter 733 receiving the output signal of NAND gate 731, a 3-input NAND gate 734 which receives column address strobe signal ZCAS, a signal on a node ND0 applied from MOS transistor 704 or 705 and the output signal of inverter 732, an NAND gate 735 receiving the signal on node ND0, the output signal of inverter 733 and column address strobe signal ZCAS, and NAND gates 736 and 737 receiving the output signals of NAND gates 734 and 735, respectively. NAND gates 736 and 737 have their outputs and inputs cross-coupled to form a flip-flop. There are further provided transfer gates RTra and ZRTra for outputting column address bits AL<1> and ZAL<1> as column address bits B<1> and ZB<1> in response to control signal φca.

Figure 15:
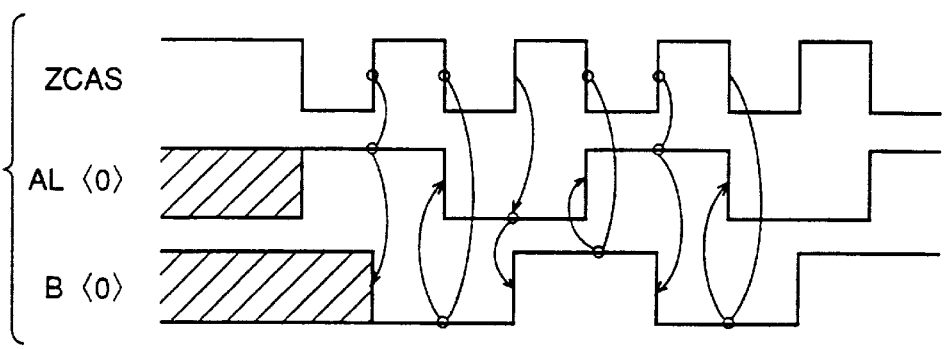
FIG. 15 is a signal waveform diagram representing an operation of the counter shown in FIG. 14.

Lower address bits AL<0> and B<0> will now be described below with reference to FIG. 15. When column address strobe signal ZCAS is at the high level, the output signal of inverter 717 is at the low level, and the output signals of NAND gates 722 and 723 are at the high level. In this state, address bits AL<0> and ZAL<0> are not internally taken in. NAND gates 724 and 725 invert and pass the signal potentials applied from inverters 714 and 715. Therefore, column address bits B<0> and ZB<0> maintain the state in the last cycle (the cycle of column address strobe signal).

When column address strobe signal ZCAS attains the low level, the output signal of inverter 717 attains the high level, NAND gates 722 and 723 function as inverters, and address bits AL<0> and ZAL<0> are latched by the flip-flop formed of NAND gates 720 and 721. Address bits AL<0> and ZAL<0> applied in the first cycle correspond to the externally applied column address bits. When column address strobe signal ZCAS is at the low level, NAND gates 724 and 725 output the signals at the high level regardless of logics of the output signals of inverters 714 and 715. Even in this state, therefore, column address bits B<0> and ZB<0> do not change their states.

When column address strobe signal ZCAS attains the high level, the output signal of inverter 717 attains the low level, and the output signals of NAND gates 722 and 723 are fixed at the high level. On the other hand, NAND gates 724 and 725 pass the output signals of inverters 714 and 715, and the states of bits B<0> and ZB<0> latched by NAND gates 726 and 727 are decided. In this state, bit B<0> takes an inverted value of bit AL<0> which is applied in the same cycle. Bits B<0> and ZB<0> are fed back to counter CCNTR via MOS transistor 701 shown in FIG. 12. Control signal φcc is activated in response to rising of column address strobe signal ZCAS. Therefore, the state of column address bit AL<O> changes every falling of column address strobe signal ZCAS, and the logic of column address bit B<0> is inverted in response to rising of column address strobe signal ZCAS.

Similar operation is performed in connection with higher column address bits AL<1> and ZAL<1>. In this operation, control signal φs determines how to change the higher address bit AL<1>. When control signal φL is fixed at the low level, NOR gate 719 functions as an inverter. Inverters 712 and 713 latch externally applied column address bit AL<0>. Control signal φs changes its logical level in accordance with the logic of externally applied column address bit A<0>. When column address bit A<0> is "0 (low level)", control signal φs attains the low level, and bit B<0> is transmitted to node NDO via MOS transistor 705. NAND gates 728 and 729 invert and pass column address bits AL<1> and ZAL<1> when column address strobe signal ZCAS is at the low level. When column address bit B<0> is "0 (low level)" at this time, the output signals of NAND gates 734 and 735 are fixed at the high level even if column address strobe signal ZCAS is set to the high level, and thus the latch state of NAND gates 736 and 737 does not change. In this state, therefore, column address bits B<1> and ZB<1> attain logical levels corresponding to external column address bits A<1> and ZA<1> applied via transfer gates RTra and ZRTra, respectively.

When column address bit B<0> is at the high level (i.e., when it is "1"), NAND gates 734 and 735 invert and pass the output signals of inverters 732 and 733, when column address strobe signal ZCAS is set to the high level. Thereby, logics of column address bits B<1> and ZB<l> generated from NAND gates 736 and 737 are inverted. Thereafter, this operation is repeated, whereby column address bit B<1> increases one by one from the leading bit or the first applied column address bit. For example, when column address bits A<1:0> is (0, 0), internal column address bits B<1:0> change in the order of (0, 1), (1, 0) and (1, 1). This is owing to the fact that, when control signal φL is at the low level, one of column address bits B<0> and ZBL<0> is selected in accordance with the value of first applied column address bit A<0>.

When control signal φL is fixed at the high level, control signal φs is fixed at the low level. In this state, MOS transistor 705 is always on, and bit B<0> is selected regardless of the value of column address bit A<0>. In this state, internal column address bit B<1> holds the value in the last cycle when internal address bit A<0> is 0, and internal column address bit B<1> has a value equal to a logically inverted value of the value in the last cycle when bit B<0> is 1. In this case, therefore, internal column address bits are produced as shown in FIG. 16.

FIG. 17 shows a circuit structure for generating control signals φca and φcc. In FIG. 17, the control signal generating circuit includes an inverter 806 receiving column address strobe signal ZCAS, an NOR gate 832 receiving the output signal of inverter 806 and row address strobe signal ZRAS, an NAND gate 830 receiving operation mode designating signal FP and the output signal of NOR gate 832, inverters 808, 809 and 810 forming a delay circuit which delays column address strobe signal ZCAS by a predetermined time, an NOR gate 831 receiving the output signal of inverter 810, operation mode designating signal FP and row address strobe signal ZRAS, a counter YCNTR performing a counting operation upon each falling of column address strobe signal ZCAS, an NAND gate 828 receiving the output signal of NOR gate 831 as well as counts ZCY<0> and ZCY<1> sent from counter YCNTR, a composite logic gate 834 receiving the output signal of NOR gate 831 as well as counts CY<0> and CY<1> sent from counter YCNTR, NAND gate 829 receiving the output signals of NAND gates 828 and 830, and an inverter 811 receiving the output signal of composite logic gate 834. NAND gate 829 outputs control signal φca, and inverter 811 outputs control signal φcc. Composite logic gate 834 is functionally equivalent to a structure which includes an OR gate receiving counts CY<0> and CY<1> from counter YCNTR and an NAND gate receiving the output signals of OR gate and NOR gate 831. Operation of this arrangement will now be described below.

When counter YCNTR operates, its count CY<1:0> is first reset to (0, 0), as will be described later in detail.

When operation mode designating signal FP is at the high level indicating the fast page mode, the output signal of NOR gate 831 is fixed at the low level, and accordingly the output signal of NAND gate 828 is fixed at the high level. Further, the output signal of composite logic gate 834 is fixed at the high level, and control signal φcc from inverter 811 is fixed at the low level. In this state, count CY<1:0> from counter YCNTR is ignored. When operation mode designating signal FP is at the high level, NAND gate 830 functions as an inverter. Similarly, NAND gate 829 functions as an inverter. When row address strobe signal ZRAS is at the low level, the output signal of NOR gate 832 attains the high level each time column address strobe signal ZCAS rises to the high level, and control signal φca is at the high level for the same period. While column address strobe signal ZCAS is at the high level, control signal φca is at the active state of the high level.

When operation mode designating signal FP is fixed at the low level indicating the pipeline burst mode, the output signal of NAND gate 830 is fixed at the high level, and the output signal of NOR gate 832 is ignored. NAND gate 829 functions as an inverter.

As shown in FIG. 18, when column address strobe signal ZCAS first falls to the low level, the signal issued from NOR gate 831 is maintained at the high level for a delay time provided by inverters 808–810. Count CY<1:0> of counter YCNTR has been reset to (0, 0). Therefore, the output signal of NAND gate 828 is at the low level for a predetermined period, and control signal φca from NAND gate 829 attains the high level. Meanwhile, composite logic gate 834 outputs the signal at the high level, because both counts CY<0> and CY<1> are at the low level, and thus control signal φcc output from inverter 811 maintains the low level.

When column address strobe signal ZCAS rises to the high level, the counter YCNTR is incremented by one. In this state, bit CY<0> attains the high level, while bit CY<1> is at the low level. Therefore, the output signal of NAND gate 828 is fixed at the high level, and control signal φca from NAND gate 829 is fixed at the low level. Composite logic gate 834 functions as an inverter to pass the signal received from NOR gate 831. In this state, therefore, control signal φcc is activated to attain the high level in response to falling of column address strobe signal ZCAS and is maintained at the high level for a predetermined period.

During three cycles to the cycle where the count of counter YCNTR reaches the maximum value (1, 1), at least one of bits ZCY<0> and ZCY<1> is at the low level, so that the output signal of NAND gate 828 is fixed at the high level, and activation of control signal φca is inhibited. During these periods, composite logic gate 834 functions as an inverter to set control signal φcc to the high level in response to falling of column address strobe signal ZCAS and maintain the high level for a predetermined time. When the count of counter YCNTR returns to the initial value (0, 0), control signal φca is activated again. By utilizing the structure shown in FIG. 17, the structure operating in such a manner that, in the pipeline burst mode, control signal φca is active in the first ZCAS cycle, and control signal φcc is active during subsequent three cycles of signal ZCAS can be accomplished.

Figure 19:
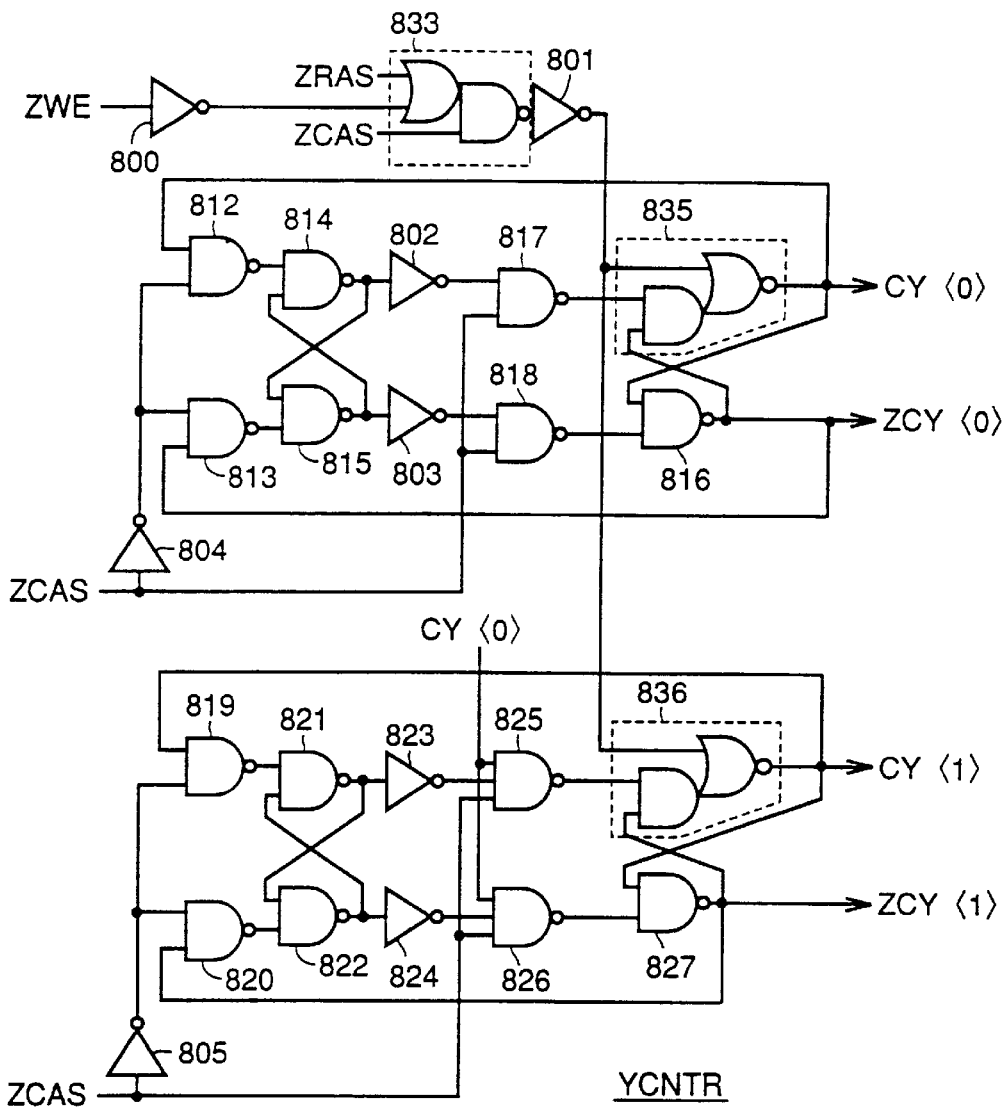
FIG. 19 specifically shows a structure of a counter shown in FIG. 17.

FIG. 19 shows a specific structure of counter YCNTR shown in FIG. 17. In FIG. 19, a lower bit portion of counter YCNTR includes an inverter 800 receiving write enable signal ZWE, a composite logic gate 833 receiving row address strobe signal ZRAS, the output signal of inverter 800 and column address strobe signal ZCAS, an inverter 801 receiving the output signal of composite logic gate 833, an inverter 804 receiving column address strobe signal ZCAS, an NAND gate 812 receiving the output signal of inverter 804 and count CY<0>, an NAND gate 813 receiving the output signal of inverter 804 and count ZCY<0>, NAND gates 814 and 815 receiving the output signals of NAND gates 812 and 813, respectively, inverters 802 and 803 receiving the output signals of NAND gates 814 and 815, respectively, NAND gates 817 and 818 receiving the output signals of inverters 802 and 803, respectively, a composite logic gate 835 receiving the output signal of NAND gate 817, and an NAND gate 816 receiving the output signal of NAND gate 818.

NAND gate 816 also receives the output signal of composite logic gate 835. Composite logic gate 835 also receives the output signals of inverter 801 and NAND gate 816. NAND gates 817 and 818 receive column address strobe signal ZCAS. NAND gates 814 and 815 have their inputs and outputs cross-coupled to form a flip-flop. Composite logic gate 835 outputs count CY<0>, and NAND gate 816 outputs count ZCY<0>.

A higher bit portion includes an inverter 805 receiving column address strobe signal ZCAS, an NAND gate 819 receiving the output signal of inverter 805 and count CY<1>, an NAND gate 820 receiving the output signal of inverter 805 and count ZCY<1>, NAND gates 821 and 822 each receiving at each respective one input the output signal of NAND gate 819 and 820 respectively, an NAND gate 823 receiving count CY<0> and the output signal of NAND gate 821, an NAND gate 824 receiving the count CY<0> and the output signal of NAND gate 822, an NAND gate 825 receiving column address strobe signal ZCAS and the output signal of NAND gate 823, an NAND gate 826 receiving the output signal of NAND gate 824 and column address strobe signal ZCAS, a composite logic gate 836 receiving the output signal of inverter 801, the output signal of NAND gate 825 and count ZCY<1>, and an NAND gate 827 receiving the output signal of NAND gate 826 and count CY<1>.

Composite logic gate 836 outputs count CY<1>, and NAND gate 827 output count ZCY<1>. NAND gates 821 and 822 form a flip-flop. Operation of the counter YCNTR will now be described below.

When row address strobe signal ZRAS and column address strobe signal ZCAS are at the high level, the output signal of composite logic gate 833 is at the low level, and the output signal of inverter 801 is at the high level. Thereby, composite logic gate 835 of AND/NOR type, which receives the signal at the high level on its NOR gate portion, operates to set counts CY<0> and ZCY<0> to the low and high levels, respectively. Similarly, composite logic gate 836 of AND/NOR type outputs the signal at the low level, and count CY<1> is reset to "0".

When column address strobe signal ZCAS is at the high level, and write enable signal ZWE is at the low level, the output signal of composite logic gate 833 of OR/NAND type is at the low level, and thus the output signal of inverter 801 is at the high level. Also in this state, both counts CY<0> and CY<1> are reset to "0". Both signals ZRAS and ZCAS are set to the high level only when the memory cycle is completed and the data output terminal is set to the high impedance state. On the other hand, counts CY<0> and CY<1> are reset to "0" when column address strobe signal ZCAS is at the high level and write enable signal ZWE is at the low level. The purpose of this is to reset the column address to the initial value in the data write operation.

When the output signal of composite logic gate 833 is at the high level, column address strobe signal ZCAS is at the low level or write enable signal ZWE is at the high level (assuming that the row address strobe signal is at the low level and active). In this state, the output signal of inverter 801 attains the low level, and composite logic gates 835 and 836 function as an NAND gate. In this state, therefore, when counts CY<0> and ZCY<0> are latched by the flip-flop formed of NAND gates 814 and 815 and column address strobe signal ZCAS attains the high level, NAND gates 817 and 818 function as an inverter, and data latched by NAND gates 814 and 815 are transmitted to and latched by composite logic gates 830 and 816. Therefore, the logics of counts CY<0> and ZCY<0> are inverted upon each rising of column address strobe signal ZCAS.

With respect to counts CY<1> and ZCY<1>, when count CY<0> is "0", the output signals of NAND gates 825 and 826 are fixed at the high level, and counts CY<1> and ZCY<1> do not change. Count CY<1> and ZCY<1> change only when count CY<1> is "1", i.e., at the high level. Therefore, the states of counts CY<1> and ZCY<1> change upon falling of count CY<0> from the high level to the low level.

Owing to the above structures, the 2-bit counter performing a counting operation in accordance with column address strobe signal ZCAS is implemented.

[Signal IOEQ Generating Circuit]

Figure 20:
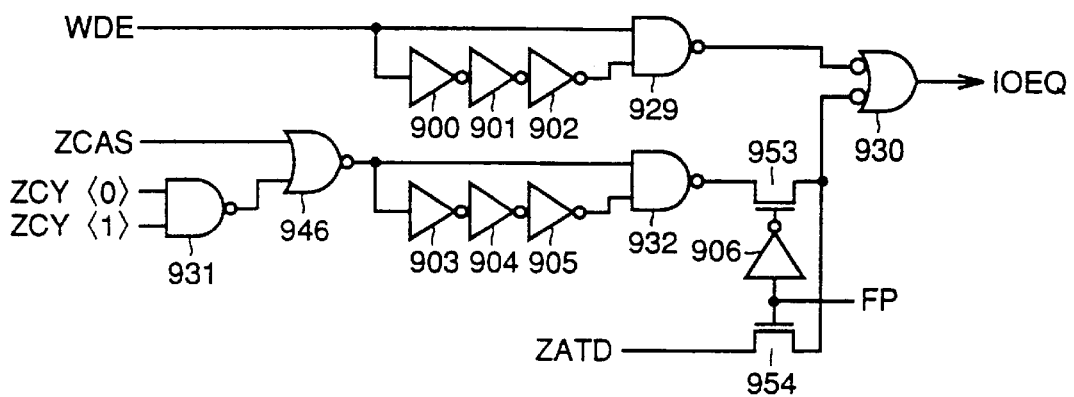
FIG. 20 shows a structure of a circuit portion for generating an I/O line equalize signal.

FIG. 20 shows a structure of a control circuit generating an I/O line equalize signal IOEQ. In FIG. 20, the circuit generating I/O line equalize signal IOEQ includes an NAND gate 931 receiving counts ZCY<0> and ZCY<1> from counter YCNTR shown in FIG. 19, an NOR gate 946 receiving the output signal of NAND gate 931 and column address strobe signal ZCAS, cascaded three inverters 903, 904 and 905 delaying the output signal of NOR gate 946 by a predetermined time and inverting the same, an NAND gate 932 receiving the output signals of inverter 905 and NOR gate 946, an n-channel MOS transistor 924 which passes a column address transition detection signal ZATD when operation mode designating signal FP is at the high level, an inverter 906 receiving operation mode designating signal FP, an n-channel MOS transistor 953 which passes the output signal of NAND gate 932 when the output signal of inverter 906 is at the high level (when signal FP is at the low level), cascaded three inverters 900, 901 and 902 which delay write driver enable signal WDE by a predetermined time and inverting the same, an NAND gate 929 which receives the output signal of inverter 902 and write driver enable signal WDE, and NAND gate 930 which receives the output signal of NAND gate 929 and the output signal of MOS transistor 953 or 954.

Inverters 900, 901 and 902 and NAND gate 929 form a one-shot pulse generating circuit generating a pulse which is maintained at the low level for a predetermined time width (equal to a delay time determined by the three inverters) in response to rising of the applied signal. Inverters 903, 904 and 905 and NAND gate 932 similarly form a one-shot pulse generating circuit generating a pulse of one shot in response to rising of the output signal of NOR gate 946. Then, operation of the circuit shown in FIG. 20 will be described below with reference to operation waveform diagrams of FIGS. 21 and 22.

Figure 21:
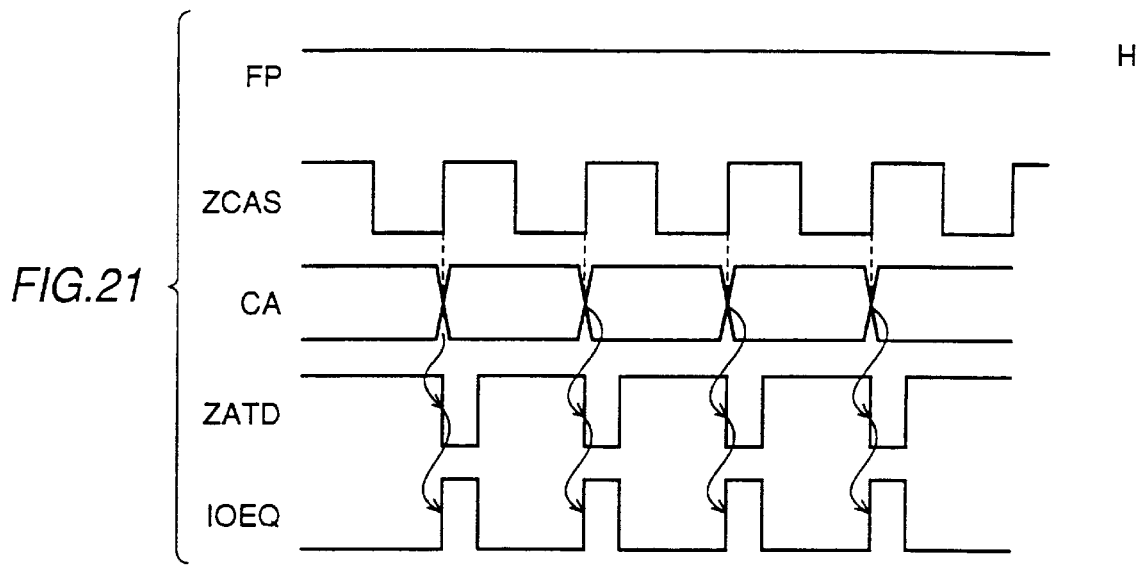
FIG. 21 is a signal waveform diagram representing an operation of a control circuit shown in FIG. 20.

When operation mode designating signal FP is set to the high level as shown in FIG. 21, n-channel MOS transistor 954 is turned on, and column address transition detecting signal ZATD is applied to one input of NAND gates 930. Write driver enable signal WDE is set to the high level of the active state for a predetermined period in response to activation of signals ZCAS and ZWE, as will be described later in detail. In the data read operation, signal WDE maintains the low level, and the output signal of NAND gate 929 maintains the high level. In this case, internal column address signal CA changes when column address strobe signal ZCAS rises to the high level, and column address transition detecting signal ZATD is maintained at the low level for a predetermined period as shown in FIG. 21. Thereby, I/O line equalize signal IOEQ from NAND gate 930 is set to the high level, and the I/O lines (internal I/O line: see FIG. 6) are precharged to a level of predetermined potential (Vcc−Vth).

When operation mode designating signal FP is at the high level, operation in the fast page mode is executed. In this state, the memory cell is selected according to the external column address. It is impossible in advance in the semiconductor memory device to determine the column containing the memory cell to be selected. Therefore, the I/O lines are equalized/precharged at each cycle in accordance with column address strobe signal ZCAS.

Figure 22:
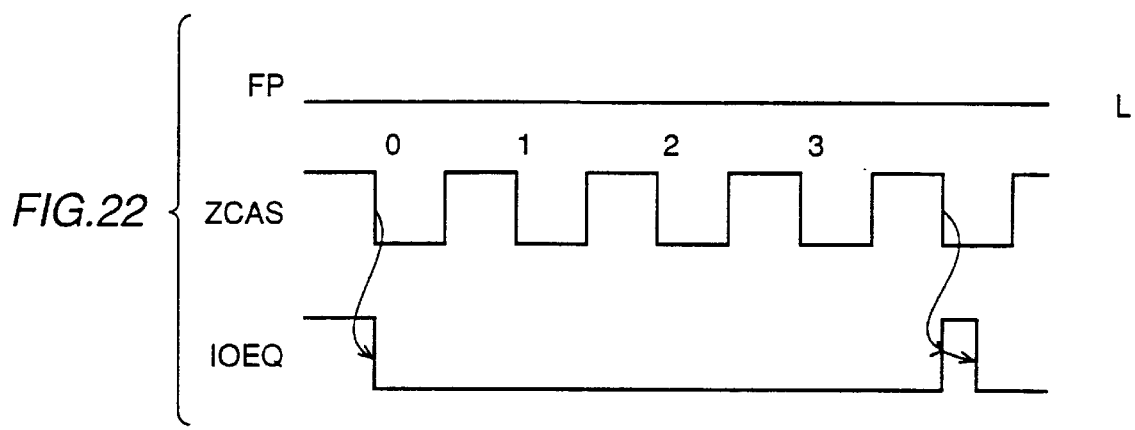
FIG. 22 is a signal wav eform diagram representing an operation of a controller shown in FIG. 20.

When operation mode designating signal FP is set to the low level as shown in FIG. 22, inverter 906 turns on MOS transistor 953. It is in the pipeline burst mode that signal FP is set to the low level, and, in this state, counts ZCY<0> and ZCY<1> are reset to the initial values (1, 1). Therefore, when the output signal of NAND gate 931 is set to the low level, and column address strobe signal ZCAS is first set to the low level, the output signal of NOR gate 946 rises to the high level, and thus NAND gate 932 generates the signal at the low level having a predetermined time width. Thereby, signal IOEQ from NAND gate 930 is maintained at the high level for a predetermined time.

In the next cycle, when column address strobe signal ZCAS is set to the low level, one of counts ZCY<0> and ZCY<1> always attains the low level, so that the output signal of NAND gate 931 maintains the high level, and the output signal of NOR gate 946 maintains the low level. In this case, therefore, the output signal of NAND gate 932 does not change and signal IOEQ maintains the low level, even when column address strobe signal ZCAS is set to the low level. When data of memory cells of 4 bits in total are read, and counts ZCY<0> and ZCY<1> are restored to the initial values (1, 1), signal IOEQ is set to and maintained at the active state of the high level for a predetermined period in response to falling of column address strobe signal ZCAS.

In the pipeline burst mode, data are read simultaneously from memory cells of 4 bits, and are successively selected in accordance with the addresses issued from the internal counter. Therefore, an external address is not accepted and new column select operation is not performed, until the data of memory cells of 4 bits (per terminal DQ) are entirely read out. Thus, circuits related to column address strobe signal ZCAS are not reset. In this state, therefore, each selected column in the memory cell array is connected to the internal I/O line until reading of data from memory cells of 4 bits is completed, as will be described later, and memory cell data may change if the I/O line is equalized in this state. As described above, signal IOEQ is activated and the internal data I/O line is equalized/precharged to a predetermined potential only when the data of memory cells of 4 bits are entirely read out and new column selection is performed in accordance with the external column address.

FIGS. 23A and 23B shows a circuit structure for generating write driver enable signal WDE shown in FIG. 20. In FIG. 23A, the WDE generating circuit includes an NOR gate 1014 receiving write enable signal ZWE, column address strobe signal ZCAS and read instruction signal READ, cascaded three inverters 1000, 1001 and 1002 receiving the output signal of NOR gate 1014, an NAND gate 1010 receiving the output signals of inverter 1002 and NOR gate 1014, an NAND gate 1011 receiving the output signals of NAND gates 1010 and 1012, an NAND gate 1012 receiving the output signals of NOR gate 1015 and NAND gate 1011, and an inverter 1007 receiving the output signal of NAND gate 1012. Inverter 1007 outputs write driver enable signal WDE. NAND gates 1011 and 1012 form a flip-flop.

The WDE generating circuit further includes an inverter 1009 receiving the signal WDE, capacitors 1018 and 1019 for delaying the output signal of inverter 1009, an inverter 1008 receiving the delayed output signal from inverter 1009, inverter 1004 receiving the output signal of inverter 1008, inverter 1006 receiving the output signal of inverter 1008, capacitors 1016 and 1017 delaying the output signal of inverter 1006 by a predetermined time, an inverter 1015 receiving the delayed output signal from inverter 1016, an NAND gate 1013 receiving write enable signal ZWE and the output signal of inverter 1004, an inverter 1003 receiving the output signal of NAND gate 1013, and an NOR gate 1015 receiving column address strobe signal ZCAS, the output signal of inverter 1003 and the output signal of inverter 1005. An inverter 1030 receiving the output signal of inverter 1007 outputs a signal ZDIL.

Capacitors 1016 and 1017 or capacitors 1018 and 1019 are formed of MOS transistors as shown in FIG. 23B. More specifically, capacitor 1016 (or 1018) is formed of a p-channel MOS transistor having a source and a drain coupled to receive the power supply potential. Capacitor 1017 (or 1019) is formed of an n-channel MOS transistor having a source and a drain coupled t receiving the ground potential. MOS transistors 1016 and 1017 have gate electrodes connected together. When the gate electrode potential lowers, a channel is formed in the p-channel MOS transistor forming capacitor 1016, and p-channel MOS transistor 1016 functions as an MOS capacitor. When the gate electrode potential rises, a channel region of n-channel MOS transistor 1017 is formed, and transistor 1017 (1019) functions as an MOS capacitor. By using the MOS transistors (capacitors) as a delay element, a desired delay time can be accomplished with a small occupied area. A delay capacitor to be described below has the above structure. This structure for delaying can alternatively be accomplished even if the operating currents of inverters 1008 and 1009 are reduced (for example, a power supply node is connected via a resistance to a power supply potential supply node in inverter 1009, and a ground node is connected via a resistor to a ground potential supply node in inverter 1008). The operating current decreases, and thus operation speeds of inverters 1009 and 1008 decrease.

Operation of the WD generating circuit shown in FIGS. 23A and 23B will be described below with reference to FIG. 24.

As will be described later in detail, read instruction signal READ is set to the high level of the active state only when data reading is performed. In the data write operation, read instruction signal READ is at the low level. When both signals ZWE and ZCAS attain the low level, the output signal of NOR gate 1014 attains the high level. Thereby, the output signal from a one-shot pulse generating circuit formed of inverters 1000–1002 and NAND gate 1010 is set to the low level for a predetermined time. Inverters 1000–1002 determines a time width of the signal at the low level from NAND gate 1010. In response to the one-shot pulse signal at the low level sent from NAND gate 1010, the output signal of NAND gate 1011 attains the high level.

Signal ZWE is at the low level, and the output signal of inverter 1003 is at the low level. At this time, the output signal of inverter 1005 is at the low level, the output signal of NOR gate 1015 attains the low level, the output signal of NAND gate 1012 is set to low level, and signal WDE from inverter 1007 is set to the high level. Signal WDE is fed back to NOR gate 1015 via inverters 1009, 1008, 1006 and 1005. Therefore, upon elapsing of a predetermined delay time determined by the above feed back path, the output signal of NOR gate 1015 is set to the low level, the output signal of NAND gate 1012 attains the high level, and signal WDE from inverter 1007 is set to the low level.

NAND gate 1013 and inverter 1003 receive signal ZWE and the output signal of inverter 1004. Even if signal ZWE is set to the high level before elapsing of a predetermined time, the output signal of inverter 1004 cannot be set to the low level before elapsing of a predetermined time, i.e., a delay time determined by a path formed of inverters 1009, 1008 and 1004. More specifically, when write enable signal ZWE is set to the high level before elapsing of the predetermined time determined by inverters 1009, 1008 and 1004, inverter 1003 outputs the signal at the high level, and the output signal of NOR gate 1015 attains the low level, so that the flip-flop formed of NAND gates 1011 and 1012 is reset, and write driver enable signal WDE is set to the low level. Therefore, if write enable signal ZWE is set to the low level for a predetermined time period as indicated by broken line in FIG. 24, the output signal of inverter 1004 attains the low level. In this state, even if write enable signal ZWE is set to the high level, the flip-flop formed of NAND gates 1011 and 102 is not reset before write driver enable signal WDE is reset to the low level upon elapsing of the predetermined time. Therefore, in such a case that write enable signal ZWE is set to the low level of the active state for a short period, e.g., due to noises, NAND gate 1013, inverter 1002 and NOR gate 1015 reset the flip-flop formed of NAND gates 1011 and 1012, and the write driver enable signal WDE is set to the low level. Thereby, it is possible to prevent erroneous write operation due to noises.

[Address Transition Detection Circuit]

Figure 25:
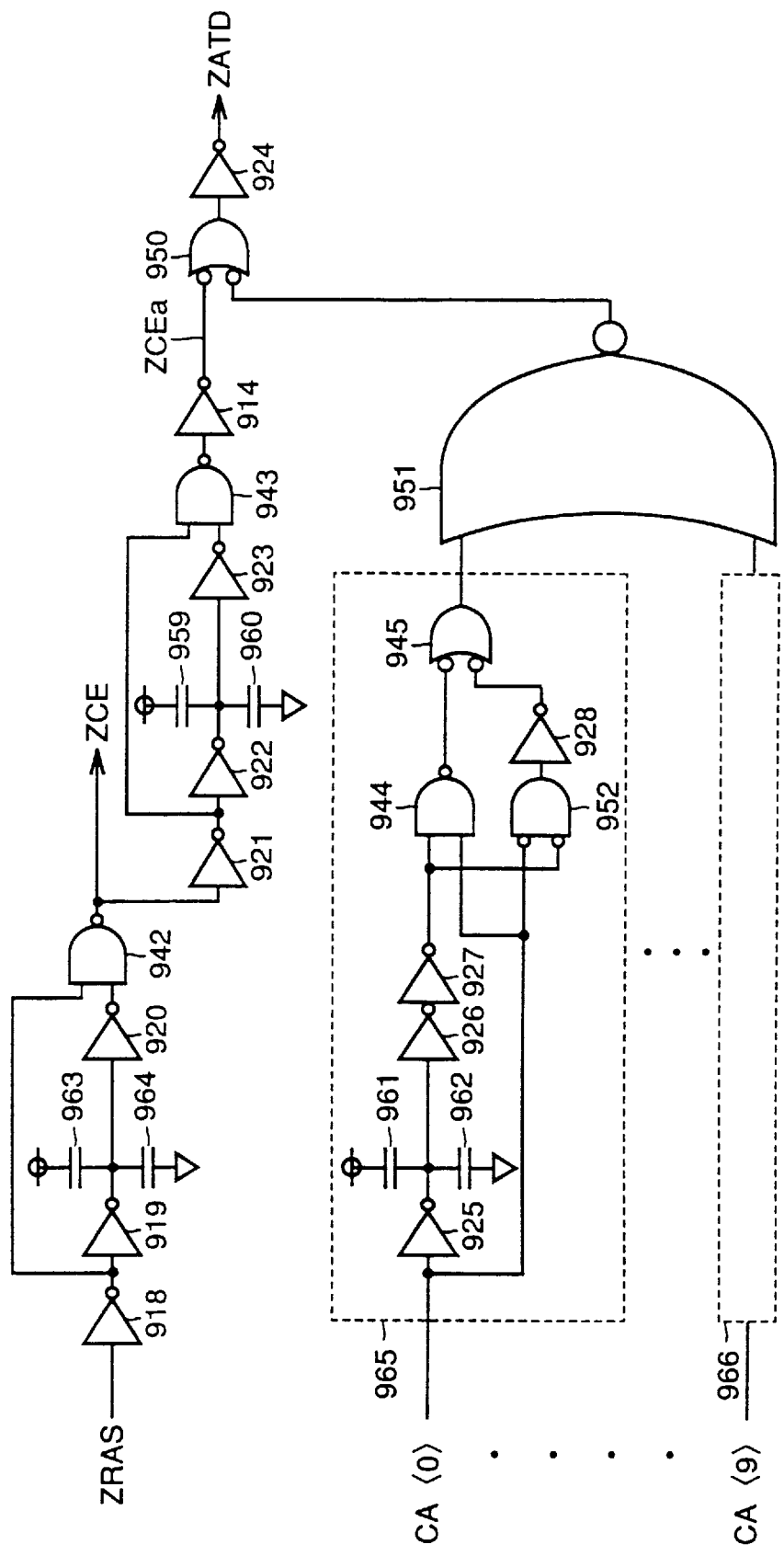
FIG. 25 shows a structure of a transition detecting circuit for a column address signal.

FIG. 25 shows a structure of an address transition detecting circuit generating address transition detection signal ZATD shown in FIG. 20. In FIG. 25, the address transition detecting circuit includes an inverter 918 receiving row address strobe signal ZRAS, an inverter 919 receiving the output signal of inverter 918, capacitors 963 and 964 delaying the output signal of inverter 919 by a predetermined time, a capacitor 920 receiving the delayed signal from inverter 919, and an NAND gate 942 receiving the output signals of inverter 918 and 920. Inverters 918–920 and NAND gate 942 form a falling delay circuit which delays a falling of row address strobe signal ZRAS by a predetermined time. NAND gate 942 outputs a column enable signal ZCE allowing the start of the column selection operation.

Row selection is performed, and, after sensing and amplifying of the selected memory cell data by the sense amplifier, column selection starts, whereby accurate memory access is ensured.

Address transition change detection signal generating circuit further includes an inverter 921 receiving the column enable signal ZCE, an inverter 923 receiving the output signal of inverter 922, an NAND gate 943 receiving the output signals of inverters 921 and 923, and an inverter 914 receiving the output signal of NAND gate 943. Capacitors 959 and 960 for delaying the output signal of inverter 922 by a predetermined time are arranged between inverters 922 and 923. Inverters 921–923, NAND gate 943, and capacitors 959 and 960 form a falling delay circuit which delays falling of column enable signal ZCE by a predetermined time.

The address transition detecting circuit further includes column address transition detection signal generating circuits 965–966 which are provided corresponding to column address bits CA<0>–CA<9>, respectively, an NOR gate 951 receiving the output signals of column address transition detection signal generating circuits 965–966, an NAND gate 950 receiving the output signals of inverter 914 and NOR gate 951, and an inverter 924 receiving the output signal of NAND gate 950. Inverter 924 outputs address transition detection signal ZATD. Address transition detection signal generating circuits 965–966 provided corresponding to internal column address bits CA<0>–CA<9> have the same structure. FIG. 25 shows a specific structure of only address transition detection signal generating circuit 965 provided correspondingly to internal column address bit CA<0>.

Column address transition detection signal generating circuit 965 includes an inverter 925 receiving internal column address bit CA<0>, an inverter 926 receiving the output signal of inverter 925, an inverter 927 receiving the output signal of inverter 926, an NAND gate 944 receiving the output signal of inverter 927 and internal column address bit CA<0>, an NOR gate 952 receiving the output signal of inverter 927 and internal column address bit CA<0>, an inverter 928 receiving the output signal of NOR gate 952, and an NAND gate 945 receiving the output signals of NAND gate 944 and inverter 928.

Between inverters 925 and 926, there are arranged capacitors 961 and 962 formed of MOS transistors for delaying the output signal of inverter 925.

Figure 26:
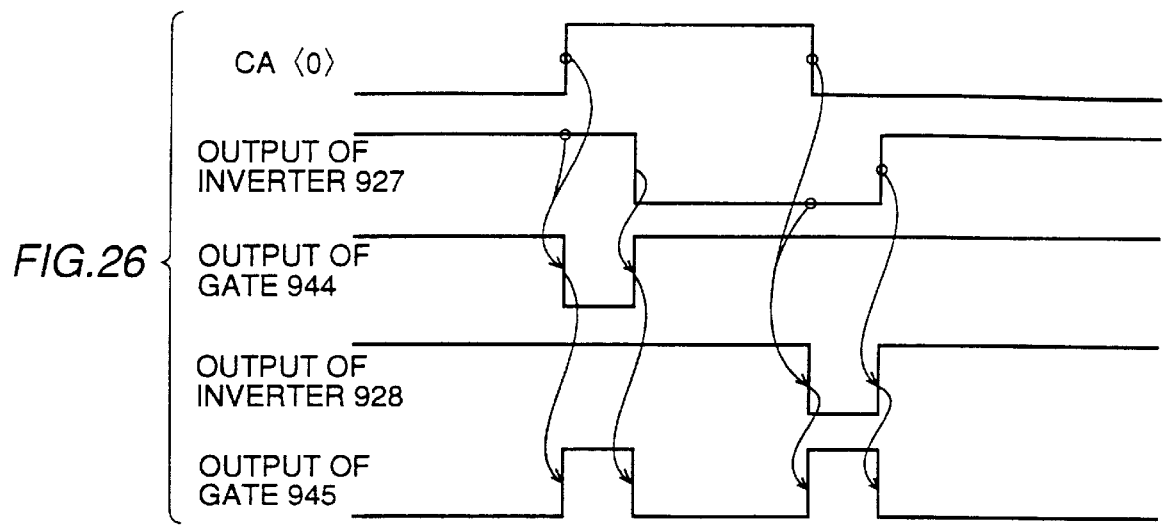
FIG. 26 is a signal waveform diagram representing an operation of a circuit generating an address transition detection signal shown in FIG. 25.

Operation of column address transition detection signal generating circuit 965–966 will be described below. FIG. 26 representatively shows internal address bit CA<0>.

When internal column address bit CA<0> rises from the low level to the high level, the output signal of inverter 927 falls to the low level upon elapsing of a predetermined time (i.e., delay time determined by inverters 925–927 and capacitors 961 and 962). NAND gate 944, therefore, outputs a signal which is at the low level for a period from rising of internal column address bit CA<0> to falling of the output signal of inverter 927 to the low level.

When internal column address bit CA<0> falls from the high level to the low level, the output signal of inverter 927 rises from the low level to the high level after elapsing of a predetermined time. In this state, therefore, an OR gate formed of NOR gate 952 and inverter 928 outputs the signal which is at the low level while internal column address bit CA<0> is at the low level and the output signal of inverter 927 is at the low level. NAND gate 945 outputs the signal at the high level when it receives at one input the signal at the low level. Therefore, gate 945 generates a signal having a pulse width of a predetermined time in accordance with a change of internal column address bit CA<0>.

Figure 27:
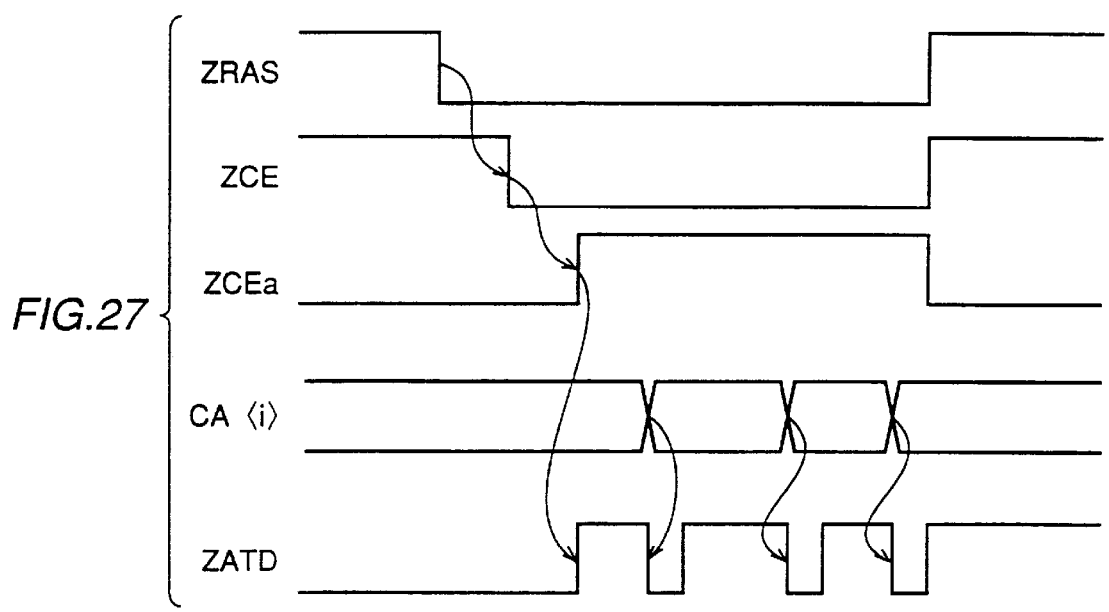
FIG. 27 is a signal waveform diagram representing an operation of the circuit generating the address transition detection signal shown in FIG. 25.

Referring to FIG. 27, operation of the column address transition detecting circuit shown in FIG. 25 will be described below. When internal row address strobe signal ZRAS is at the high level, column enable signal ZCE is also at the high level, and output signal ZCEa of inverter 914 is at the low level. During this period, therefore, column address transition detection signal ZATD is at the low level.

When row address strobe signal ZRAS falls to the low level, column enable signal ZCE from NAND gate 942 falls to the low level upon elapsing of a predetermined time (i.e., delay time determined by inverters 918–920, NAND gate 942 and capacitors 963 and 964). In response to falling of column enable signal ZCE, output signal ZCEa of inverter 914 rises to the high level upon elapsing of a predetermined time (i.e., delay time determined by inverters 921–923, NAND gate 943, and capacitors 959 and 960). At this time, since internal column address bits CA<0>–CA<9> (generically indicated by CA<i>) is not yet changed, all the output signals of column address transition detection signal generating circuits 965–966 are at the low level, and the signal at the high level is generated from NOR gate 951. Therefore, both the inputs of gate 950 are at the high level, so that column address transition detection signal ZATD rises to the high level.

When any one of internal column address bits CA<0>–CA<9> changes, the output signal of column address transition detection signal generating circuit 965–966 rises to the high level, and the output signal of NOR gate 951 attains the low level, so that column address transition detection signal ZATD attains the low level. While signal ZCEa is at the high level (i.e., row address strobe signal ZRAS is at the low level), column address change detection signal ZATD is set to the low level for a predetermined time in accordance with change of internal column address bit CA<i>.

[Column Select Related Control Signal Generating Circuit]

Figure 28:
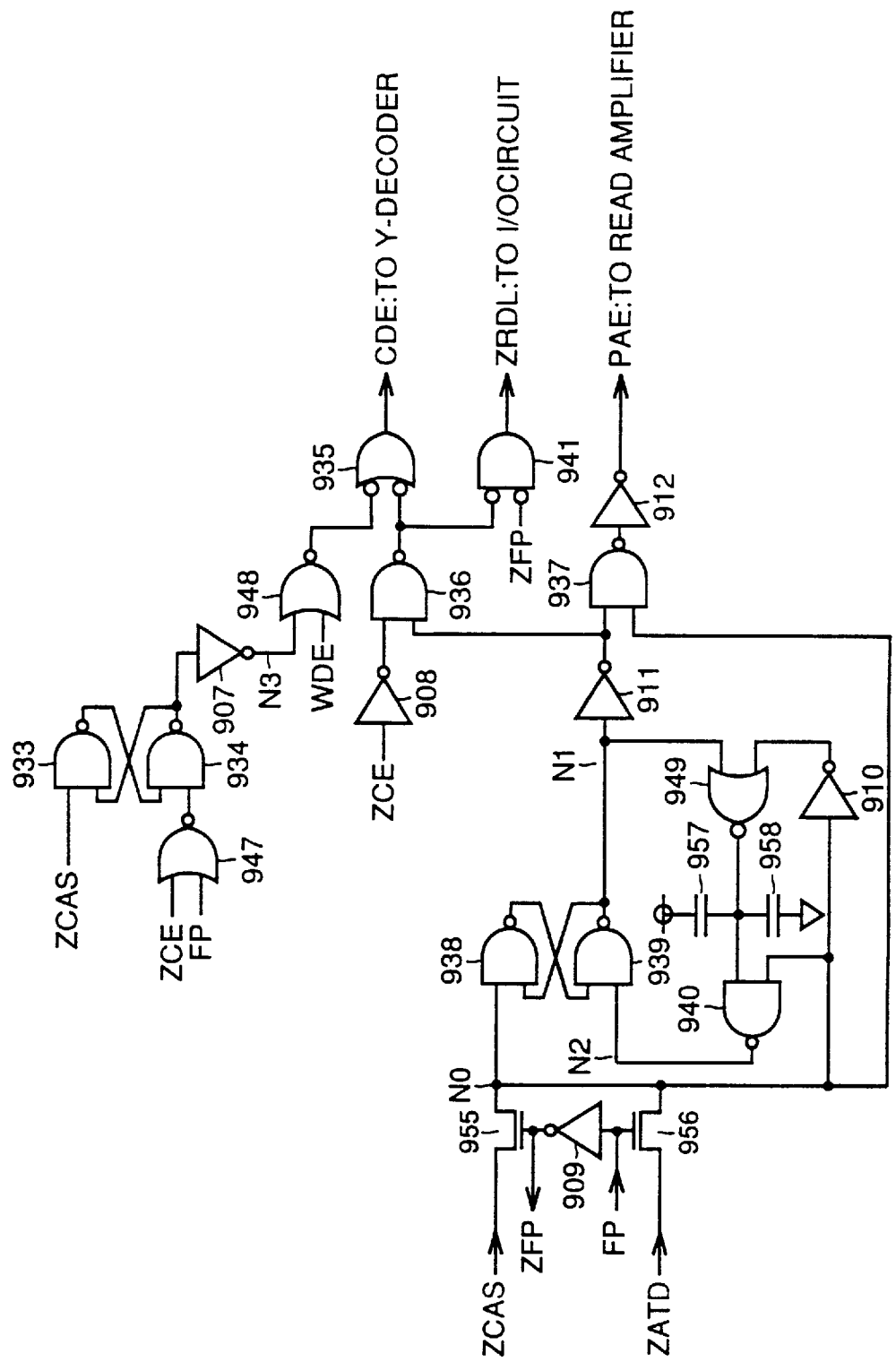
FIG. 28 specifically shows a structure of a portion generating a column decoder enable signal, a read data latch instruction signal and a preamplifier enable signal.

FIG. 28 shows a structure of a portion generating control signals related to column selection in the semiconductor memory device. The control signal generating circuit shown in FIG. 28 generates column decoder enable signal CDE activating the Y-decoder, read data latch instruction signal ZRDL related to the I/O circuit shown in FIG. 6, preamplifier enable signal PAE for activating the read amplifier included in the I/O circuit.

The control circuit includes an inverter 909 receiving the operation mode designating signal FP, an n-channel MOS transistor 955 passing the column address strobe signal ZCAS in accordance with the output signal of inverter 909, an n-channel MOS transistor 956 passing the column address transition detection signal ZATD in response to operation mode designating signal FP, an NAND gate 938 which receives at one input the signal on node N0 applied via MOS transistor 955 or 956, and receives at the other input the signal on node N1, an NAND gate 939 receiving the signal on node N2 and the output signal of NAND gate 938, an inverter 911 receiving the output signal of NAND gate 939, an inverter 910 receiving the signal on node N0, an NOR gate 949 receiving the output signal of inverter 910 and the signal on node N1, capacitors 957 and 958 which are provided for delaying the output signal of NOR gate 949 by a predetermined time and are formed of MOS capacitors, and an NAND gate 940 receiving the delayed output signal from NOR gate 949 and the signal on node N0.

NAND gates 938 and 939, which form a flip-flop, are set in response to the low level of the signal on node N0 and are reset in response to the high level of signal on node N2. NOR gate 949, capacitors 957 and 958, and NAND gate 940 determine a time duration for which the signal potential on node N1 is at the high level.

The control circuit further includes an NAND gate 937 receiving the output signal of inverter 911 and the signal on node N0, and an inverter 912 receiving the output signal of NAND gate 939. Inverter 912 outputs preamplifier enable signal PAE.

The control circuit further includes an NOR gate 947 receiving the column enable signal ZCE and operation mode designating signal FP, an NAND gate 933 receiving the column address strobe signal ZCAS, an NAND gate 934 receiving the output signal of NOR gate 9477, and an inverter 907 receiving the output signal of NAND gate 934. NAND gates 933 and 934 form a flip-flop.

The control circuit further includes an NOR gate 948 receiving the output signal of inverter 907 and write driver enable signal WDE, an inverter 908 receiving the column enable signal ZCE, an NAND gate 936 receiving the output signals of inverters 908 and 911, an NAND gate 935 receiving the output signals of NOR gate 948 and NAND gate 936, and an NAND gate 941 receiving the operation mode designating signal ZFP and the output signal of NAND gate 936. NAND gate 935 outputs column decoder enable signal CDE. NOR gate 941 outputs read data latch instruction signal ZRDL. Operation mode designating signal ZFP is an inverted signal of operation mode designating signal FP. Operation of the control circuit shown in FIG. 28 will be described below with reference to operation waveform diagrams of FIGS. 29 and 30.

Figure 29:
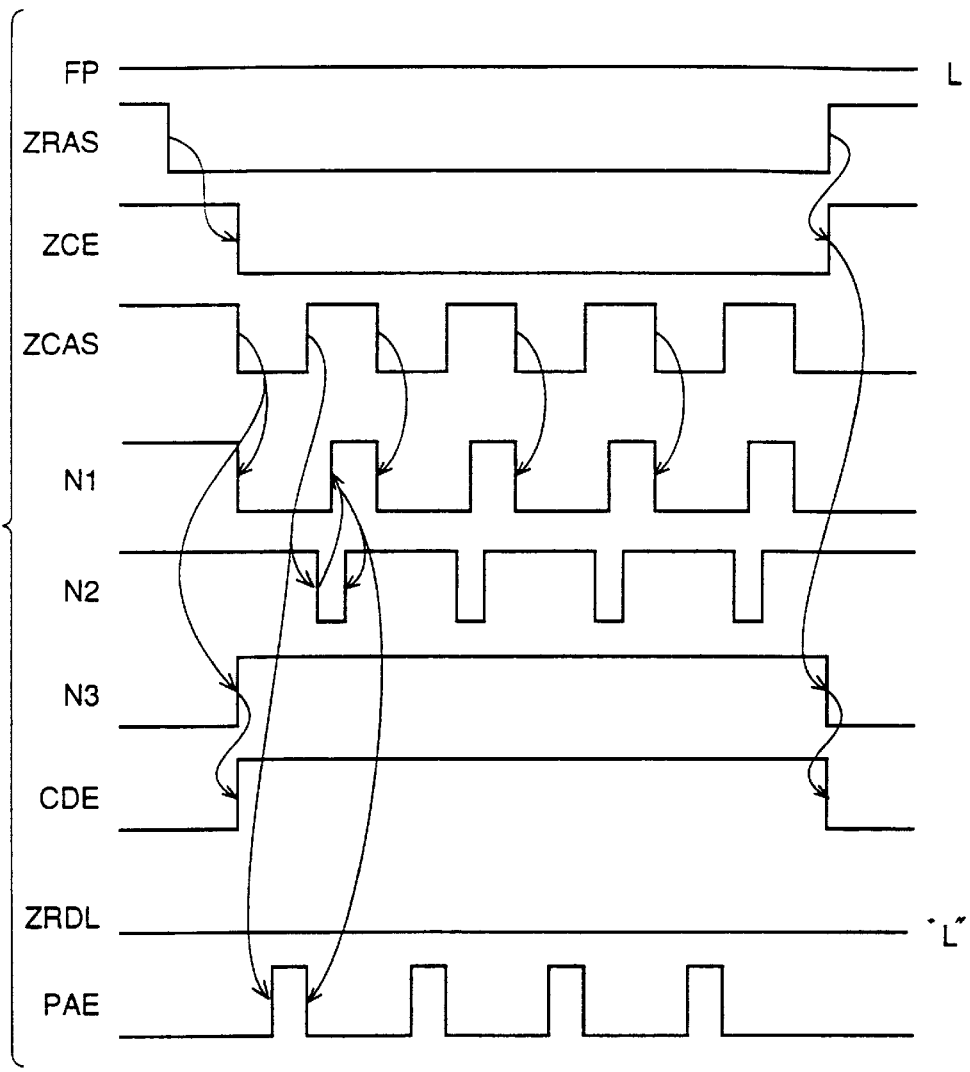
FIG. 29 is a signal waveform diagram representing an operation of a circuit shown in FIG. 28.

Referring to FIG. 29, operation in the pipeline burst mode will be described below. In the pipeline burst mode, operation mode designating signal FP is set to the low level, and signal ZFP is set to the high level. In this state, read data latch instruction signal ZRDL from gate 941 is fixed at the low level. Column address strobe signal ZCAS is transmitted to node N0 via MOS transistor 955. Upon elapsing of a predetermined time after row address strobe signal ZRAS is set to the low level of the active state, column enable signal ZCE is set to the active state of the low level. Thereby, column selecting operation is allowed. When column address strobe signal ZCAS is at the high level, node N1 is at the high level as will be described later. Also, the output signal of inverter 911 is at the low level, and both of column decoder enable signal CDE and preamplifier enable signal PAE are at the low level.

When column address strobe signal ZCAS is set to the low level, the output signal of NAND gate 933 attains the high level. At this time, the output signal of NOR gate 947 is at the high level (signal ZCE is at the low level), the output signal of NAND gate 934 attains the low level, and the potential on node N3 rises to the high level. Node N3 maintains the high level until column enable signal ZCE attains the high level, and NAND gates 933 and 934 are reset. When the potential on node N3 rises, the output signal of NOR gate 948 attains the low level, and column decoder enable signal CDE from NAND gate 935 is set to the high level. Thereby, the Y-decoder is enabled, and internal column address bits (CA<9:0>) are decoded.

Node N0 is set to the low level by column address strobe signal ZCAS, and the output signal of NAND gate 938 attains the high level. Since the potentials on nodes N1 and N2 are at the high level, as will be described later in detail, the output signal of NAND gate 939 attains the low level. At this time, NAND gate 940 receives at one input the signal potential on node N0, and the potential on node N2 is set to the high level.

When column address strobe signal ZCAS attains the high level, both inputs of NAND gate 937 attain the high level, so that NAND gate 937 generates the signal at the low level, and thus preamplifier enable signal PAE attains the high level. The signal on node N0 is applied to NOR gate 949 via inverter 910, so that the output signal of NOR gate 949 attains the high level. When a predetermined time elapses, the signals on both inputs of NAND gate 940 attain the high level, and the potential on node N2 is set to the low level. The time at which node N2 attains the low level is determined by the delay time determined by inverter 910, NOR gate 949, capacitors 957 and 958, and NAND gate 940. When the potential on node N2 falls to the low level, the output signal of NAND gate 939, i.e., the potential on node N1 attains the high level, so that the output signal of inverter 911 attains the low level, and preamplifier enable signal PAE attains the low level. When the potential on node N1 is set to the high level, the output signal of NOR gate 949 attains the low level, and, after elapsing of a predetermined time, the output signal of NAND gate 940, i.e., the potential on node N2 rises to the high level.

Thereafter, preamplifier enable signal PAE is activated to attain and maintain the high level for a predetermined time upon each rising of column address strobe signal ZCAS while column enable signal ZCE is in the active state of the low level. When column enable signal ZCE is set to the high level, the output signal of NOR gate 947 attains the low level, and the flip-flop formed of NAND gates 933 and 934 is reset, so that the potential on node N3 is set to the low level. Thereby, the output signal of NAND gate 938 is set to the high level. NOR gate 948 is provided for surely enabling the column decoder during data writing in the fast page mode to be described later.

Figure 30:
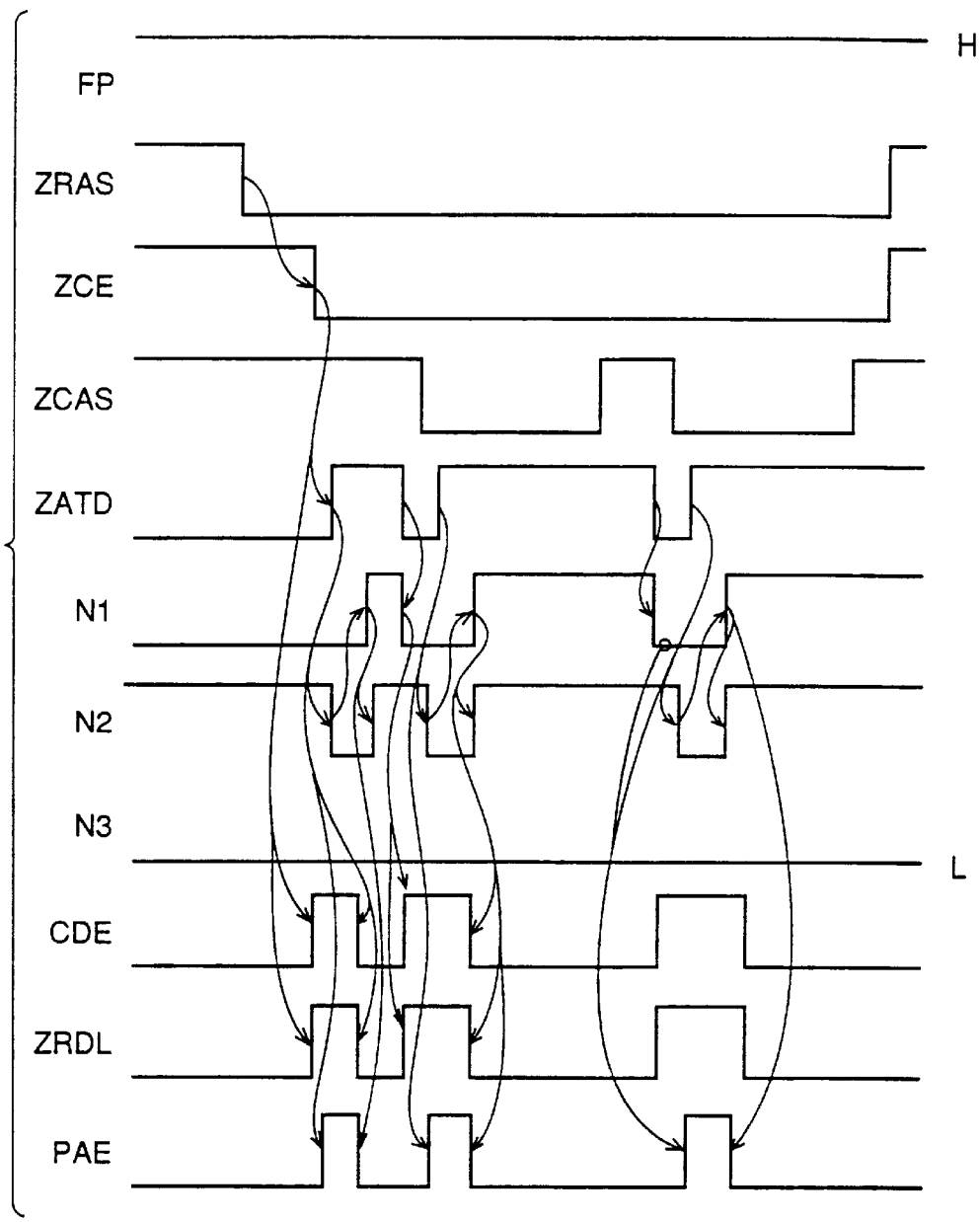
FIG. 30 is a signal waveform diagram representing an operation of the circuit shown in FIG. 28.

Referring to FIG. 30, description will now be given on operation in such a case that operation mode designating signal FP is at the high level designating the fast page mode.

When operation mode designating signal FP is at the high level, MOS transistor 956 is on, and column address transition detection signal ZATD is transmitted to node N0. The output of NOR gate 947 is fixed at the low level, and the potential on node N3 is fixed at the low level. In this state, the logical level of the output signal of NOR gate 948 depends on write driver enable signal WDE. Signal ZFP is at the low level, and NOR gate 941 functions as an inverter. When row address strobe signal ZRAS is at the high level, the potential on node N1 is at the low level, and the potential on node N2 is at the high level. All signals CDE, ZRDL and PAE are in the inactive state of the low level.

When row address strobe signal ZRAS is set to the low level, column enable signal ZCE is set to the low level after elapsing of a predetermined time.

When column enable signal ZCE is set to the low level, the output signal of inverter 908 rises to the high level. At this time, the potential on node N1 is still at the low level, so that the output signal of inverter 911 attains the high level, the output signal of NAND gate 936 attains the low level, and column decoder enable signal CDE and read data latch instruction signal ZRDL rise to the high level. When column enable signal ZCE is set to the active state of the low level, column address transition detection signal ZATD rises to the high level after elapsing of a predetermined time (see FIG. 27).

At this time, the potential on node N1 is not yet changed, so that the output signal of NAND gate 937 attains the low level, and preamplifier enable signal PAE attains the high level. When column address transition detection signal ZATD rises to the high level, the output signal of NAND gate 940 attains the low level, the output of node N1 attains the high level, and all signals CDE, ZRDL and PAE are at the low level. When the potential on node N1 rises to the high level, the output signal of NOR gate 949 attains the low level, and, after elapsing of a predetermined time, the output signal of NAND gate 940, i.e., the potential on node N2 rises from the low level to the high level.

When column address transition detection signal ZATD changes from the high level to the low level in accordance with transition of the internal column address signal, the output signal of NAND gate 938 attains the high level, and the potential on node N1 falls to the low level. In response to the falling of the potential on node N1, the output signal of inverter 911 attains the high level, and column decoder enable signal CDE and read data latch instruction signal ZRDL attain the high level. When column address transition detection signal ATD rises from the low level to the high level, both inputs of NAND gate 937 attain the high level, and preamplifier enable signal PAE is set to the active state of the high level. When column address transition detection signal ZATD is set to the high level, both inputs of NOR gate 949 attain the low level. Upon elapsing of a predetermined time, i.e., delay time determined by capacitors 957 and 958, both inputs of NAND gate 940 attain the high level, and the potential on node N2 falls to the low level. Thereby, the potential on node N1 rises to the high level again, and signals CDE, ZRDL and PAE are set to the low level. Meanwhile, signals CDE, ZRDL and PAE are set to the active state for a predetermined period each time column address transition detection signal ZATD is set to the low level.

In the pipeline burst mode, the above structures operate to maintain column decoder enable signal CDE at the active state of the high level until reading of memory cell data of 4 bits is completed. Thereby, data can be successively written into the simultaneously selected memory cells of 4 bits. In the fast page mode, the column address is externally specified at each cycle (i.e., cycle of signal ZCAS). Therefore, by executing set/reset of the column decoder at each cycle (i.e., cycle of ZCAS signal), data can be written into intended memory cells.

[Data Transfer Instruction Signal Generating Circuit]

FIG. 31 shows a structure of a circuit portion generating a data transfer instruction signal DT applied to the I/O buffer circuit shown in FIG. 9. In FIG. 31, a data transfer instruction signal generating circuit includes an inverter 913 inverting operation mode designating signal FP, and an NAND gate 999 receiving the output signal of inverter 913 and column address strobe signal ZCAS.

In the fast page mode, operation mode designating signal FP is fixed at the high level as shown in FIG. 32A. In this state, the output signal of inverter 913 is set to the low level, and data transfer instruction signal DT from NAND gate 999 maintains the high level regardless of the state of column address strobe signal ZCAS.

In the pipeline burst mode, as shown in FIG. 32B, operation mode designating signal FP is set to the low level. In this state, the output signal of inverter 913 attains the high level, and NAND gate 999 functions as an inverter. Therefore, as shown in FIG. 32B, data transfer instruction signal DT is at the active state of the high level when column address strobe signal ZCAS is active.

[Whole Structure of Column Related Circuitry]

Figure 33:
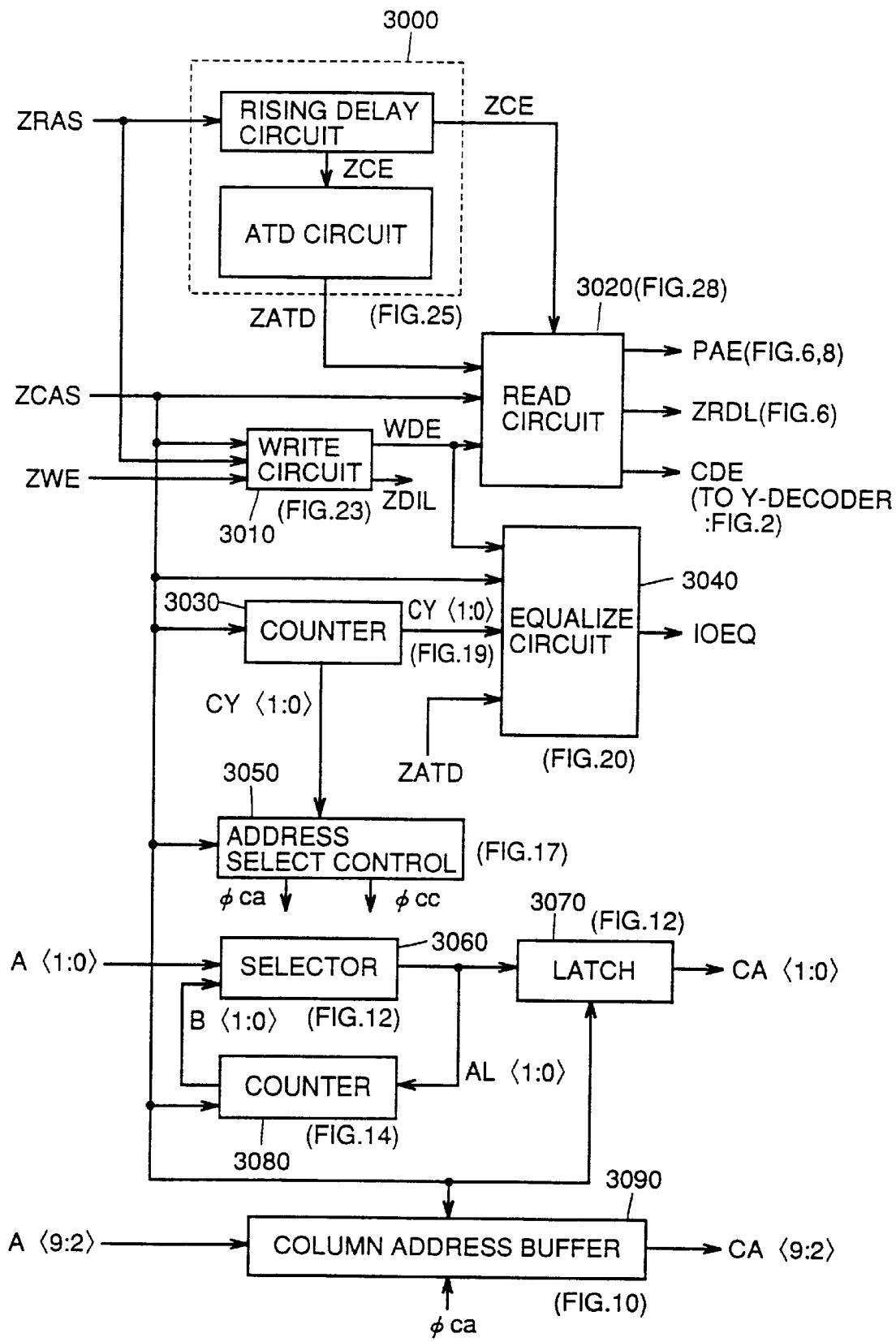
FIG. 33 schematically shows a structure of a controller in the semiconductor memory device of the invention.

FIG. 33 shows a structure of a portion related to column selection in the semiconductor memory device of the embodiment. In FIG. 33, a block 3000 includes a block for generating the column enable signal ZCE by delaying a falling row address strobe signal ZRAS by a predetermined time, and an ATD circuit block which is activated in response to column enable signal ZCE to detect a point of time at which the column address signal changes. Block 3000 is specifically shown in FIG. 25.

A write control block 3010 has a structure corresponding to that shown in FIG. 23, and generates write driver enable signal WDE and write data latch instruction signal ZDIL in accordance with column address strobe signal ZCAS, row address strobe signal ZRAS and write enable signal ZWE.

A read control block 3020 has a structure corresponding to that shown in FIG. 28, and generates the preamplifier enable signal (see FIGS. 6 and 8), read data latch instruction signal (see FIG. 6) and column decoder enable signal CDE (to be applied to the Y-decoder shown in FIG. 2) in accordance with column enable signal ZCE, either of column address strobe signal ZCAS or column address transition detection signal ZATD, and write driver enable signal WDE.

A counter 3030 has a structure corresponding to that shown in FIG. 19, and detects a point of time of activation of column address strobe signal ZCAS to generate count CY<1:0>.

An equalize control block 3040 has a structure corresponding to that shown in FIG. 20, and generates I/O line equalize signal IOEQ in accordance with write driver enable signal WDE, column address strobe signal ZCAS, count CY<1:0> from counter block 3030 and column address transition detection signal ZATD.

Address select control block 3050 has a structure corresponding to that shown in FIG. 17, and generates control signals φca and φcc, which are used for selecting the column address, in accordance with count CY<1:0> from counter block 3030 and column address strobe signal ZCAS.

A selector block 3060 operates in accordance with control signals φca and φcc from address selection control block to select one of externally applied address A<1:0> and internal column address B<1:0> from a counter block 3080 and transmit the selected one to a latch block 3070. The selector block 3060 and latch block 3070 have structures corresponding to those shown in FIG. 12.

A counter block 3080 has a structure corresponding to that shown in FIG. 14, and produces internal column address bits B<1:0> in accordance with address AL<1:0> from selector block 3060 and column address strobe signal ZCAS. Column address buffer block 3090 has a structure corresponding to that shown in FIG. 10, and operates in accordance with column address strobe signal ZCAS and control signal φca from address selection control block 3050 to take in and latch externally applied column address bits A<9:2> for outputting internal column address bits CA<9:2>. Operation of the whole structure shown in FIG. 33 will now be described below with reference to sequence charts of FIGS. 34–37.

Figure 34:
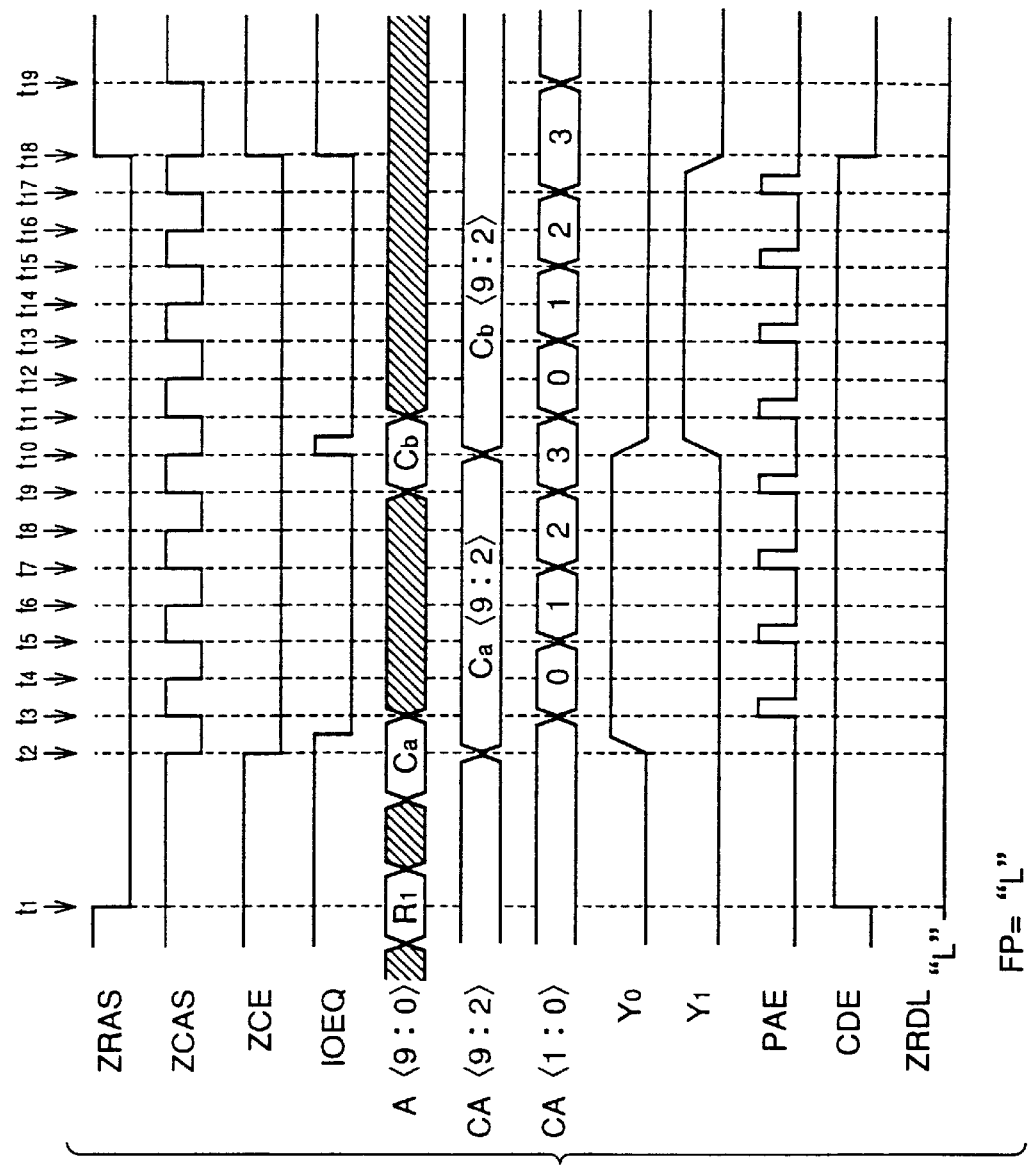
FIG. 34 is a timing chart representing an operation of the semiconductor memory device shown in FIG. 33.
Figure 35:
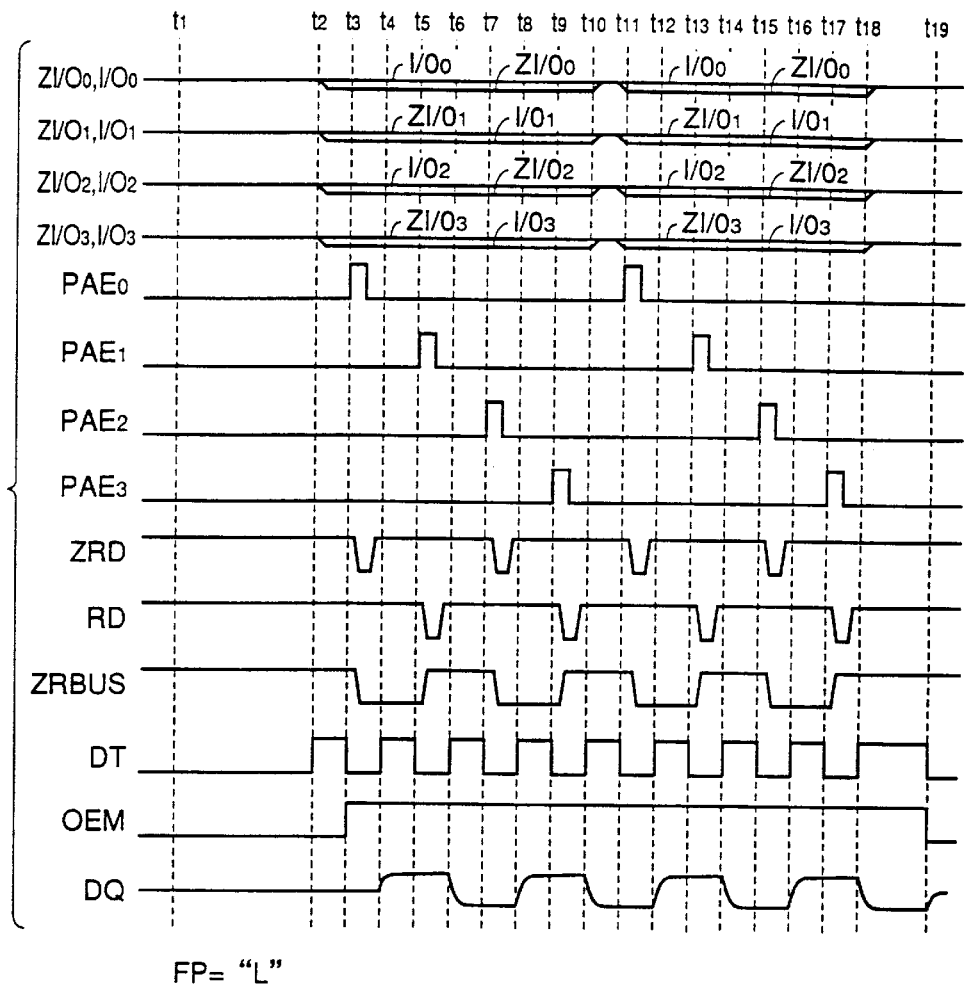
FIG. 35 is a timing chart representing an operation of the semiconductor memory device shown in FIG. 33.

Referring first to FIGS. 34 and 35, description will be given on the operation in the pipeline burst mode in which operation mode designating signal FP is set to the low level.

Row address R1 is taken in at time t1 in accordance with row address strobe signal ZRAS, and column address Ca is taken in at time t2 in accordance with column address strobe signal ZCAS. It is assumed that both of lower two bits Ca<1:0> of column address Ca are 0. When signal φL is at "H", the counter shown in FIG. 14 (i.e., counter block 3080) increments its count by one (i.e., successively from "0" through "1" and "2" to "3") each time column address strobe signal ZCAS attains the high level. In accordance with remaining column address bits CA<9:2>, the Y-decoder activated by column decoder enable signal CDE sets column select signal Y0 to the selected state, and data of memory cells of 4 bits selected by this column select signal Y0 are read onto internal data I/O lines ZI/O0 and I/O0–ZI/O3 and I/O3, respectively. FIG. 35 shows a state that data of "1", "0", "1" and "0" are read onto internal data I/O lines I/O0–I/O3.

Preamplifier enable signal PAE is activated to attain and maintain the high level for a predetermined period when column address strobe signal CAS is set to the high level. In accordance with preamplifier enable signal PAE and column address CA<1:0> of 2 bits, preamplifier enable signals PAE0, PAE1, PAE2 and PAE3 are successively set to the high level at times t3, t5, t7 and t9, respectively, so that data read onto the corresponding internal data I/O line pairs are amplified. The read amplifier has a structure corresponding to that shown in FIG. 8, and its outputs RD and ZRD attain the high level when preamplifier enable signal PAE is at the inactive state of the low level. When preamplifier enable signal PAE attains the high level of the active state, the read amplifier is activated.

In the case where the potential of I/O line I/Oi is higher than that of I/O line ZI/Oi, signal ZRD attains the low level.

In the contrary case, signal RD attains the low level. When preamplifier enable signal PAE0 attains the high level at time t3 as shown in FIG. 35, signal ZRD attains the low level, because of such a relationship corresponding to read data "1" that the potential of I/O line I/O0 is higher than the potential of I/O line ZI/O0. Therefore, the signal at the low level is transmitted onto read data bus line ZRBUS.

When preamplifier enable signal PAE0 attains the low level, outputs RD and ZRD of read amplifier are reset to the high level, but the read data is held by the latch circuit formed of the NAND gates as shown in FIG. 6. Therefore, even when preamplifier enable signal PAE0 is set to the low level, the potential of internal data read data bus line ZRBUS0 does not change (bit select signal ZZ0 is at the high level).

Data on read data bus line ZRBUS0 is transmitted onto I/O buffer circuit (see FIG. 9).

When signal DT attains the high level at time t4, data is transferred to and held at the latch circuit which is included in the I/O buffer circuit shown in FIG. 9. Since output buffer activating signal OEM is set to the high level at time t4, data at the high level is sent to data I/O terminal DQ.

At time t5, an incremented column address CA<1:0> from the counter sets signal PAE1 for activating the corresponding read amplifier to the selected state. Corresponding to read data "0", the potential on I/O line I/O1 is lower than the potential on I/O line ZI/O1, so that signal RD attains the low level. Therefore, read data bus ZRBUS0 is driven to the high level. Operation mode designating signal FP is at the low level, and data is transmitted to I/O buffer circuit (see FIG. 9) only through one read data bus line ZRBUS.

When signal DT attains the high level at time t6, data is transferred to the latch circuit in this I/O buffer circuit, and the latched data is sent to data output pin terminal DQ. Thus, data at the low level is output.

Thereafter, similar operation is repeated. More specifically, preamplifier enable signals PAE2 and PAE3 are set to the selected states at times t7 and t9, and data "1" and "0" corresponding to data of the selected memory cells are output at times t8 and t10, respectively.

At time t10, next address cb is input, and next column select signal Y1 is selected after activation of signal IOEQ. Similar operations continue until time t18.

In this operation mode, signal FP is fixed at the low level, and read data bus line RBUS0 is not charged/discharged. In the pipeline burst mode in which operation mode designating signal FP is set to the low level, data of 4 bits selected by the column select line are successively read. In contrast to the conventional nibble mode, the read amplifiers are successively activated in accordance with the order of data to be read successively, and the read amplifiers are not activated simultaneously, so that the peak value in the consumed current can be reduced. Since only read data bus line ZRBUS0 is charged and discharged, the average current consumption can be made small.

Figure 36:
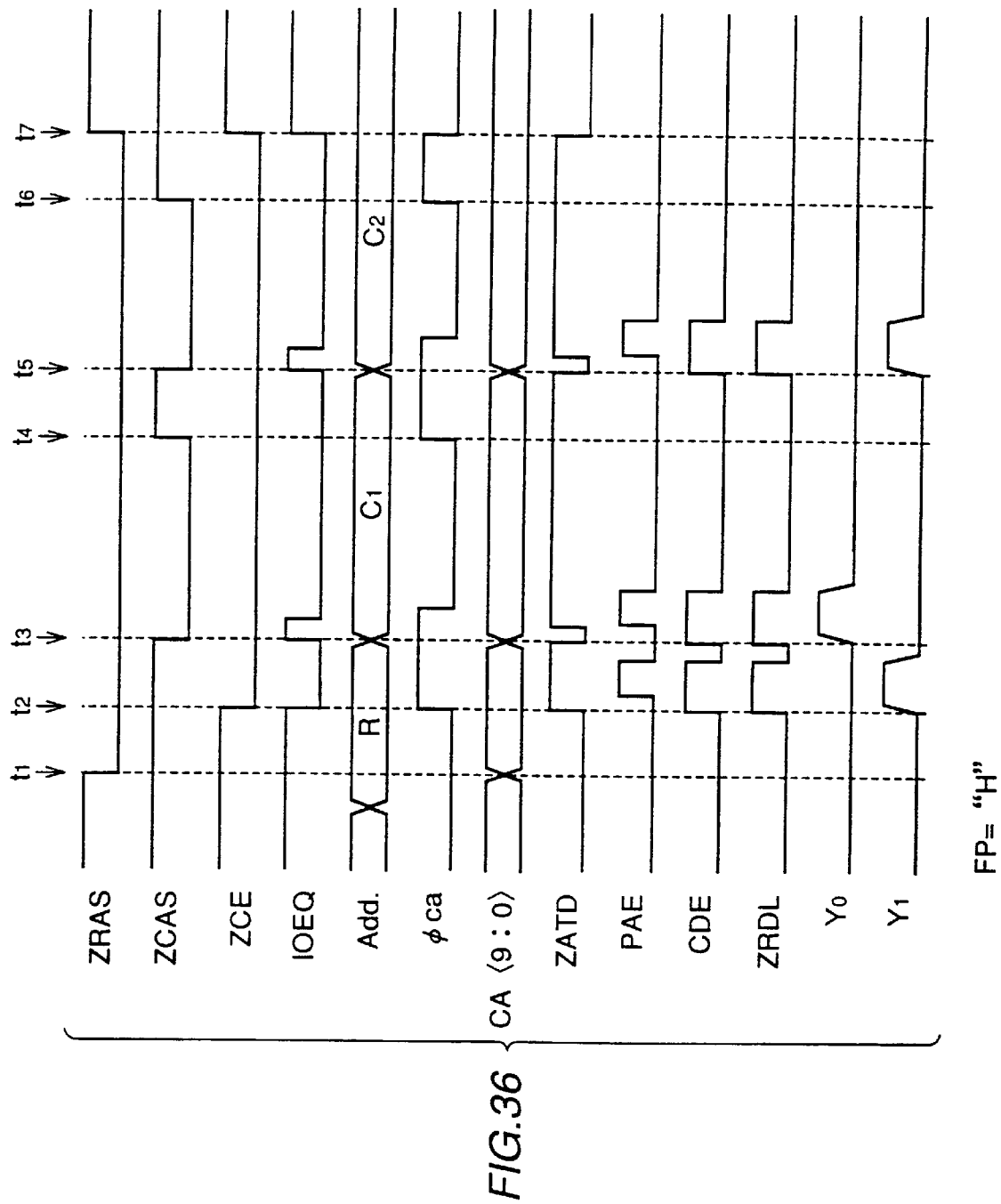
FIG. 36 is a signal waveform diagram representing a whole operation of the semiconductor-memory device of the invention.
Figure 37:
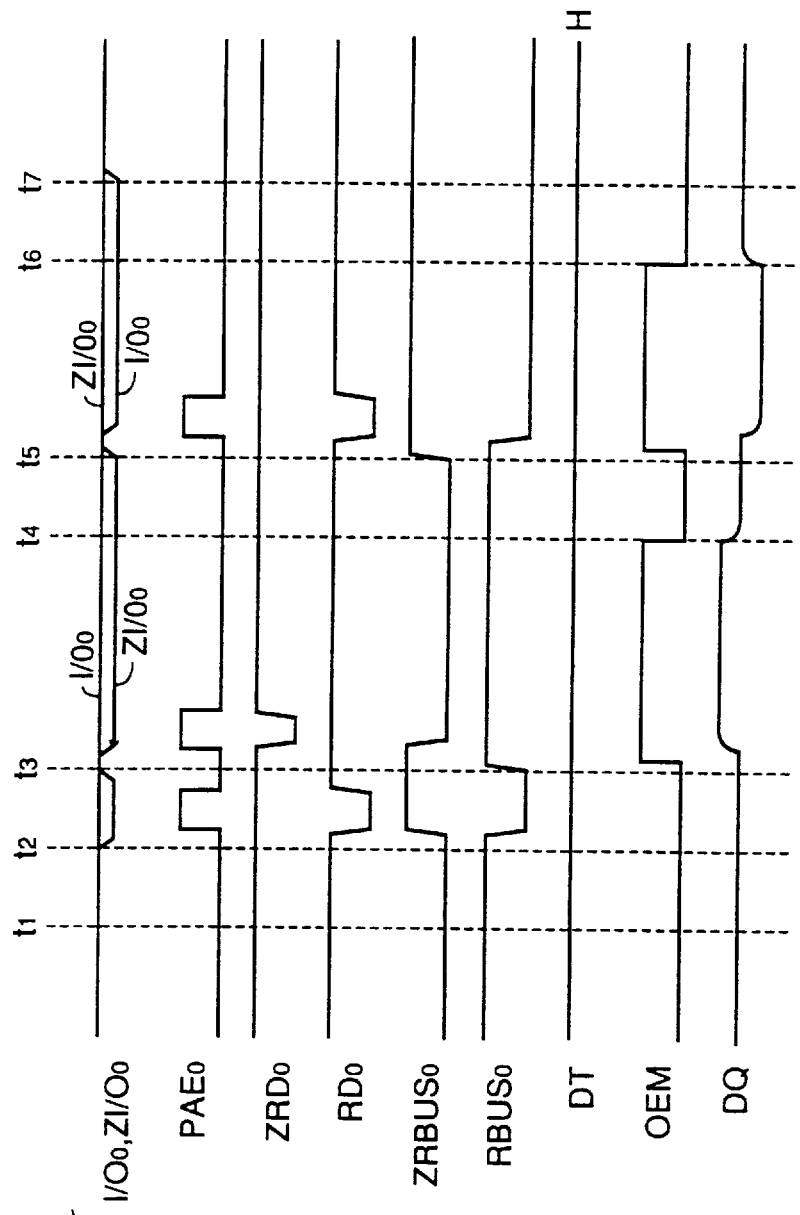
FIG. 37 is a signal waveform diagram representing an operation of the semiconductor memory device of the invention.

Operation in the fast page mode will be described below with reference to sequence charts of FIGS. 36 and 37.

Column address transition detection signal ZATD is set to and maintained at the low level of the active state for a predetermined period when the column address changes. At time t1, row address R is specified in accordance with row address strobe signal ZRAS, and column address C1 is specified by column address strobe signal ZCAS at time t3.

At time t2, column enable signal ZCE is set to the active state of the low level, so that circuits related to the column selection are enabled. In response to falling of column enable signal ZCE, column decoder enable signal CDE and read data latch instruction signal ZRDL are activated to attain the high level, and preamplifier enable signal PAE is maintained at the high level for a predetermined period. In this state, however, output buffer activating signal OEM is at the low level, and output buffer activating signal OEM maintains the low level at time t2 even if the Y-decoder perform the selecting operation in accordance with the column decoder enable signal, and thus data reading is not performed. Although internal data reading is performed, it is merely refreshing of memory cell data that is performed.

At time t3, preamplifier enable signal PAE is at the low level, the read amplifier is inactive, and its output signals ZRD and RD are at the high level. Read data latch instruction signal ZRDL is at the high level at time t3, and in the fast page mode, as for the I/O buffer circuit when the read amplifier is inactive, read data buses RBUS and ZRBUS are precharged to the high level via the MOS transistors at its output portion as shown in FIG. 6. Therefore, even if output buffer activating signal OEM is set to the high level at time t3, an output of the latch circuit at the output stage shown in FIG. 9 maintains the low level, both the output transistors are off, and output terminal DQ maintains the high impedance state.

When preamplifier enable signal PAE is set to the high level, the read amplifier is activated. When data at the high level (i.e., of "1") is to be read, output RD0 of read amplifier attains the low level, and the latch circuit in the I/O circuit shown in FIG. 6 is set. Then, signal ZRDL attains the high level, whereby read data bus line ZRBUS0 is discharged to the low level via the output transistor. Meanwhile, read data bus line RBUS0 maintains the high level, and the latch circuit in the I/O buffer circuit shown in FIG. 9 is set, so that data at the high level is read to data output terminal DQ via the output transistor.

At time t4, when output buffer activation signal OEM attains the low level, the I/O buffer circuit is set to the output high impedance state.

When data at the low level (i.e., of "0" ) is to be read in accordance with column address C2 which is newly input at time t5, operation opposite to the foregoing operation is performed on read data bus lines RBUS0 and ZRBUS0, and data at the low level is output via the I/O buffer circuit. At times t6 and t7, signals ZCAS and ZRAS are deactivated. In the fast page mode, false data is not output, because data reading is performed with the complementary read data bus lines, so that data can be read fast. Since the cycle time is longer than that in the burst pipeline mode, so that the average current consumption can be reduced.

[Structure Generating Signals for Activating Memory Array and Output Buffer]

Figure 38:
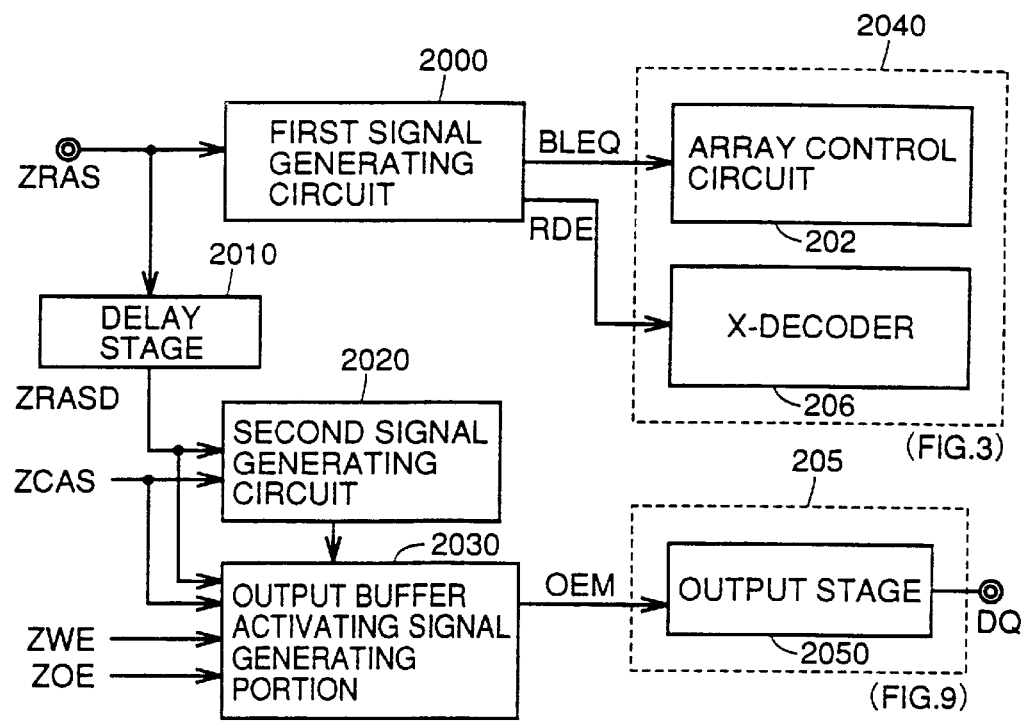
FIG. 38 schematically shows structures of an array activation/precharge controller and a controller at a data output stage in the invention.

FIG. 38 schematically shows a circuit portion generating control signals for activating the memory cell array and activating the data output. In FIG. 38, an array/output activation control portion includes a first signal generating circuit 2000 which receives externally applied row address strobe signal ZRAS and generates a signal for controlling activation/precharge of the memory cell array, a delay stage 2010 which delays row address strobe signal ZRAS by a predetermined time, a second signal generating circuit 2020 which receives externally applied column address strobe signal ZCAS and delayed row address strobe signal ZRASD from delay stage 2010 to generate a signal for inhibiting output of data to the data output terminal, i.e., for setting the data output terminal to the high impedance state, and an output buffer activating signal generating circuit 2030, which activates output buffer activating signal OEM in accordance with delayed row address strobe signal ZRASD, column address strobe signal ZCAS and write enable signal ZWE, and deactivates the output buffer activating signal in response to the output signal from second signal generating circuit 2020.

First signal generating circuit 2000 generates a bit line equalize/precharge signal BLEQ to be applied to an array control circuit 202 included in an array activation/precharge control portion 2040, and also generates row decoder enable signal RDE to be applied to X-decoder 206. First signal generating circuit 2000 may also generate a control signal for activating the sense amplifiers shown in FIG. 3. The specific structure of array control circuit 202 is shown in FIG. 3, which is shown in FIG. 38 including only a precharge/equalize circuit for precharging each bit line pair to a predetermined potential (Vcc/2) in response to bit line equalize/precharge signal BLEQ. X-decoder 206 is activated when row decoder enable signal RDE is activated, and decodes the internal row address applied from an X-address buffer (not shown) for selecting a row in the corresponding block of the memory array.

Output buffer activating signal OEM from output buffer activating signal generating portion 2030 is applied to an output stage 2050 included in I/O buffer circuit 205 shown in FIG. 9. Output stage 2050 includes, in the I/O buffer shown in FIG. 9, composite logic gates 536 and 537 at the output portion, NAND gates 522 and 527, and MOS transistors 547 and 548. In FIG. 9, output stage 2050 is supplied with inverted signal ZOEM of output buffer activating signal OEM. When signal OEM is set to the high level of the active state, signal ZOEM attains the low level of the active state. Therefore, they are logically equivalent, and it is merely necessary to produce signal ZOEM by the inverter from output buffer activating signal OEM. Operation of the control portion shown in FIG. 38 will be described below with reference to an operation waveform diagram of FIG. 39.

Figure 39:
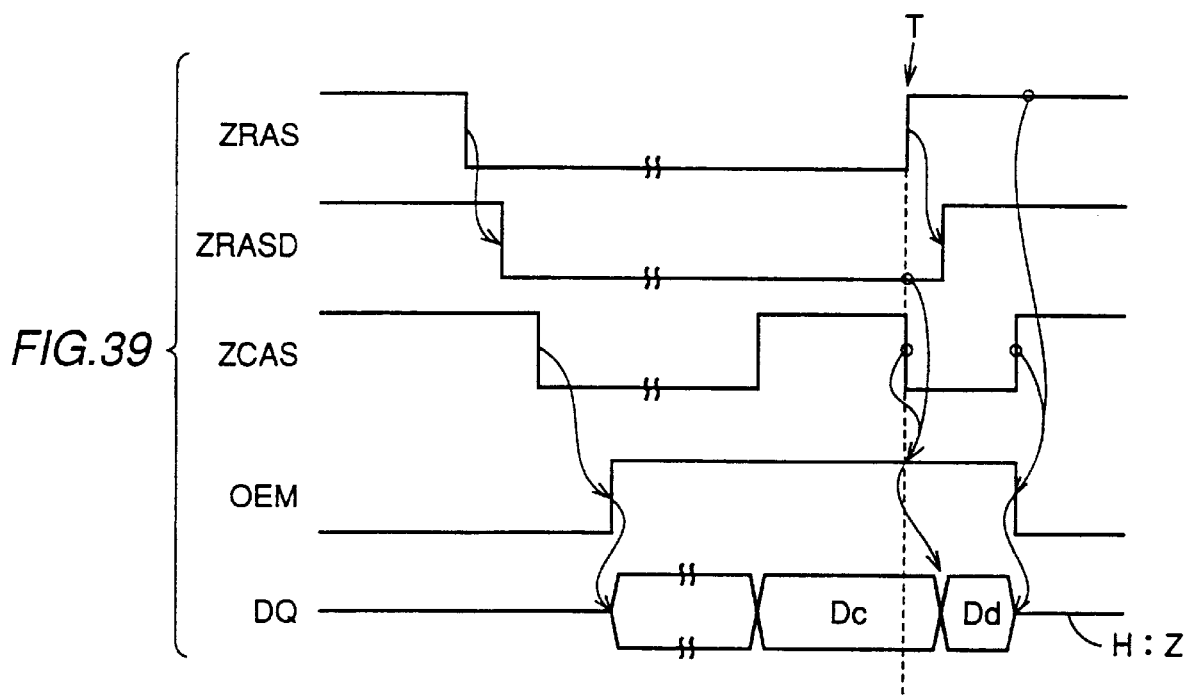
FIG. 39 is a waveform diagram representing an operation of a circuit portion shown in FIG. 38.

This semiconductor memory device sets data (input and) output terminal DQ to the high impedance state when both signals ZRAS and ZCAS attain the high level in FIG. 39. Thus, the semiconductor memory device operates in the pipeline burst mode.

When row address strobe signal ZRAS is set to the active state of the low level, first signal generating circuit 2000 sets bit line equalize/precharge signal BLEQ to the low level of the inactive state in accordance with activation of row address strobe signal ZRAS, so that all the MOS transistors included in the bit line equalize/precharge circuit included in array control circuit 202 are turned off. Then, row decoder enable signal RDE is activated, and X-decoder 206 executes a row selection operation.

Delay stage 2010 delays external row address strobe signal ZRAS by a predetermined time to generate delayed row address strobe signal ZRASD. Output buffer activating signal generating portion 2030 is activated in response to delayed row address strobe signal ZRAS, and sets output buffer activating signal OEM to the high level of the active state at a predetermined timing when the data output mode is designated in accordance with externally applied signals ZCAS, ZWE and ZOE. In the data read operation, activation of output buffer activating signal OEM is normally executed in response to activation of column address strobe signal ZCAS, as will be described later in detail. Output stage 2050 outputs the received data to data (input and) output terminal DQ in accordance with activation of output buffer activating signal OEM.

At time T (corresponding to t18 in FIG. 34), row address strobe signal ZRAS is set to the high level, and column address strobe signal ZCAS is set to the low level. Even if these transitions of signals ZRAS and ZCAS occur at the same point of time, delayed row address strobe signal ZRASD maintains the low level of the active state yet. In this state, therefore, second signal generating circuit 2020 does not deactivate output buffer activating signal OEM, and output buffer activating signal generating portion 2030 maintains output buffer activating signal OEM at the high level of the active state. When column address strobe signal ZCAS changes to the high level, delayed row address strobe signal ZRASD is already raised to the high level, and second signal generating circuit 2020 outputs a signal deactivating output buffer activating signal OEM, because both column address strobe signal ZCAS and delayed row address strobe signal ZRASD are at the high level. Output buffer activating signal generating portion 2030 sets the output buffer activating signal OEM to the low level of the active state in response to the signal from second signal generating circuit 2020. Therefore, output stage 2050 is set to the output high impedance state, and data (input and) output terminal DQ attains the high impedance state (HiZ).

In the pipeline burst mode, therefore, when memory cell data of 4 bits are simultaneously selected, last data Dd, i.e., data of fourth bit can be surely output in accordance with column address strobe signal ZCAS, even if column address strobe signal ZCAS is set to the low level simultaneously with rising of row address strobe signal ZRAS when data Dc of a third bit is being output. Thereby, the timing of deactivating signal ZRAS can be advanced one clock cycle (cycle of external clock signal CLOCK), and fast access is allowed. When row address strobe signal ZRAS is deactivated, row decoder enable signal RDE is deactivated, and the potential of selected row (word line) attains the low level. Then, bit line equalize/precharge signal BLEQ is set to the high level, and each bit line pair is precharged. The state that each bit line pair in the memory cell array is being precharged is referred to as an "array precharge" state. Such a state is referred to as an "array activated" state that row decoder enable signal RDE released from the precharge state is at the active state, and the word line selection is being performed in the memory cell array.

Figure 40:
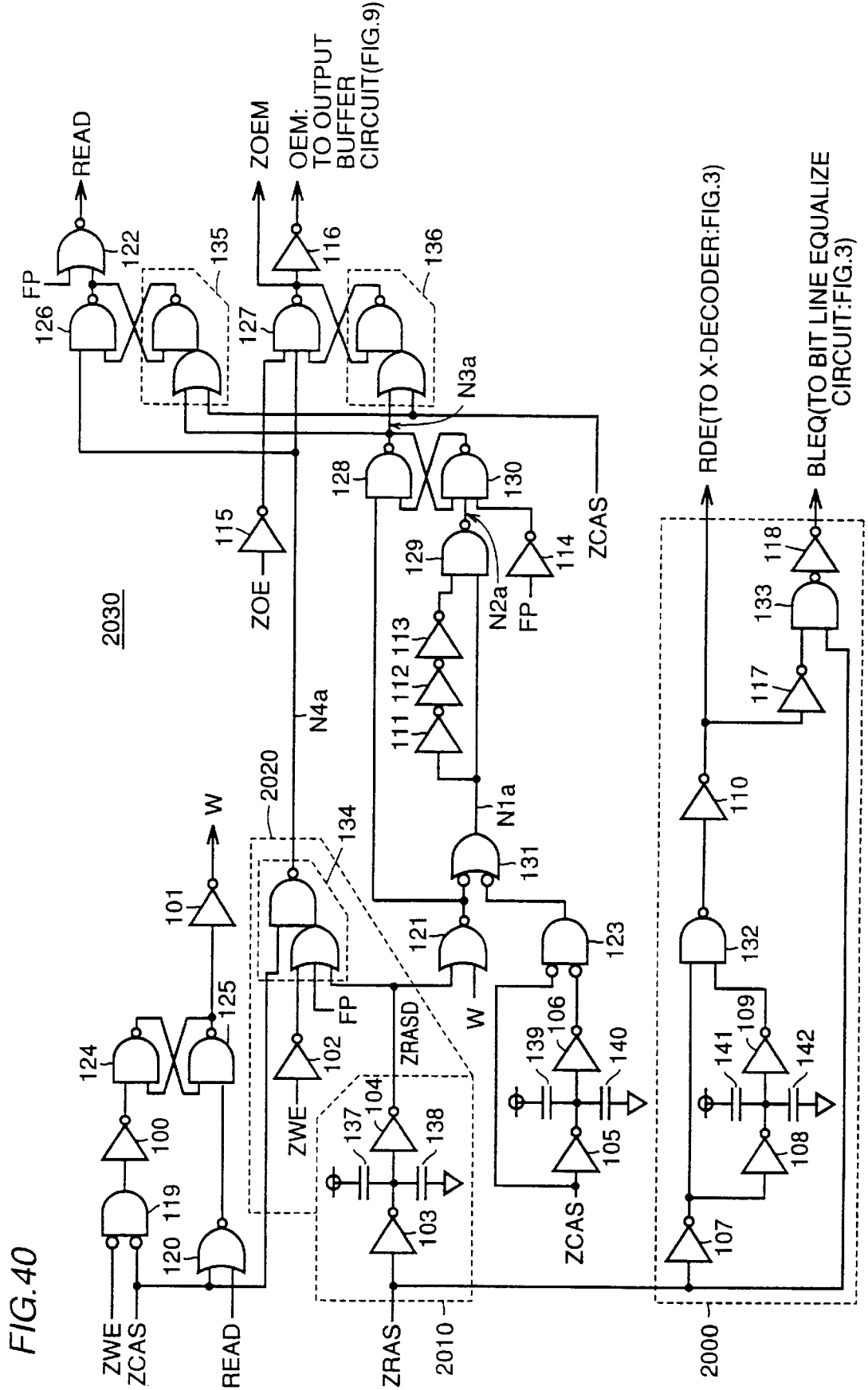
FIG. 40 specifically shows a structure of the circuit portion shown in FIG. 38.

FIG. 40 shows a specific structure of the control portion shown in FIG. 38. In FIG. 40, first signal generating circuit 2000 includes an inverter 107 receiving row address strobe signal ZRAS, cascaded two inverters 108 and 109 receiving the output signal of inverter 107, NAND gate 132 receiving the output signals of inverters 108 and 109, inverter 110 receiving the output signal of NAND gate 132, inverter 117 receiving the output signal of inverter 110, NAND gate 133 receiving the output signal of inverter 117 and row address strobe signal ZRAS, and an inverter 118 receiving the output signal of NAND gate 133. Delaying capacitors 141 and 142 formed of MOS transistors are arranged between inverters 108 and 109. A capacitor 141 coupled to a power supply node functions as an MOS capacitor at the time of falling of the output signal of inverter 108. Capacitor 142 functions as an MOS capacitor at the time of rising of the output signal of inverter 108. Inverters 107–109 and NAND gate 132 act as a circuit for delaying a falling of row address strobe signal ZRAS.

Delay stage 2010 includes an inverter 103 receiving row address strobe signal ZRAS, an inverter 104 receiving the output signal of inverter 103, and capacitors 137 and 138 formed of MOS capacitors for delaying the output signal of inverter 103 by a predetermined time. MOS capacitors 137 and 138 for delay are similar to capacitors 141 and 142, and also have structures similar to those of the capacitors for delay already described in connection with the structures of respective portions.

Second signal generating circuit 2020 includes an inverter 102 receiving write enable signal ZWE, and a composite logic gate 134 receiving the output signal of inverter 102, operation mode designating signal FP, delayed row address strobe signal ZRASD from delay stage 2010 and externally applied column address strobe signal ZCAS. Composite logic gate 134 is equivalent to a structure which includes an OR gate receiving the output signal of inverter 102, operation mode designating signal FP and delayed row address strobe signal ZRASD, and an NAND gate receiving the output signal of this OR gate and column address strobe signal ZCAS. Composite logic gate 134 has a function of detecting that both of column address strobe signal ZCAS and delayed row address strobe signal ZRASD attain the high level during data reading in the pipeline burst mode.

Output buffer activating signal generating portion 2030 includes an NOR gate 119 receiving write enable signal ZWE and column address strobe signal ZCAS, an inverter 100 receiving the output signal of NOR gate 119, an NOR gate 120 receiving column address strobe signal ZCAS and read operation designating signal READ, an NAND gate 124 receiving the output signal of inverter 100, an NAND gate 125 receiving the output signal of NOR gate 120, and an inverter 101 receiving the output signal of NAND gate 125. NAND gates 124 and 125 have their inputs and outputs cross-coupled to form a flip-flop. Inverter 101 outputs a signal W indicating the data write operation.

Output buffer activating signal generating portion 2030 further includes an NOR gate 121 receiving write operation designating signal W from inverter 101 and delayed row address strobe signal ZRASD, an inverter 105 receiving column address strobe signal ZCAS, an inverter 106 receiving the output signal of inverter 105, an NOR gate 123 receiving the output signal of inverter 106 and column address strobe signal ZCAS, an NAND gate 131 receiving the output signals of NOR gates 121 and 123, cascaded three inverters 111, 112 and 113 delaying the output signal of NAND gate 131 by a predetermined time and inverting the same, an NAND gate 129 receiving the output signal of inverter 113 and the output signal of NAND gate 131, an inverter 114 receiving operation mode designating signal FP, NAND gate 130 receiving the output signal of inverter 114 and the output signals of NAND gates 129 and 128, and NAND gate 128 receiving the output signal of NOR gate 121 and the output signal of NAND gate 130.

Inverter 105, capacitors 139 and 130, inverter 106, and NOR gate 123 form a falling delay circuit which delays only the falling of column address strobe signal ZCAS. Inverters 111–113 and NAND gate 129 generate a pulse signal of one-shot in response to rising of the output signal of NAND gate 131. NAND gates 128 and 130 form a flip-flop.

Output buffer activating signal generating circuit 2030 further includes a composite logic gate 136 receiving column address strobe signal ZCAS, the output signal of NAND gate 128 and the output signal of NAND gate 127, and a composite logic gate 135 receiving column address strobe signal ZCAS, the output signal of NAND gate 128 and the output signal of NAND gate 126. NAND gate 126 receives the output signals of composite logic gates 134 and 135. NAND gate 127 receives the output signals of composite logic gates 136 and 134 as well as externally applied output enable signal ZOE applied via inverter 115.

Composite logic gate 135 is equivalent to a structure which includes an OR gate receiving column address strobe signal ZCAS and the output signal of NAND gate 128, and an NAND gate receiving the output signal of this OR gate and the output signal of NAND gate 126. Composite logic gate 136 is equivalent to a structure which includes an OR gate receiving column address strobe signal ZCAS and the output signal of NAND gate 128, and an NAND gate receiving the output signal of this OR gate and the output signal of NAND gate 127.

NAND gate 127 generates the output buffer activating signal ZOEM, and inverter 116 receiving the output signal of NAND gate 127 generates output buffer activating signal OEM. The output signal of NAND gate 126 is supplied to one input of NOR gate 122, which in turn receives operation mode designating signal FP at the other input. NOR gate 122 generates read operation designating signal READ. Operation of the circuit 2030 will now be described below.

Figure 41:
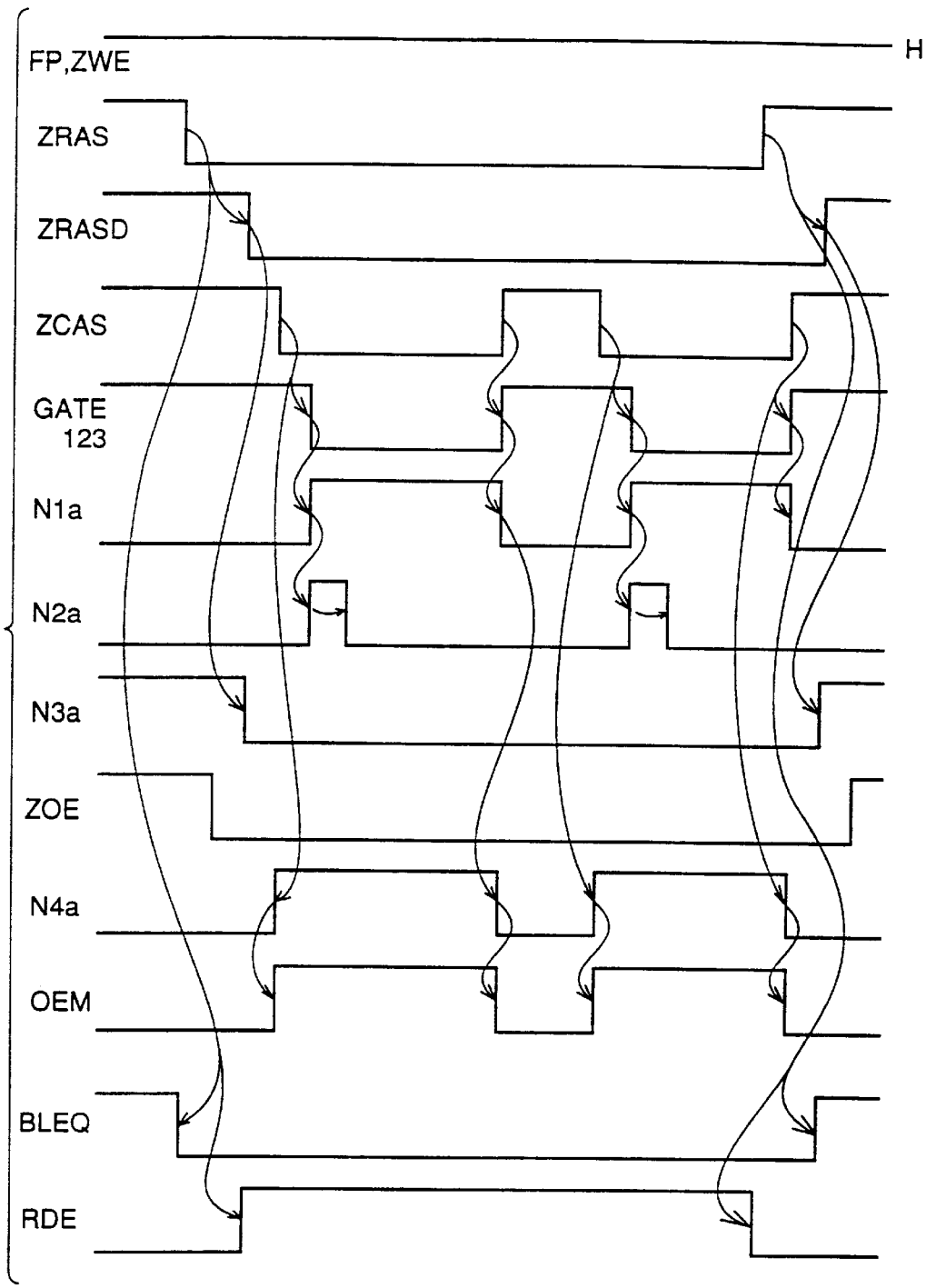
FIGS. 41 to 43 are signal waveform diagrams representing operations of a circuit portion shown in FIG. 40.

With reference to an operation waveform diagram of FIG. 41, description will now be given on the operation of reading data in such a case that operation mode designating signal FP is at the high level designating the fast page mode. In the data read operation, write enable signal ZWE is at the high level. When row address strobe signal ZRAS is at the high level, the output signal of inverter 110 is at the low level, signal BLEQ is at the high level, and signal RDE is at the low level.

When row address strobe signal ZRAS falls to the low level, bit line equalize/precharge signal BLEQ falls to the low level, and row decoder enable signal RDE rises to the high level after elapsing of a delay time determined by inverters 107–109, capacitors 141 and 142, NAND gate 132, and inverter 110. Thereby, row selection is executed in the memory cell array in accordance with the applied row address signal. Delayed row address strobe signal ZRASD falls to the low level after elapsing of the delay time determined by delay stage 2010. Since operation mode designating signal FP is at the high level, composite logic gate 134 functions as an inverter inverting column address strobe signal ZCAS.

Similarly, NAND gate 130 generates the output signal fixed at the high level, and NAND gate 128 functions as an inverter. Since the signal READ is fixed at the low level by the signal FP at the high level, NOR gate 120 functions as an inverter. In the data read operation, write enable signal ZWE is at the high level, and the output signal of NOR gate 119 is at the low level. Therefore, signal W is maintained at the low level. NOR gate 121 receiving delayed row address strobe signal ZRASD, therefore, functions as an inverter. When delayed row address strobe signal ZRASD falls to the low level, both the inputs of NAND gate 128 attain the high level, and the potential on node N3a falls from the high level to the low level. The potential on node N3 at the low level is maintained until delayed row address strobe signal ZRASD rises to the high level.

When column address strobe signal ZCAS falls to the low level, the potential on node N4a attains the high level, the output signal of composite logic gate 136 attains the high level, the output signal of NAND gate 127 attains the low level, and output buffer activating signal OEM attains the high level. When column address strobe signal ZCAS rises to the high level, the potential on node N4a attains the low level, the output signal of NAND gate 127 attains the high level, and output buffer activating signal OEM is set to the low level.

Thus, in the fast page mode, output buffer activating signal OEM is deactivated in response to deactivation of column address strobe signal ZCAS. While signal ZRAS is in the active state of the low level, row decoder enable signal RDE maintains the active state of the low level. Data of memory cells connected to the selected row (word line) are successively selected in accordance with the externally applied column addresses.

Bit line equalize/precharge signal BLEQ is returned to the high level, when a delay time determined by inverters 110, 117 and 107 elapses after deactivation of row address strobe signal ZRAS to the high level. The purpose of this delayed activation of the signal BLEQ is to ensure equalizing/precharging of the bit line after the selected word line is surely driven to nonselected state (in order to prevent destruction of data of the selected memory cells).

In the data write operation, when both signals ZWE and ZCAS attain the low level, signal W attains the high level, and the output signal of NOR gate 121 is set to the low level. Thereby, the output signal of NAND gate 128 attains the high level, and the output signal of composite logic gate 136 attains the high level. In the data write operation, output enable signal ZOE is at the high level, the output signal of inverter 115 is at the low level, and the output signal of NAND gate 127 is fixed at the low level. In the data write operation, therefore, output buffer activating signal OEM is fixed at the low level of the inactive state by output enable signal ZOE.

Figure 42:
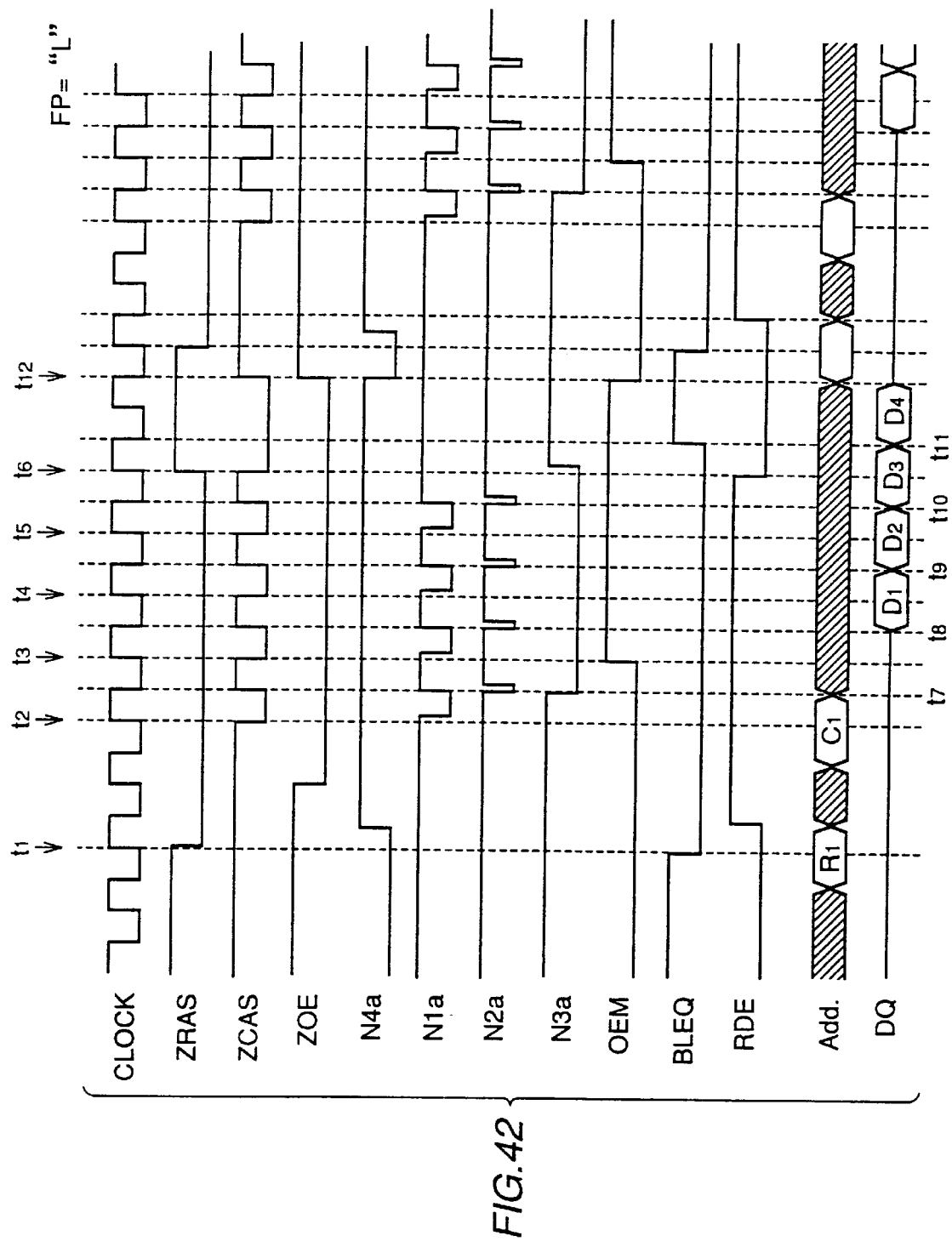

With reference to FIG. 42, description will be given on data read operation in the pipeline burst mode during which operation mode designating signal FP is set to the low level.

When row address strobe signal ZRAS is at the high level, bit line precharge/equalize signal BLEQ is at the high level, and row decoder enable signal RDE is at the low level. Output buffer activating signal OEM is also at the low level.

At time t1, row address strobe signal ZRAS falls to the low level, so that bit line equalize/precharge signal BLEQ first attains the low level, and row decoder enable signal RDE subsequently attains the high level. In the data read operation, signal W is at the low level. The output signal of inverter 102 receiving write enable signal ZWE is at the low level, and operation mode designating signal FP is at the low level. When delayed row address strobe signal ZRASD attains the low level upon elapsing of a predetermined time after the falling of row address strobe signal ZRAS to the low level, the signal applied from composite logic gate 134 onto node N4a attains the high level. The potential on node 4a maintains the high level until both signals ZRAS and ZCAS attain the high level.

At time t2, column address strobe signal ZCAS attains the low level, so that the potential on node N1a falls to the low level after elapsing of a delay time determined by inverters 105 and 106, NOR gate 123, capacitors 139 and 130 and NAND gate 131.

At time t7, column address strobe signal ZCAS rises to the high level, so that the output signal of NOR gate 123 attains the low level, and the potential on node N1a rises to the high level. Here, inverters 105 and 106, and OR gate 123 have a function of delaying the falling of column address strobe signal ZCAS and inverting the signal potential thereof. In response to the rising of the signal potential on node N1a, the signal applied from NAND gate 129 onto node N2a falls to and remains at the low level for a delay time determined by inverters 111–113. Thereby, the output signal of NAND gate 130 maintains the high level during this predetermined period (the output signal of inverter 114 is high). The output signal of NOR gate 121 is already at the high level in accordance with activation (low level) of delayed row address strobe signal ZRASD. Therefore, the signal applied from NAND gate 128 to node N3a falls to the low level (at time t7). At this time, the column address strobe signal ZCAS is at the high level, and the output signal of composite logic gate 136 does not change and maintains the low level.

At time t3, column address strobe signal ZCAS attains the low level, so that the output signal of composite logic gate 136 attains the high level. Thereby, signal ZOEM from NAND gate 127 attains the low level, and output buffer activating signal OEM from inverter 116 attains the high level. When column address strobe signal ZCAS rises to the high level at time t8, the operation in the pipeline burst mode is performed as already described. More specifically, the internal column address is defined, column selection is carried out, and data D1 is output from the memory cell specified by column address C1 which is first applied at time t2. Thereafter, column address strobe signal ZCAS is set to the low level at times t4 and t5, the potential on node N1a is set to the low level. In response to column address strobe signal ZCAS being set to the high level at times t9 and t10, the potential on node N2a is maintained at the low level for a predetermined period. During this period, composite logic gates 136 and 127 form a flip-flop, the output signal of composite logic gate 136 is fixed at the high level, and output buffer activating signal OEM maintains the high level.

At time t6, row address strobe signal ZRAS is set to the high level, and column address strobe signal ZCAS is set to the low level. The output signal of NOR gate 123 is set to the high level upon elapsing of a predetermined time after falling of column address strobe signal ZCAS. The output signal of NOR gate 121 attains the low level when delayed row address strobe signal ZRASD attains the high level. In response to the low level of the output signal of NOR gate 121, the output signal of NAND gate 128, i.e., potential on node N3a attains the high level.

Node N1a attains the high level because NAND gate 131 receives the signals at the low level on both inputs thereof. As for the composite logic gate 134, column address strobe signal ZCAS is set to the low level before delayed row address strobe signal ZRASD attains the high level, and the potential on node N4a maintains the high level. Therefore, the output signal of NAND gate 127 does not change but maintains the low level. When column address strobe signal ZCAS is set to the high level at time t12 after data D4 of the fourth bit is read at time t11, the potential on node N4a falls to the low level, so that the output signal of NAND gate 127 rises to the high level, and output buffer activating signal OEM attains the low level of the inactive state.

As described above, delayed row address strobe signal ZRASD is applied to composite logic gate 134 which generates the signal deactivating output buffer activating signal OEM. Therefore, even if column address strobe signal ZCAS is set to the low level at time t6 shown in FIG. 42, and row address strobe signal ZRAS is simultaneously set to the high level, column address strobe signal ZCAS attains the low level prior to rising of delayed row address strobe signal ZRASD. Accordingly, output buffer activating signal OEM maintains the active state, and thus data (input and) output terminal DQ is prevent from attaining the high impedance state.

In the pipeline burst mode, the read mode signal READ is obtained by inverting the output signal of NAND gate 126. When the potential on node N4a is at the low level, read instruction signal READ is at the low level. In this state, when node N3a is at the low level and column address strobe signal ZCAS attains the high level, the output signal of NAND gate 126 attains the low level, and read mode designating signal READ attains the high level. Thus, in the data read mode, when column address strobe signal ZCAS is at the high level, read mode designating signal READ is at the high level during a period in which data is actually and internally read, and signal W is fixed at the low level during the same period.

In the write operation, when both signals ZWE and ZCAS are set to the low level, signal W attains the high level (signal read is at the low level). At this time, the output signal of NOR gate 121 attains the low level, and the output signal of NAND gate 128, i.e., the potential on node N3a is fixed at the high level. The output signal of composite logic gate 134 changes in accordance with the state of column address strobe signal ZCAS. When output enable signal ZOE is at the high level, the output signal of NAND gate 127 is maintained at the low level (regardless of the state of column address strobe signal ZCAS). When output enable signal ZOE is at the low level, and write enable signal ZWE is set to the low level, the output signal of NAND gate 127 changes in accordance with column address strobe signal ZCAS. A so-called read modify write operation can be accomplished.

[Whole Operation]

Figure 43:
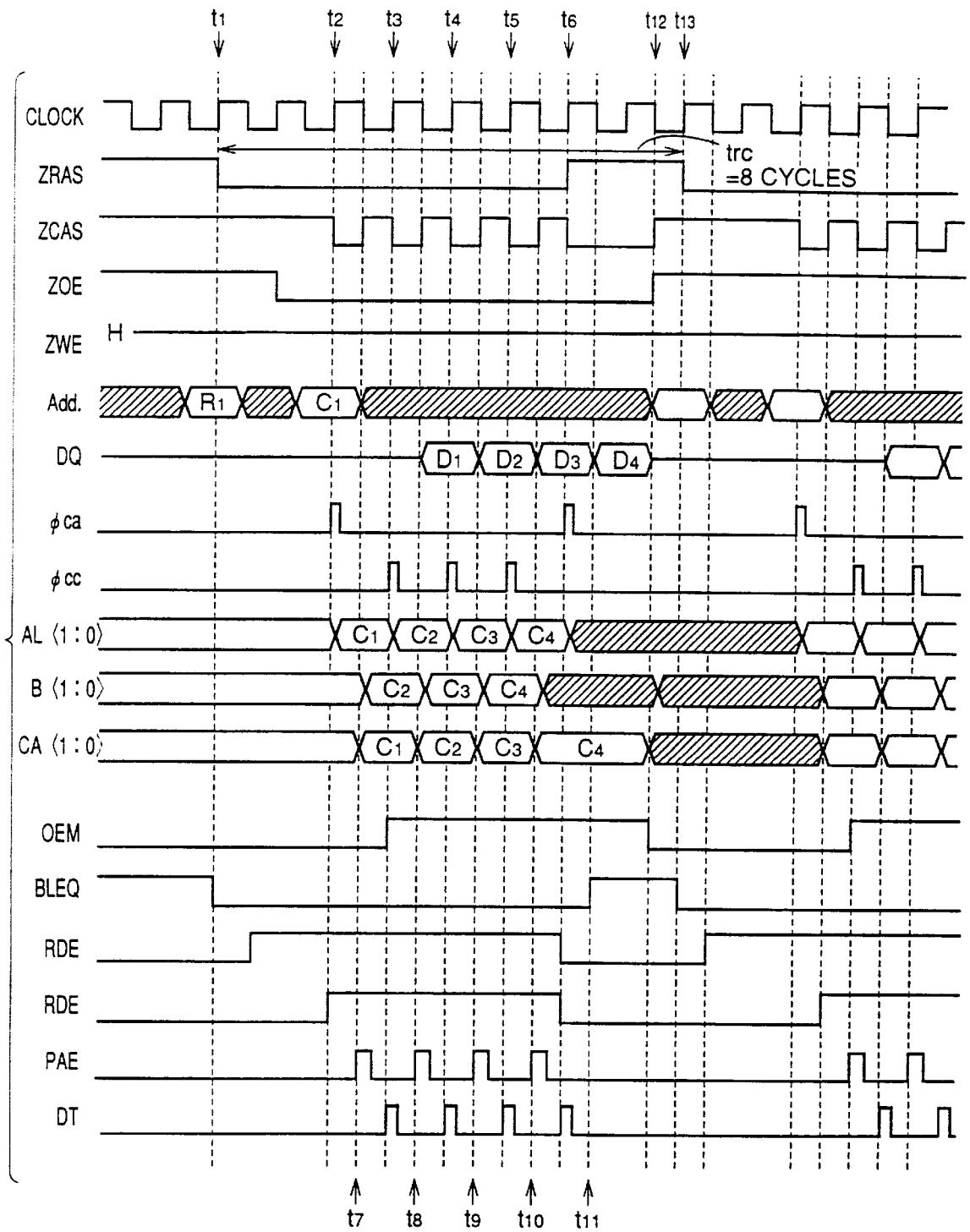

FIG. 43 is a sequence chart showing the whole operation of the semiconductor memory device in the pipeline burst mode. At time t1, row address strobe signal ZRAS is set to the active state of the low level, and the currently applied address R1 is taken in as a row address signal. Bit line equalize/precharge signal BLEQ is set to the low level, and the row decoder enable signal RDE is set to the active state of the high level.

At time t2, column address strobe signal ZCAS is set to the active state of the low level, and control signal φCA is set and maintained at the high level for a predetermined period. Currently applied address signal C1 is taken in as a column address signal, and column address C1 is latched as internal latch address AL<1:0>. At time t7, column address strobe signal ZCAS rises to the high level, so that the taken column address AL<1:0> is further latched internally and internal column address CA<1:0> is output. Also at this time, counter address B<1:0> and thus next column address C2 are produced in accordance with taken column address C1 using the internally provided counter.

At time t3, column address strobe signal ZCAS is set to the low level, so that control signal φcc attains the high level, column address C2 is transferred, and latched column address AL<1:0> is equal to counter address C2. Column selection is executed in accordance with the column address which was first taken in at time t2, and data of the selected memory cell is transferred to the I/O buffer circuit in response to preamplifier enable signal PAE which is activated at time t7. At time t3, data transfer instruction signal DT is activated, so that data of the memory cell specified by column address C1 is output, and the output data defined state is attained at time t4.

At time t4, control signal φcc is active, so that column address B<1:0> is internally generated and internal column address CA<1:0> is transferred. In accordance with internal column address C2, data of the corresponding memory cell is read and transferred to I/O buffer circuit in response to preamplifier signal PAE. In response to activation of data transfer instruction signal DT at time t4, the memory cell data specified by internal column address C2 is output from the I/O buffer circuit at time t9, and the fixed state is attained at subsequent time t5.

At time t5, column address strobe signal ZCAS is set to the low level again, so that internal production and transfer of the column address are executed. Thereby, memory cell data is selected (in I/O circuit) in accordance with internal column address C3, and data transfer instruction signal DT is activated at time t5 in the I/O buffer circuit. From time t10, data D3 of the memory cells corresponding to column address C3 are output.

At time t6, row address strobe signal ZRAS is set to the high level, and column address strobe signal ZCAS is set to the low level. As already described, the delayed signal of row address strobe signal ZRAS is used to determine whether the output high impedance state is to be set or not, and output buffer activating signal OEM maintains the high level. Therefore, data of the memory cells specified by internal column address C4 is amplified in accordance with preamplifier enable signal PAE at time t10, and subsequently the I/O buffer circuit outputs data D4 corresponding to internal column address C4 to data I/O terminal DQ in accordance with data transfer instruction signal DT.

At time t6, row decoder enable signal RDE is set to the low level in response to rising of row address strobe signal ZRAS. Bit line equalize/precharge signal BLEQ is activated after deactivation of the word line and column select line to execute equalizing/precharging of the corresponding bit line pair (time t11). Even during precharging in the memory cell array, output buffer activating signal OEM maintains the high level of the active state, and data D4 are output.

At time t12, column address strobe signal ZCAS is set to the high level, so that both of row address strobe signal ZRAS and column address strobe signal ZCAS attain the high level, and output buffer activating signal OEM is set to the inactive state of the low level. At time t13, row address strobe signal ZRAS can be set to the low level of the active state. RAS precharging period is equal to two clock cycles of clock signal CLOCK. In this case, cycle time tRC for row address strobe signal ZRAS is equal to eight clock cycles, and the access to another row in the pipeline burst mode can be advanced by one clock cycle, compared with the conventional structure.

[Connection Between Address Pins and Internal Pads]

Figure 44:
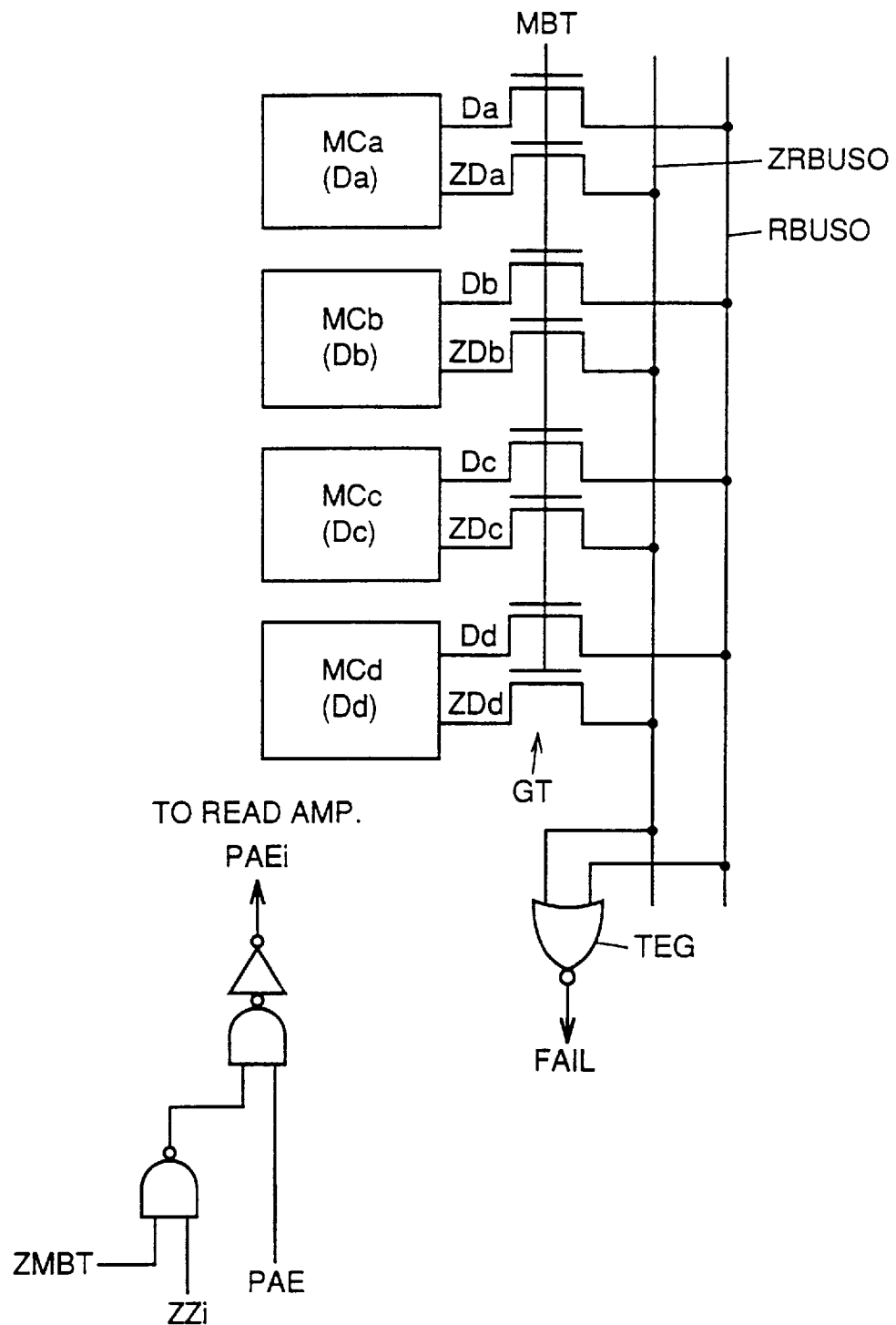
FIG. 44 schematically shows a structure for a test of a semiconductor memory device according to the invention.

FIG. 44 shows a manner of connection between the I/O circuits and the internal data read bus in the multibit test mode. In FIG. 44, data Da–Dd stored in memory cells MCa–MCd which are simultaneously selected are simultaneously transmitted onto read data bus lines RBUS0 and ZRBUS0 via gates GT when multibit test instruction signal MBT are active. This structure corresponds to the structure which is shown in FIG. 6 and is constructed to disable bit select signal ZZi0 by NOR gate 554. In the multibit test, data of the same logic are written into the memory cells. Complementary data Da and ZDa–Dd and ZDd are produced from data Da–Dd stored in memory cells MCa–MCd. In the multibit test mode, data Da–Dd are transmitted onto read data bus line RBUS0 via gate GT, and data ZDa–ZDd are transmitted onto read data bus line ZRBUS0. If memory cells MCa–MCd are normal, the all logics of all data Da–Dd are the same, and all the logics of all data ZDa–ZDd are the same. Therefore, one of read data bus lines RCUS0 and ZRBUS0 attains the high level, and the other attains the low level. Signal potentials on read data bus lines RBUS0 and ZRBUS0 are identified by a test gate TEG formed of, e.g., an NOR gate.

When one of read data bus lines RBUS0 and ZRBUS0 is at the high level, a test result indicating signal FAIL is at the low level, and it is determined that all memory cells MCa–MCd are normal. If memory cells MCa–MCd contains a defective memory cell(s), "0" and "1" exist in data Da–Dd. As is apparent from the structure shown in FIG. 6, the I/O circuit is NAND-connected to read data bus lines ZRBUS0 and RBUS0 in the multibit test mode (all p-channel MOS transistors 549 and 550 for charging the read data bus lines are off). Therefore, if memory cells MCa–MCd contains at least one defective memory cell, the potentials of both read data bus lines RBUS0 and ZRBUS0 attain the low level, and test result instruction signal FAIL from test gate TEG attains the high level, which represents existence of the defective memory cell. During the test, signals PAEi are simultaneously activated as shown in FIG. 44. The arrangement of generating the signal PAEi is implemented by replacing the inverters 612 of FIG. 8 with an NAND circuit receiving the signals MBT and ZZi.

As already described in connection with the embodiments, the semiconductor memory device of 16 Mbits specifies a memory cell among the simultaneously selected memory cells with least significant column address bits CA<1:0>. In the test mode, all column address bits CA<1:0> and ZCA<1:0> (referred to as "degenerated address") are set into a selected state. Accordingly, it is possible to accomplish the semiconductor memory device which is operable in either of the fast page mode and the pipeline burst mode on the same semiconductor chip.

Figure 45:
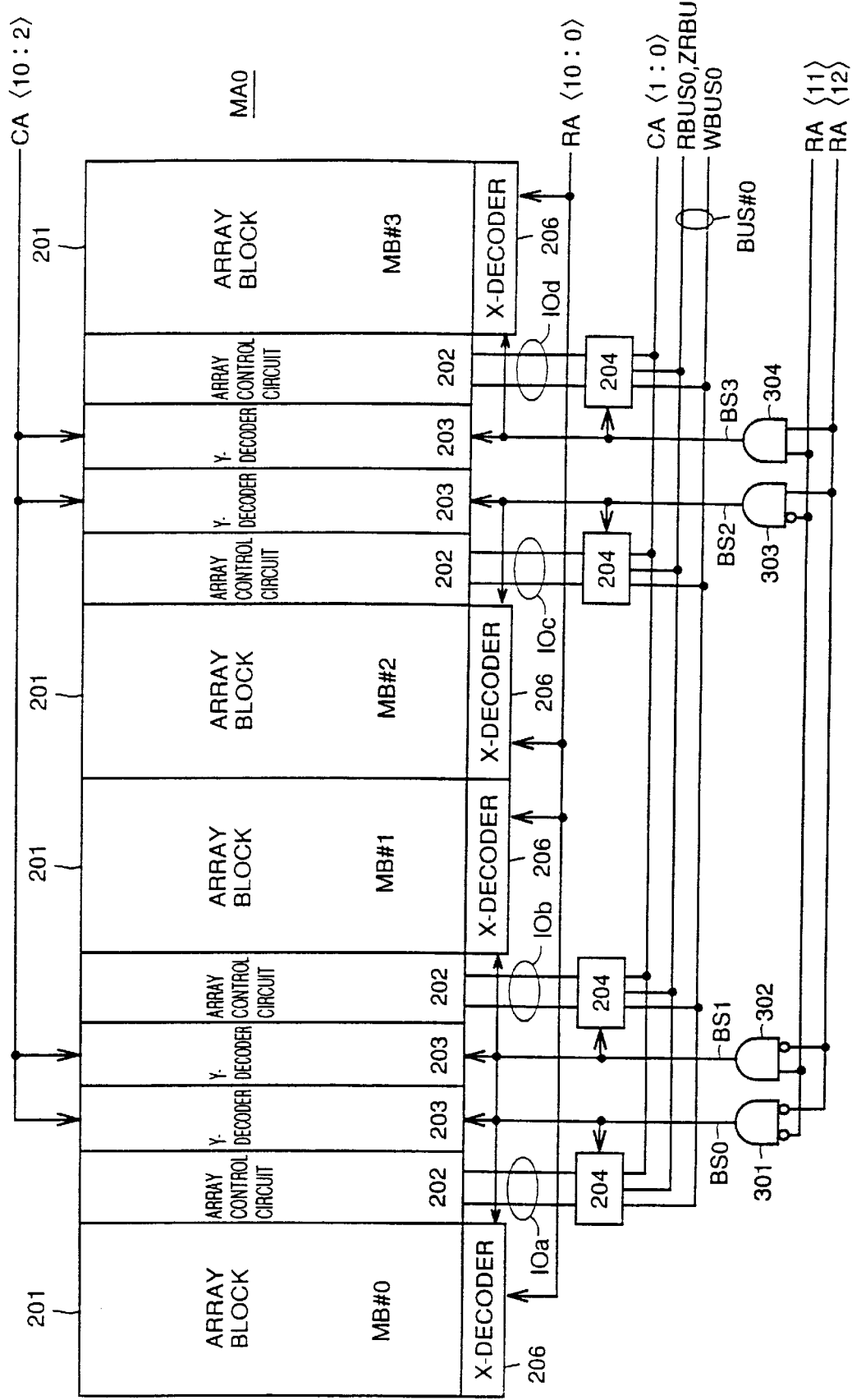
FIG. 45 schematically shows another structure of a semiconductor memory device according to the invention.

FIG. 45 shows a structure of one memory array in a 64-Mbit DRAM. Memory array MA0 has substantially the same structure as that shown in FIG. 2 except for the following point. Memory array MA0 has a storage capacity of 16 Mbits. Each of four array blocks MB#0–MB#4 included in memory array MA0 has a storage capacity of 4 Mbits. Each of array blocks MB#0–MB#3 includes memory cells arranged in 2048 rows (2K rows) and 2048 columns (2K columns). In this case, the address counter (i.e., counter for 4-bit successive selection) used in the semiconductor memory device of 16 Mbits is used, as is, in the semiconductor memory device performing the pipeline burst mode operation, so that addresses are allocated as described below. Y-decoder 203 is supplied with column address bits CA<10:2>. X-decoder 206 is supplied with row address bits RA<10:0>. Row address bits RA<12:11> are used for generating block select signals BS0–BS3 for selecting one array block from array blocks MB#0–MB#3.

I/O circuit 204 uses 2-bit column address CA<1:0>. Here, a x4-bit structure is intended here. As already described with reference to FIG. 62, the 64-Mbit DRAM uses the degenerated address formed of column address bits different from column address bits CA<1:0>. In the fast page mode operation, it is possible to utilize a structure which uses the standardized degenerated address for simultaneously selecting a required number of memory cells. The fast page mode operation can be achieved without any problem, even if a plurality of memory cells are simultaneously selected in accordance with the standardized degenerated address (all memory cells are specified with external column addresses). However, if bits CA<1:0> are used as the counter address in the pipeline burst mode, it is impossible to form the semiconductor memory device with the pipeline burst mode and the fast page mode on the same semiconductor chip (because address pins are different, and pin compatibility is lost).

Figure 46:
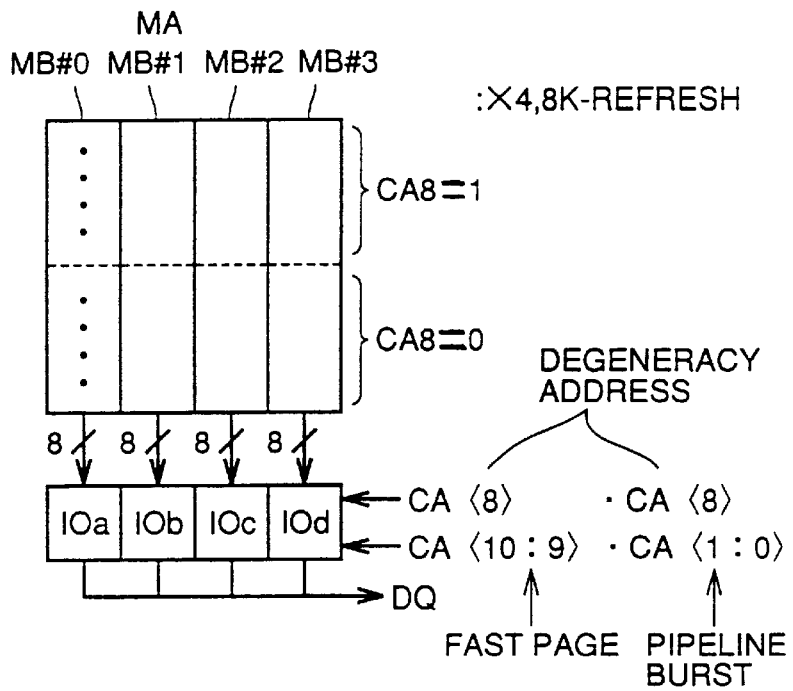
FIG. 46 shows a degenerated address in a test operation.

In a semiconductor memory device of x4-bit and 8K-refresh type, the degenerated address applied to I/O circuits IOa–IOd is CA<10:8> in the fast page mode as shown in FIG. 46. Memory cells of 8 bits are simultaneously selected and are compressed into data of 1 bit for determining acceptance/rejection of the memory cells. Meanwhile, when semiconductor memory device of x8-bit and 8K-refresh type is to be operated in the pipeline burst mode, the degenerated addresses must be CA<8> and CA<1:0>. The counter address outputs internal column address bits CA<1:0>. Among the memory cells of 8 bits which are simultaneously selected in one memory block MB#0 in memory array MA, the memory cells of 4 bits are specified by address bit CA<8> and the selected memory cells of 4 bits are sequentially selected bit by bit in accordance with counter address CA<1:0>.

Figure 47:
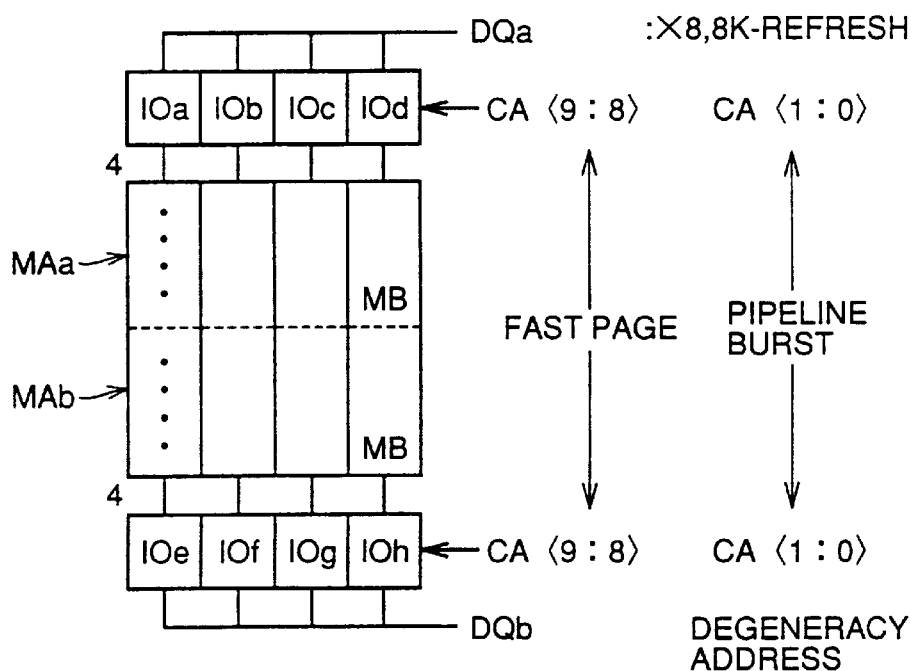
FIG. 47 shows a degenerated address in a test operation.

As shown in FIG. 47, in x8-bit- and 8K-refresh, one memory block MB is selected in each of memory arrays MAa and MAb, and, in the selected memory block, memory cell data of 4 bits are compressed into data of 1 bit in the multibit test mode. In this case, the address applied to I/O circuits IOa–IOh in the fast page mode is CA<9:8>, and these column address bits CA<9:8> form the degenerated address. In the pipeline burst mode, the counter address is CA<1:0>, and the column address bits CA<1:0> form the degenerated address.

In the case of 16-Mbit DRAM of the semiconductor memory device, an external central processing unit (CPU) can be accessed with column address bits CA<1:0> in the burst mode. Also in the 64-Mbit DRAM, it is necessary to allow access with column address bits CA<1:0> in the burst mode (for maintaining compatibility of the semiconductor memory device). The following problem would arise if the standardized degenerated address were used as the counter address in order to accomplish both the pipeline burst mode and the fast page mode on the same semiconductor chip.

For example, In the case where a counter address of a semiconductor memory device is A<10:9>, and a counter address of another semiconductor memory device is A<1:0>, if data at the addresses of the same column address bits A<8:0> but different column address bits A<10:9> are to be accessed, one of the semiconductor memory devices allows access in the burst mode and thus allows fast access, but the other semiconductor memory device cannot make the access in the burst mode. Now, an arrangement will be described below with which both the fast page mode and the pipeline burst mode are accomplished on the same semiconductor chip and CA<1:0> can be used as the counter address in either mode.

Figure 48A:
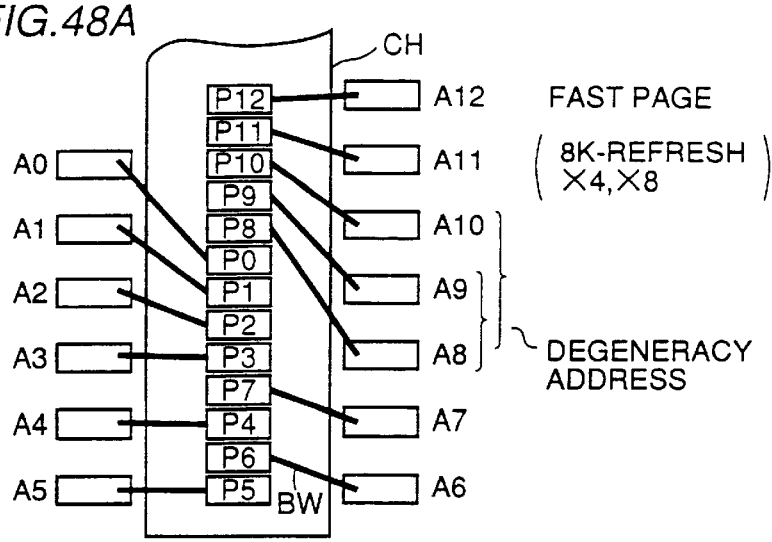
FIGS. 48A–48C show connection between address input pin terminals and address input pads in the semiconductor memory device according to the invention.
Figure 48B:
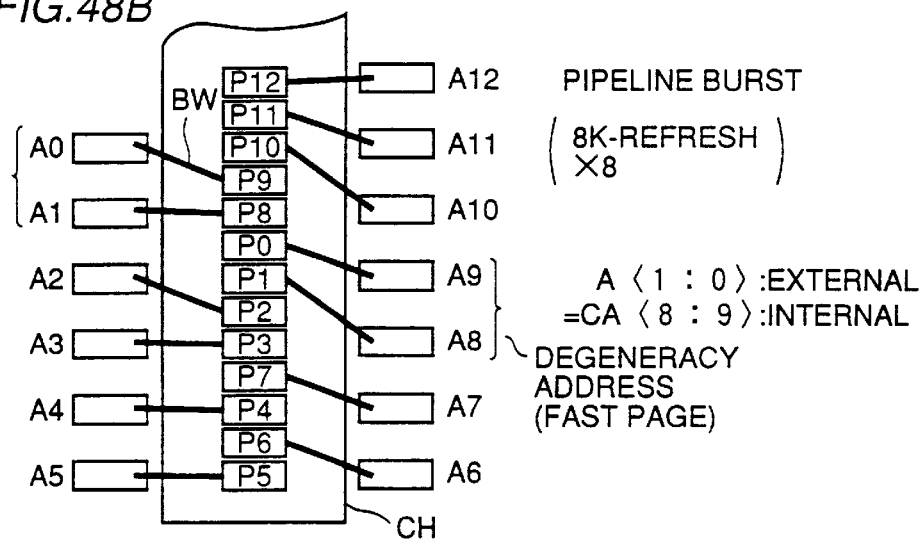
Figure 48C:
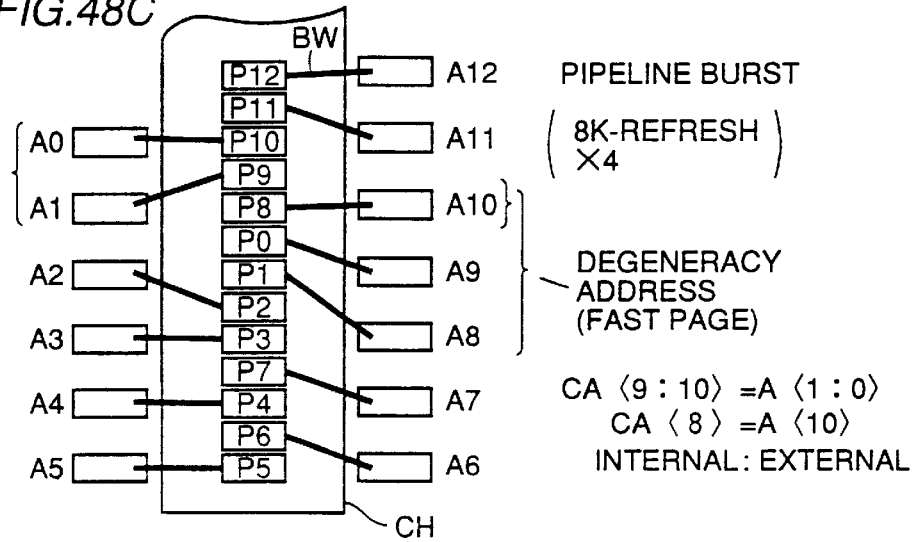
Figure 50:
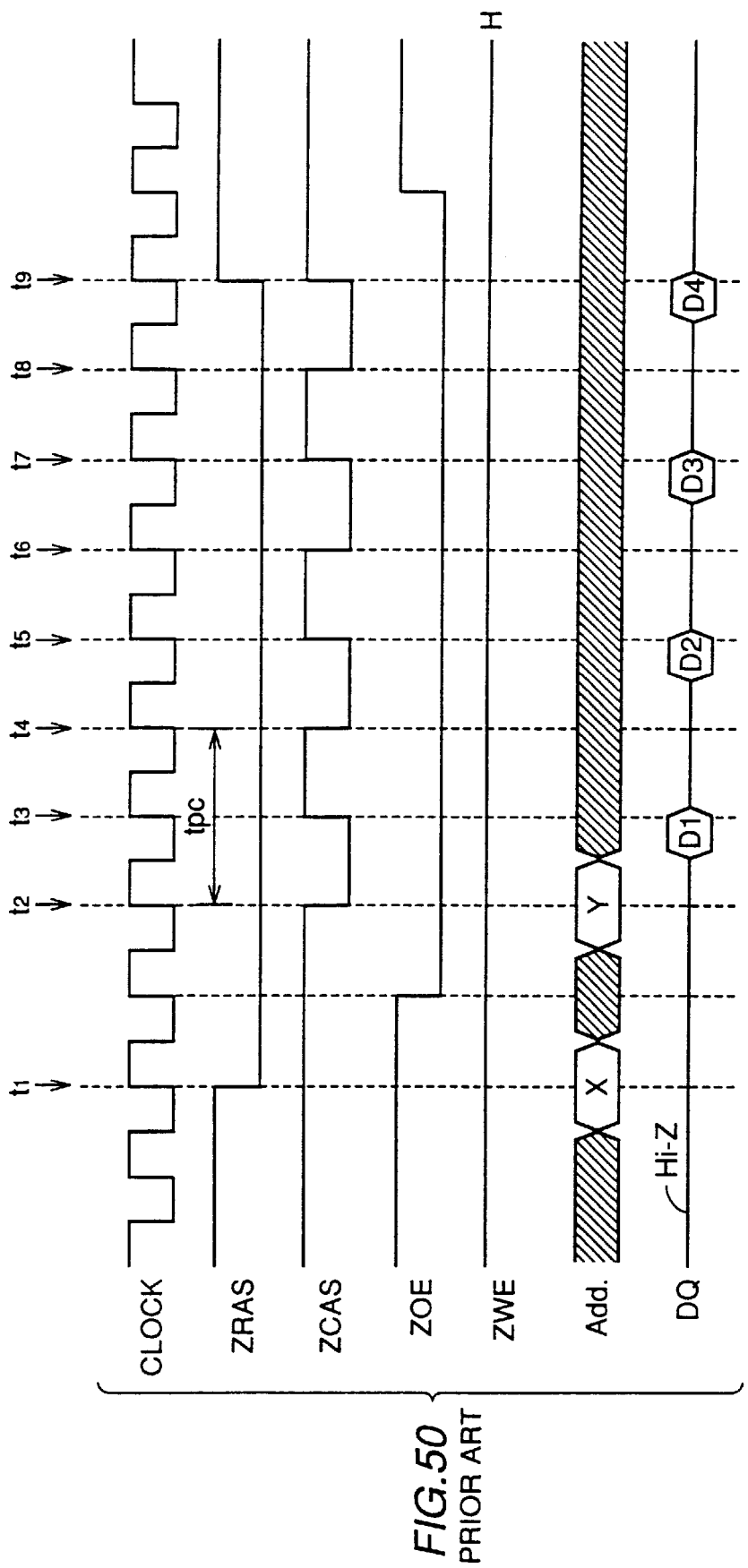
FIG. 50 is a timing chart representing a nibble mode operation of a conventional semiconductor memory device.
Figure 51:
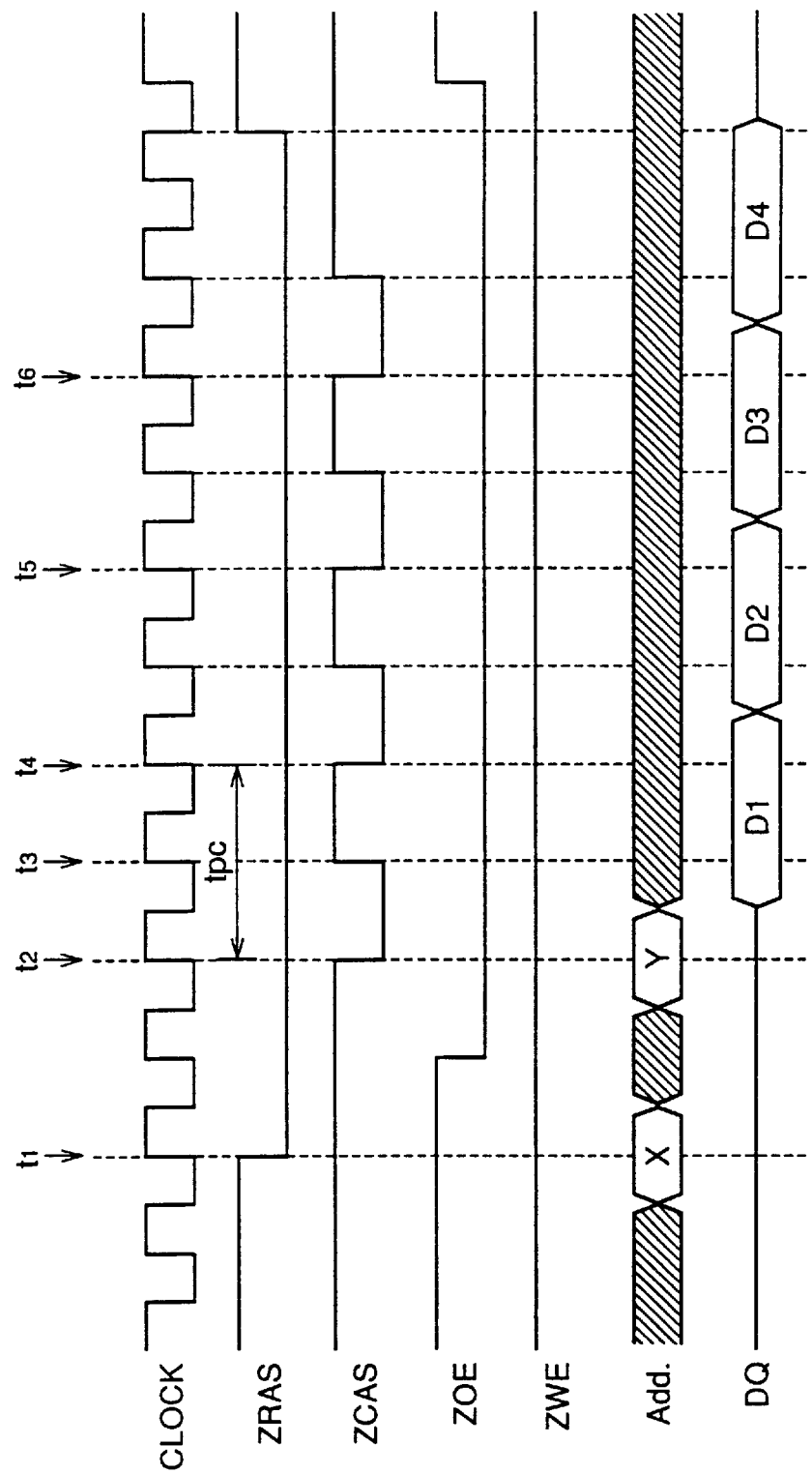
FIG. 51 is a timing chart representing an expanded nibble mode operation of the conventional semiconductor memory device.
Figure 52:
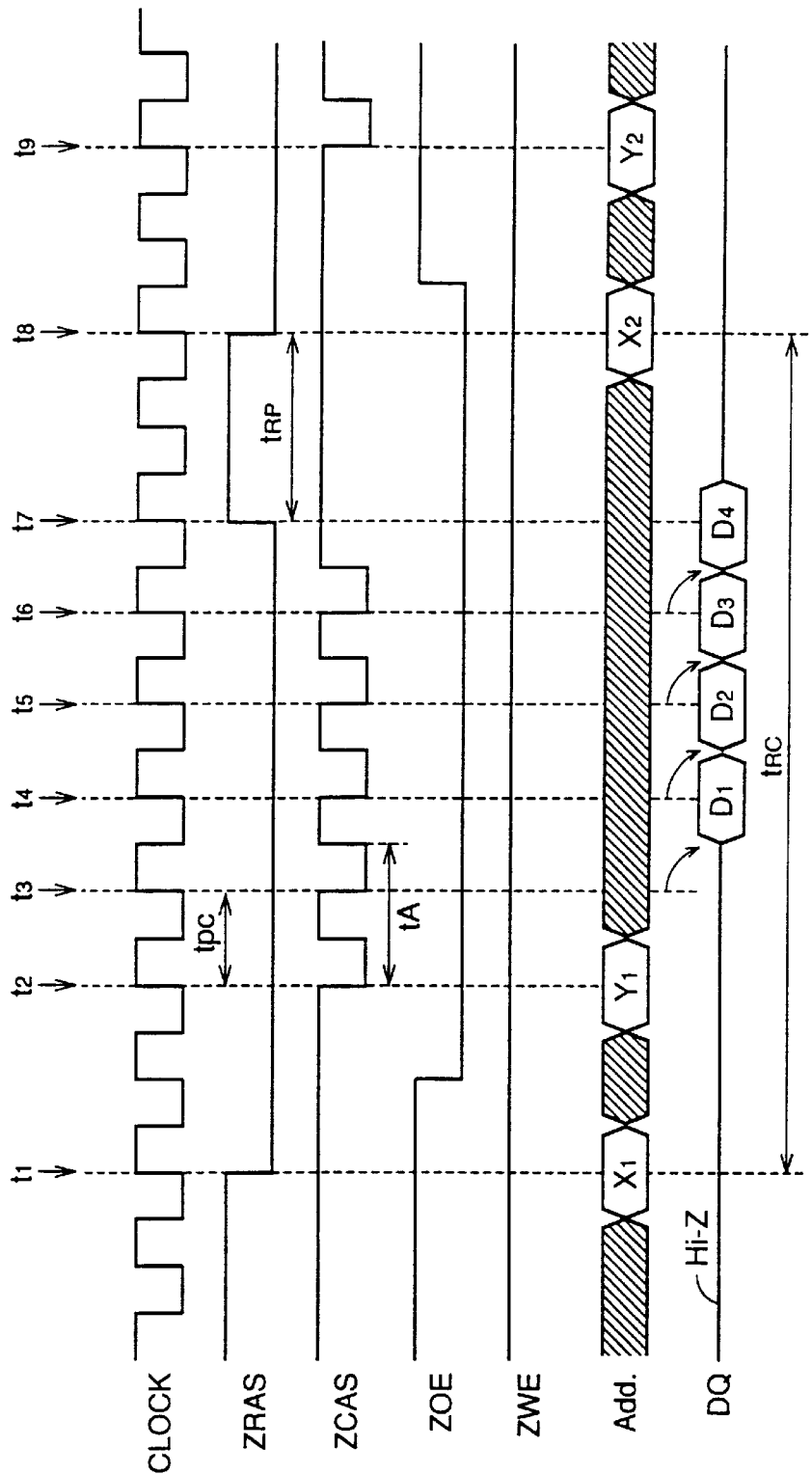
FIG. 52 is a timing chart representing a pipeline burst mode operation of the conventional semiconductor memory device.
Figure 53:
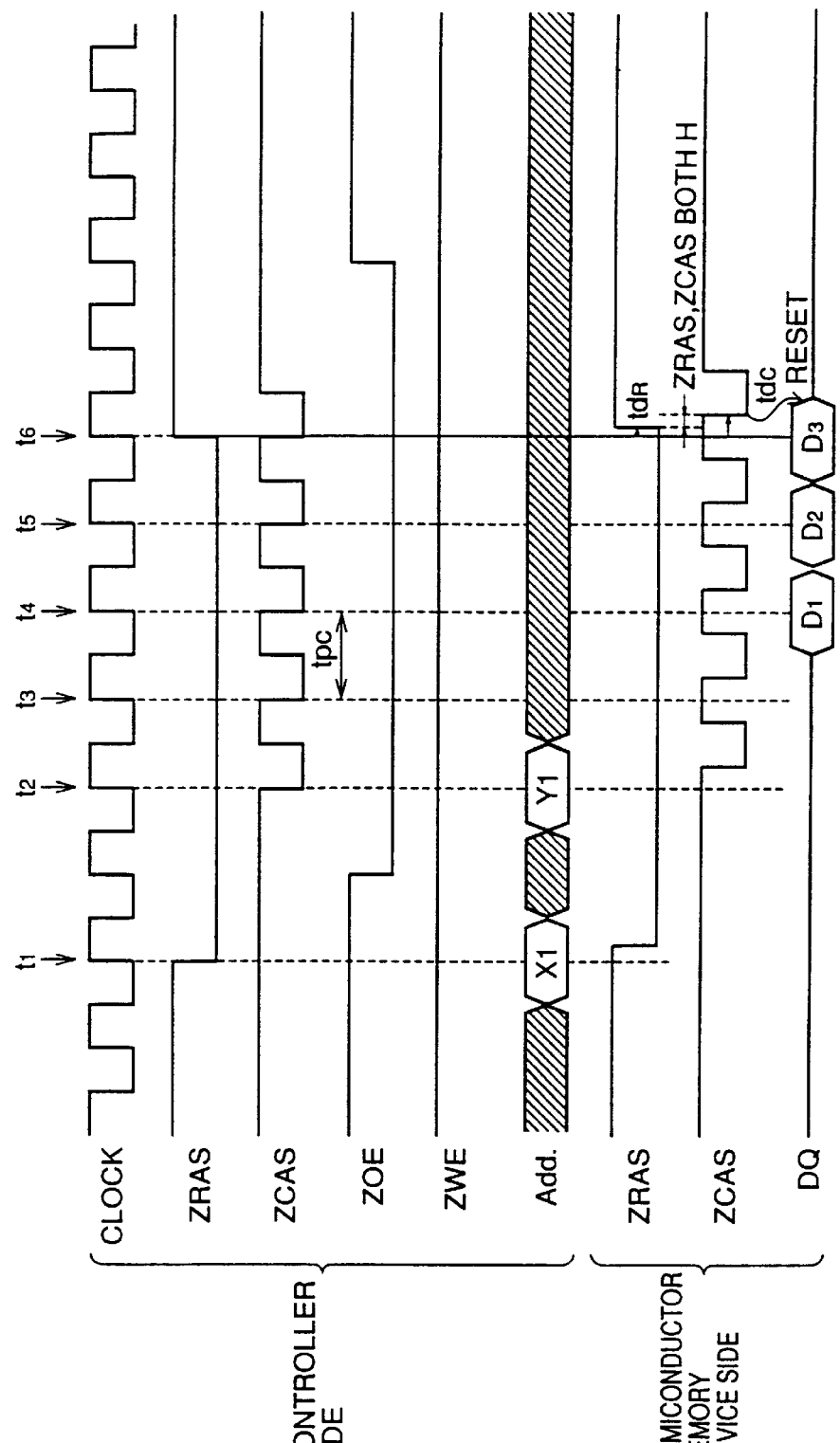
FIG. 53 specifically shows an overall arrangement of the conventional semiconductor memory device.
Figure 56:
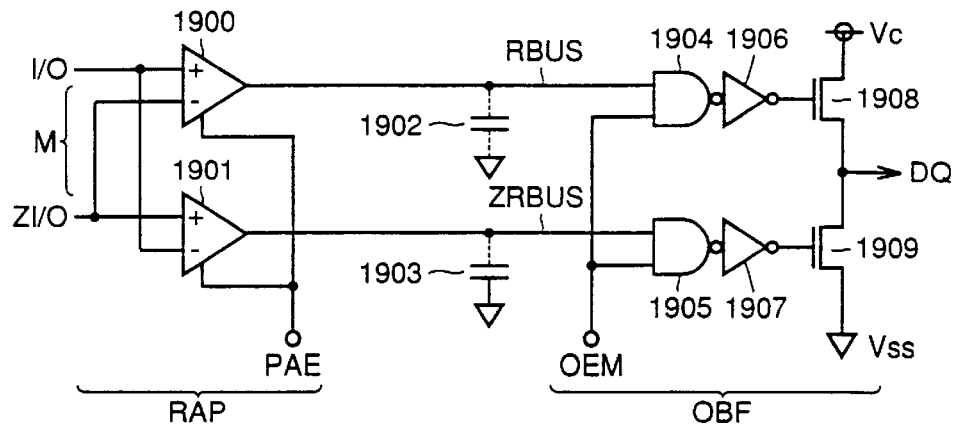
FIG. 56 shows a structure of an output buffer portion in the conventional semiconductor memory device.
Figure 57:
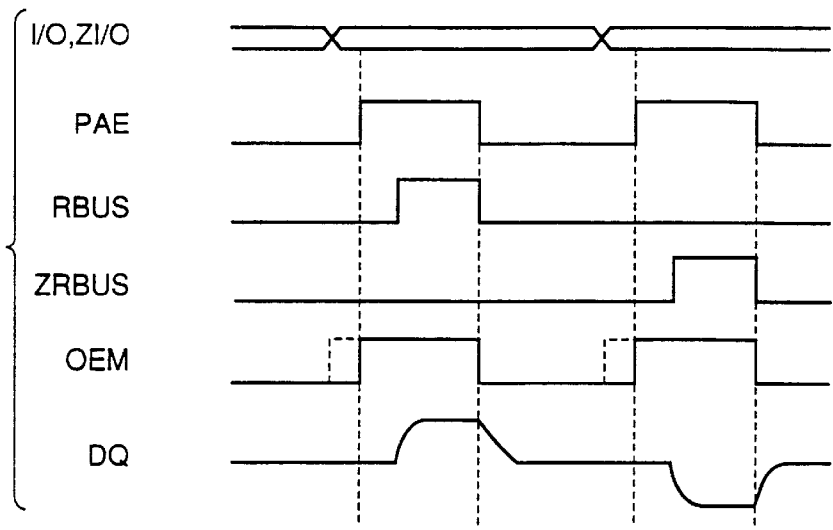
FIG. 57 is a signal waveform diagram representing an operation of the output buffer portion shown in FIG. 56.
Figure 58:
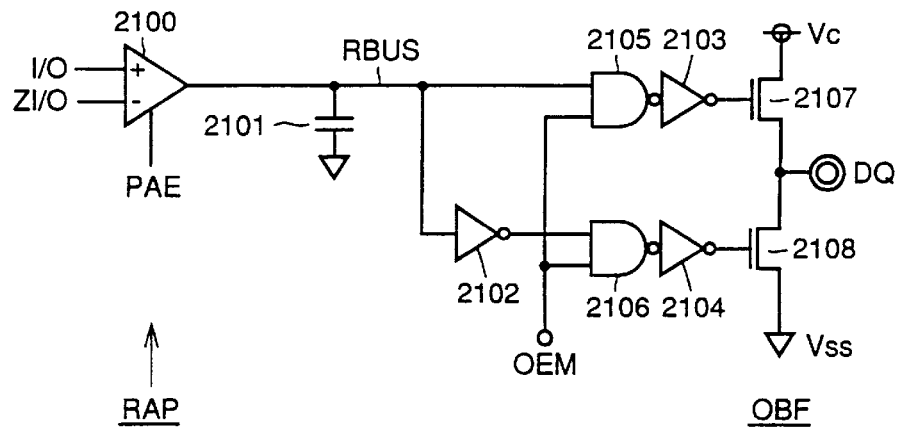
FIG. 58 shows another structure of the data output buffer portion in the conventional semiconductor memory device.

FIGS. 48A, 48B and 48C show manners of connection between address input pin terminals of the 64-Mbit DRAM (semiconductor memory device) of 8K-refresh and address input pads of the semiconductor memory device.

In FIG. 48A, there is shown connections between the address input terminals and address input terminals in the semiconductor memory device, which has a structure of 8K-refresh as well as x4-bit or x8-bit IO configuration and operates in the fast page mode. At a central region of a semiconductor chip CH, there are arranged address input pads P0–P12 on a line. For arranging the address input pads in a line at the central region of semiconductor chip CH, a lead frame of a "LOC structure" in which a lead frame extends to a central portion of the semiconductor chip is used. However, FIG. 48A shows only the address input pins and the address input pads, and other structures are not shown. In FIG. 48A, address input pin terminals A0–A5 are arranged at one side of semiconductor chip CH, and address input pin terminals A6–A12 are arranged at the other side of semiconductor chip CH. The address input pads arranged at the center of semiconductor chip CH are aligned in the order of P12–P8, P0–P3, P7, P4, P6 and P5. These orders of arrangement of the address input pin terminals and address input pads are shown merely as an example, and may be varied appropriately.

Address input pin terminals A0–A5 are connected to address input pads P0–P5 by bonding wires, respectively. Similarly, address input pin terminals A6–A12 are connected to address input pads P6–P12, respectively. Address signals are transmitted from address input pads P0–P12 to address input buffers in the semiconductor memory device. The degenerated address is CA<10:8> in the case of x4-bit structure, and is CA<9:8> in the case of x8-bit structure.

Referring to FIG. 48B, in the case where a semiconductor memory device of x8-bit having a 8K-refresh cycle is to be operated in the pipeline burst mode, connection is made as follows in the semiconductor memory device having address input pins and address input pads arranged as shown in FIG. 48A. Address input pin terminals A0 and A1 are connected to address input pads P9 and P8 via bonding wires BW, respectively. Address input pin terminals A2–A5 are connected to address input pads P2–P5, respectively. Address input pin terminals A6 and A7 are connected to address input pads P6 and P7, respectively. Address input pin terminals A8 and A9 are connected to address input pads P1 and P0, respectively. Address input pin terminals A10–A12 are connected to address input pads P10–P12, respectively.

In this case, the degenerated address is column address bits CA9 and CA8. The counter address in the pipeline burst mode is generated in accordance with the address applied to address input pads P8 and P9. Therefore, the degenerated address can be used as the counter address. Owing to use of address A<1:0>, compatibility can be maintained with the counter address of a 16Mbit-DRAM (external column address bits are the same).

Referring to FIG. 48C, in the case where a semiconductor memory device of a x4-bit structure having a 8K-refresh cycle is to be operated in the pipeline burst mode, connection is made as follows. Address input pin terminals A0 and A1 are connected to address input pads P10 and P9 via bonding wires BW, respectively. Address input pin terminals A2–A5 are connected to address input pads P2–P5 via bonding wires BW, respectively. Address input pin terminals A6 and A7 are connected to address input pads P6 and P7, respectively. Address input pin terminals A8 and A9 are connected to address input pads P1 and P0, respectively. Address input pin terminal A10 is connected to address input pad P8. Address input pin terminals A11 and A12 are connected to address input pads P11 and P12, respectively. By applying external column address bits A<1:0> to address input pads P9 and P10, counter address A<1:0> can be utilized as the degenerated address.

FIG. 49A shows connections between address input pin terminals and address input pads in a semiconductor memory device of x8-bit and x4-bit structures which has a 4K-refresh cycle and can operate in the fast page mode. In the semiconductor memory device having the 4K-refresh cycle, address input pin terminal A12 is not utilized (no connection NC). In the fast page mode, address input pin terminals A0–A5 and A6–A10 are connected to address input pads P0–P11, respectively. In the structure where address input pin terminal A12 is not used, the row address bits decrease in number by one bit, and the column address bits increase in number by one bit, so that the connection is made as described above. The degenerated address for x4-bit structure is CA<10:9>, and that for x8-bit structure is CA<11:9>.

FIG. 49B shows connections between address input pin terminals and address input pads in a DRAM which has a x8-bit structure and a 4K-refresh cycle and can operate in the pipeline burst mode. Referring to FIG. 49B, address input pin terminals A0 and A1 are connected to address input pads P10 and P9, respectively. Address input pin terminals A2–A5 are connected to address input pads P2–P5, respectively. Address input pin terminals A6 and A7 are connected to address input pads P6 and P7, respectively. Address input pin terminals A8 and A9 are connected to address input pads P1 and P0, respectively. Address input pin terminal A10 is connected to address input pad P8, and address input pin terminal A11 is connected to address input pad P11. In this case, the internal degenerated address is CA10 and CA9, and this degenerated address can be utilized as the counter address A<1:0>.

FIG. 49C shows connections between the address input pin terminals and address input pads in a 64-Mbit DRAM of a x4-bit structure which has a 8K-refresh cycle and operates in the pipeline burst mode. Address input pin terminals A0 and A1 are connected to address input pads P11 and P10, respectively. Address input pin terminals A2–A5 are connected to address input pads P2–P5, respectively. Address input pin terminals A6 and A7 are connected to address input pads P6 and P7, respectively. Address input pin terminal A8 is connected to address input pad P1, and address input pin terminal A9 is connected to address input pad P0. Address input pin terminal A10 is connected to address input pad P8, and address input pin terminal A11 is connected to address input pad P9.

The degenerated address in the semiconductor memory device of the x4-bit structure and 4K-refresh cycle is CA11, CA10 and CA9. Degenerated address CA<11:10> corresponds to address bits A0 and A1, and degenerated address CA<9> corresponds to address bit A11. Therefore, by selecting the connections between the address input pin terminals and address input pads in accordance with the operation mode, the degenerated address can contain counter address A<1:0>. It may be necessary to change the manner of connections between the address input pads and the counter depending on I/O configuration and refresh cycle number.

By connecting the counter address input pin terminals to the address pads internally generating the degenerated address, the DRAM which can selectively support the fast page mode and the pipeline burst mode can be formed on the same semiconductor chip.

In the above embodiment, the fast page mode has been referred as an operation mode in which the output high impedance state is set when column address strobe signal ZCAS is inactive, and the pipeline burst mode has been referred to as an operation mode in which the high impedance state is set only when both of column address strobe signal ZCAS and row address strobe signal ZRAS are inactive. However, the invention can be applied to operation modes other than the above.

As described above, the present invention can provide the semiconductor memory device, which can operate fast with a low current consumption, has pin compatibility with those of former generations, and can achieve either of the fast page mode and the pipeline burst mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device incorporating an external address signal to access a memory cell in accordance with the external address signal in a first cycle and subsequently accessing another memory cell in accordance with a count produced from a counter performing a counting operation with said external address signal being as a start address, comprising:

latch circuit for latching a received address to generate an internal address;

a first selector responsive to a column selection designation signal applied in the first cycle for incorporating said external address signal for transmission to said latch circuit; and a second selector responsive to the column selection designation signal applied in a subsequent cycle subsequent to said first cycle for selecting the count generated from said counter for transmission to said latch circuit, said counter performing the count operation in response to said column selection designation signal.

2. The semiconductor memory device according to claim 1, further comprising control means responsive to said column selection designation signal for selectively activating the first and second selectors.

3. The semiconductor memory device according to claim 1, wherein said column selection designation signal is externally applied to the semiconductor memory device.

4. The semiconductor memory device according to claim 1, further comprising:

a timing signal generator responsive to the column selection designation signal for generating alternatively a first timing signal and a second timing signal, said first timing signal activating the first selector and said second timing signal activating the second selector; and gate means coupled to receive the output signals of the first and second selectors, for passing a received signal to the latch circuit in response to the column selection designation signal in a first operation mode and for passing the received signal when received to the latch circuit in a second operation mode.

5. The semiconductor memory device according to claim 4, wherein said timing signal generator includes:

a counter circuit for performing a counting operation in response to the column selection designation signal;

a first logic gate enabled in response to an initial count from said counter circuit for generating the first timing signal in response to activation of the column selection designation signal in the first operation mode; and a second logic gate enabled in response to a count other than said initial count from said counter circuit for generating the second timing signal in response to the activation of the column selection designation signal in the first operation mode.

6. The semiconductor memory device according to claim 1, further comprising:

a memory array including a plurality of memory cells arranged in rows and columns;

selection means for selecting simultaneously a predetermined plurality of memory cells in response to the internal address signal;

a plurality of read amplifier means provided corresponding to the predetermined number of memory cells for amplifying and transmitting data of the corresponding memory cells for external outputting through an output buffer;

a count circuit for counting the column selection designation signal to generate alternatively a first timing signal and a second timing signal, said first timing signal activating said first selector, and said second timing signal activating said second selector; and precharge circuit coupled to receive the count of said count circuit and the column selection designation signal and an address transition detecting signal for precharging inputs of said plurality of read amplifier means in response to an initial count of said count circuit and activation of the column selection designation signal in a first operation mode and for precharging the inputs of said plurality of read amplifier means in response to the address transition detecting signal in a second operation mode.

7. The semiconductor memory device according to claim 1, further comprising:

timing signal generator for generating alternatively a first timing signal and a second timing signal in response to a count of the column selection designation signal, said first timing signal activating the first selector, and said second timing signal activating the second selector;

said timing signal generator including means for controlling an output of said timing signal generator such that said second timing signal is inhibited from being generated when the first timing signal is generated in response to the column selection designation signal in a second operation mode through invalidation of the count of the column selection designation signal.

8. A semiconductor memory device having a plurality of memory cells arranged in rows and columns, comprising:

a latch circuit for latching a received signal to generate an internal address signal;

a first selector responsive to a first signal activated in a first column access cycle accessing a column among the columns, for incorporating an externally applied external address signal for transmission to said latch circuit;

a counter for performing a counting operation with the external address signal as a start address to generate a count; and a second selector responsive to a second signal activated in a subsequent column access cycle subsequent to said first column access cycle, for selecting the count generated from said counter for transmission to said latch circuit, said counter performing the counting operation to modify the external address signal for application to said second selector as said count in the subsequent column access cycle.

9. The semiconductor memory device according to claim 8, further comprising control circuitry responsive to a column access designation signal designating the column access cycle for selectively activating the first and second signals.

10. The semiconductor memory device according to claim 9, wherein the column access designation signal is externally applied to said semiconductor memory device in the first and subsequent column access cycles.

11. The semiconductor memory device according to claim 9, further comprising gate means coupled to receive output signals of the first and second selectors, for passing a received signal to said latch circuit in response to the column access designation signal in a first operation mode and for passing the received signal when received, to the latch circuit in a second operation mode.

12. The semiconductor memory device according to claim 9, wherein said control circuitry includes;

a counter circuit for performing a counting operation in response to the column access designation signal, a first logic gate enabled in response to an initial count from said counter circuit for activating the first signal in response to activation of the column access designation signal, and a second logic gate in response to a count other than said initial count from said counter circuit for activating said second signal in response to the column access designation signal.

13. The semiconductor memory device according to claim 8, further comprising;

selection circuitry for selecting simultaneously a predetermined number of memory cells in response to the internal address signal;

a plurality of read amplifier means provided corresponding to the predetermined number of memory cells for amplifying and transmitting data of the corresponding memory cells for external outputting through an output buffer;

a count circuit for counting the number of column access cycles to activate alternatively the first signal and the second signal, and a precharge circuit coupled to receive the count of said count circuit and a column access designation signal and an address transition detecting signal for precharging inputs of said plurality of read amplifier means in response to an initial count of said count circuit and activation of the column access designation signal in a first operation mode and for precharging the inputs of said plurality of read amplifier means in response to the address transition detecting signal in a second operation mode.

14. The semiconductor memory device according to claim 8, further comprising;

timing signal generator for generating and activating alternatively the first signal and the second signal in response to a count of the column access cycles, said timing signal generator including means for controlling an output of the timing signal generator such that said second signal is inhibited from being activated when the first signal is activated in response to a column access designation signal designating an access to a column of the columns in a second operation mode through invalidation of said count, while the first and second signals are activated in accordance with the count in a first operation mode.

* * * * *